United States Patent
Ohmuro et al.

(10) Patent No.: US 10,281,769 B2
(45) Date of Patent: May 7, 2019

(54) OPTICAL SHEET MEMBER AND IMAGE DISPLAY DEVICE USING SAME

(71) Applicant: FUJIFILM Corporation, Tokyo (JP)

(72) Inventors: Katsufumi Ohmuro, Kanagawa (JP); Yukito Saitoh, Kanagawa (JP); Akiko Watano, Kanagawa (JP)

(73) Assignee: FUJIFILM Corporation, Tokyo (JP)

( * ) Notice: Subject to any disclaimer, the term of this patent is extended or adjusted under 35 U.S.C. 154(b) by 516 days.

(21) Appl. No.: 14/959,466

(22) Filed: Dec. 4, 2015

(65) Prior Publication Data

US 2016/0085102 A1  Mar. 24, 2016

Related U.S. Application Data

(63) Continuation of application No. PCT/JP2014/065121, filed on Jun. 6, 2014.

(30) Foreign Application Priority Data

Jun. 6, 2013 (JP) .................... 2013-119670

(51) Int. Cl.
G02F 1/1335 (2006.01)
G02F 1/13363 (2006.01)
(Continued)

(52) U.S. Cl.
CPC ......... G02F 1/13363 (2013.01); G02B 5/305 (2013.01); G02B 5/3083 (2013.01);
(Continued)

(58) Field of Classification Search
CPC ........... G02F 1/13363; G02F 1/133617; G02F 1/133528; G02F 2001/133614;
(Continued)

(56) References Cited

U.S. PATENT DOCUMENTS 9,110,203 B2  8/2015  Seo et al.
2006/0109399 A1* 5/2006 Kubota ............... G02B 5/3041
349/96
(Continued)

FOREIGN PATENT DOCUMENTS

CN  101840101 A  9/2010
CN  103017027 A  4/2013
(Continued)

OTHER PUBLICATIONS

International Preliminary Report on Patentability issued by WIPO dated Dec. 8, 2015 in connection with International Patent Application No. PCT/JP2014/065121.
(Continued)

*Primary Examiner* — Nathanael R Briggs
(74) *Attorney, Agent, or Firm* — Edwards Neils, LLC; Jean C. Edwards, Esq.

(57) ABSTRACT

An optical sheet member includes a polarizing plate including a polarizer (A); an optical conversion member (D); and a brightness enhancement film including a reflection polarizer (B), in which the brightness enhancement film has a reflection center wavelength range of 400 nm to 500 nm, and the optical conversion member (D) converts a part of blue light which is transmitted through polarizer (B) and is incident on the optical conversion member (D), and has an emission center wavelength range of 400 nm to 500 nm and which has an emission center wavelength range of 500 nm to 600 nm and red light which has an emission center wavelength range of 600 nm to 700 nm, and transmits a part of the blue light. When the optical sheet member is incorporated in an image display device, front brightness, contrast, and a color reproducing region are enhanced, and color unevenness is reduced.

34 Claims, 12 Drawing Sheets

(51) Int. Cl.
*G02B 5/30* (2006.01)
*H01L 27/12* (2006.01)
*H01L 29/786* (2006.01)
*G02B 5/22* (2006.01)

(52) U.S. Cl.
CPC .. *G02F 1/133528* (2013.01); *G02F 1/133617* (2013.01); *H01L 27/1225* (2013.01); *H01L 29/7869* (2013.01); *G02B 5/22* (2013.01); *G02F 2001/133614* (2013.01)

(58) Field of Classification Search
CPC ........ G02B 5/305; G02B 5/3083; G02B 5/22; H01L 27/1225; H01L 29/7869
See application file for complete search history.

(56) References Cited

U.S. PATENT DOCUMENTS

| | | | | |
|---|---|---|---|---|
| 2008/0171484 | A1* | 7/2008 | Yamashita | G02F 1/133305 445/24 |
| 2010/0079704 | A1* | 4/2010 | Cho | G02F 1/133617 349/71 |
| 2012/0206935 | A1* | 8/2012 | Seo | G02B 6/0023 362/602 |
| 2013/0112959 | A1* | 5/2013 | Kim | G02B 5/3033 257/40 |
| 2014/0152942 | A1 | 6/2014 | Kim et al. | |

FOREIGN PATENT DOCUMENTS

| | | |
|---|---|---|
| JP | H01-133003 A | 5/1989 |
| JP | 2001-215886 A | 8/2001 |
| JP | 2001-318370 A | 11/2001 |
| JP | 2003-043460 A | 2/2003 |
| JP | 2003-131213 A | 5/2003 |
| JP | 3448626 B2 | 9/2003 |
| JP | 2005-182000 A | 7/2005 |
| JP | 2006-145884 A | 6/2006 |
| JP | 2008235458 A * | 10/2008 ......... H01L 25/0753 |
| JP | 2010-529592 A | 8/2010 |
| JP | 2010-230816 A | 10/2010 |
| JP | 2011-141522 A | 7/2011 |
| JP | 2012-502322 A | 1/2012 |
| JP | 2012-169271 A | 9/2012 |
| JP | 2012-209228 A | 10/2012 |
| JP | 2013-064926 A | 4/2013 |
| JP | 2014-502403 A | 1/2014 |
| WO | 95/17699 A1 | 6/1995 |
| WO | 2005/052892 A1 | 6/2005 |
| WO | 2008/123027 A1 | 10/2008 |
| WO | 2008/144136 A1 | 11/2008 |
| WO | 2012/059931 A1 | 5/2012 |

OTHER PUBLICATIONS

Notification of Reasons for Refusal issued by the Japanese Patent Office dated Mar. 21, 2017, in connection with Japanese Patent Application No. 2015-521506.

First Office Action issued by the State Intellectual Property Office (SIPO) of China dated May 3, 2017 in connection with corresponding Chinese Patent Application No. 201480032011.6.

Notification of Reasons for Refusal issued by the Japanese Patent Office dated Nov. 22, 2016 in connection with Japanese Patent Application No. 2015-521506.

International Search Report issued in connection with International Patent Application No. PCT/JP2014/065121 dated Aug. 26, 2014.

Written Opinion issued in connection with International Patent Application No. PCT/JP2014/065121 dated Aug. 26, 2014.

Second Office Action issued by the State Intellectual Property Office (SIPO) of China dated Apr. 2, 2018, in connection with Chinese Patent Application No. 201480032011.6.

* cited by examiner

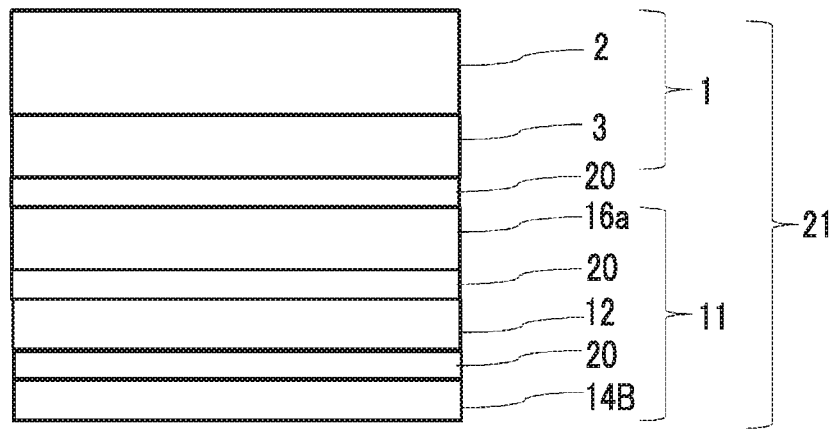
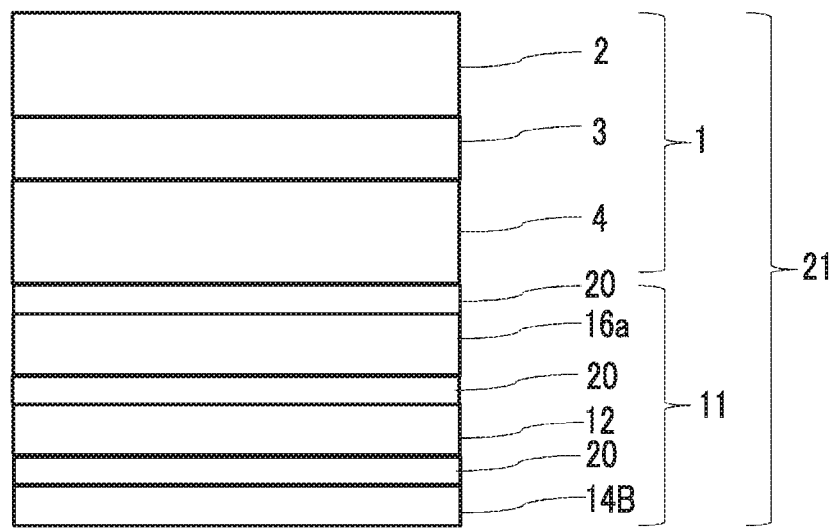

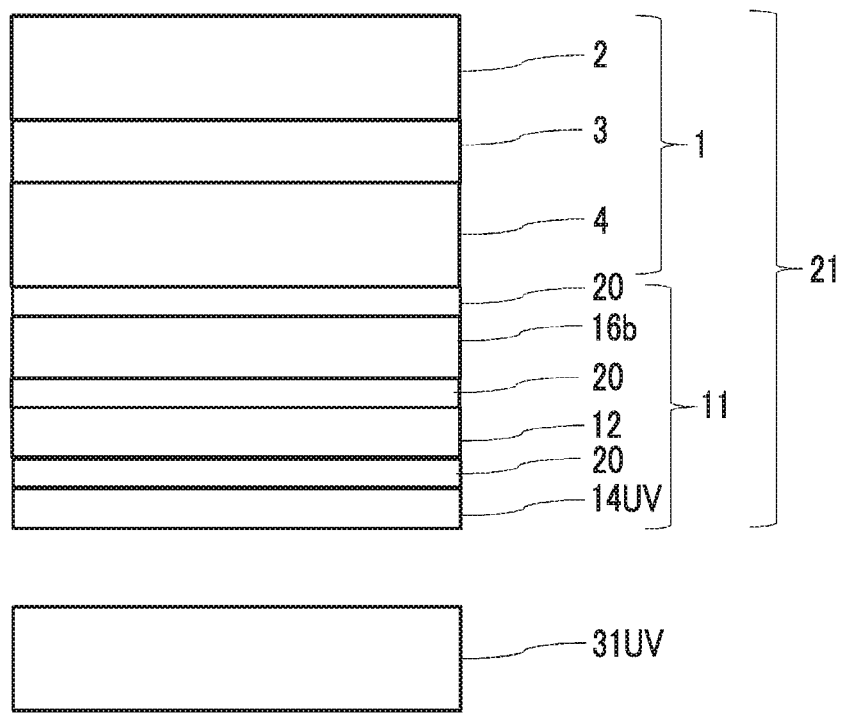
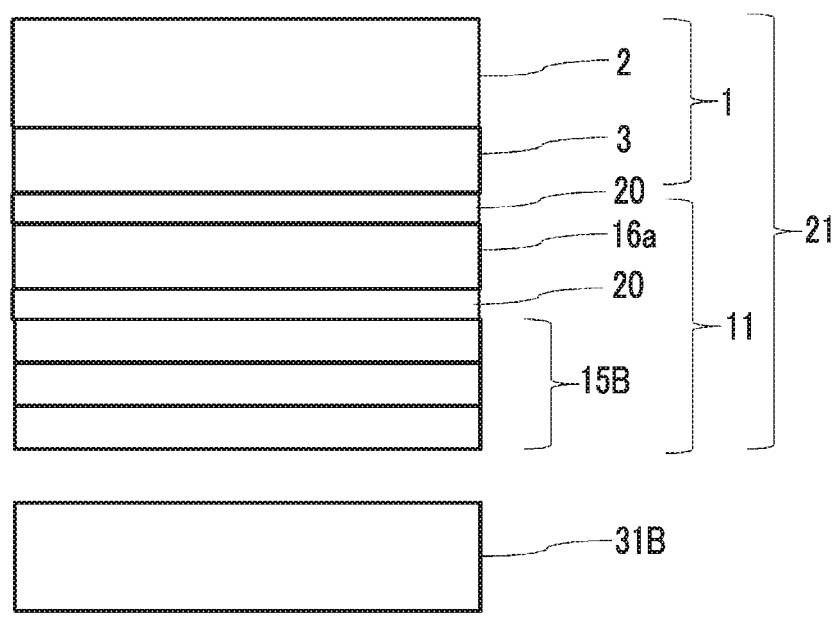

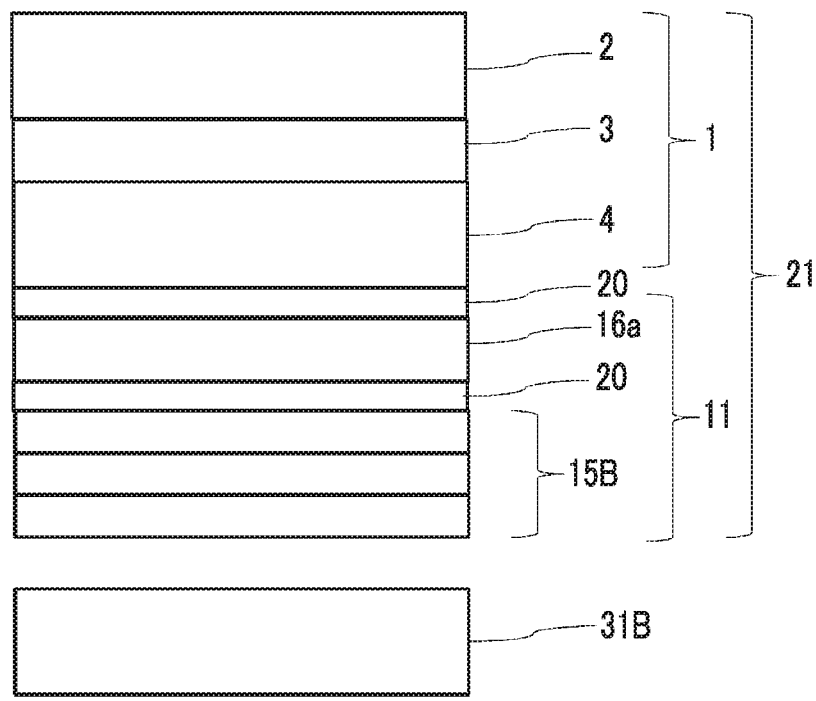
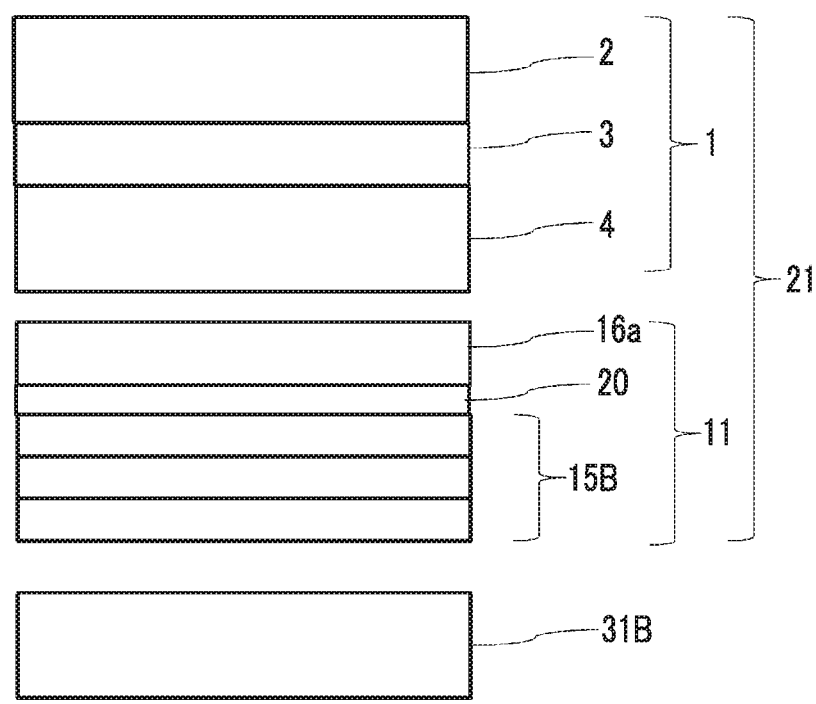

OPTICAL SHEET MEMBER AND IMAGE DISPLAY DEVICE USING SAME

CROSS-REFERENCE TO RELATED APPLICATIONS

This application is a Continuation of PCT International Application No. PCT/JP2014/065121, filed on Jun. 6, 2014, which was published under PCT Article 21(2) in Japanese, and claims priority under 35 U.S.C. Section 119(a) to Japanese Patent Application No. 2013-119670 filed on Jun. 6, 2013. The above applications are hereby expressly incorporated by reference, in their entirety, into the present application.

BACKGROUND OF THE INVENTION

1. Field of the Invention

The present invention relates to an optical sheet member and an image display device employing the same.

2. Description of the Related Art

A flat panel display such as a liquid crystal display device (hereinafter, also referred to as an LCD) has been widely used as an image display device having small power consumption and space saving properties over the years. The liquid crystal display device has a configuration in which backlight (hereinafter, also referred to as BL), a backlight side polarizing plate, a liquid crystal cell, a visible side polarizing plate, and the like are disposed in this order.

In the recent flat panel display market, development for power saving, high definition, and color reproducibility improvement has progressed as an LCD performance enhancement, and currently, power saving, high definition, and color reproducibility improvement have been remarkably required in a small-size device, particularly for example, a tablet PC or a smart phone, but development of next generation high vision (4K2K, an EBU ratio of greater than or equal to 100%) of current TV standards (FHD, National Television System Committee (NTSC) ratio of 72%≈European Broadcasting Union (EBU) ratio of 100%) has progressed in a large-size device. For this reason, the power saving, the high definition, and the color reproducibility improvement of the liquid crystal display device have been increasingly required.

An optical sheet member is disposed between the backlight and the backlight side polarizing plate according to power saving of the backlight, and the optical sheet member is an optical device in which, among incident light rays while vibrating in all directions, only light rays vibrating in a specific polarization direction are transmitted, and light rays vibrating in the other polarization direction are reflected. As a core component of a low power LCD according to an increase in a mobile device and low power consumption in a home electric appliance, improvement of light efficiency of the LCD and an increase in brightness (a degree of brightness per unit area of a light source) have been expected.

In response, a technology has been known in which an optical sheet member (a Dual Brightness Enhancement Film (DBEF) or the like) is combined between the backlight and the backlight side polarizing plate, and thus a light utilization rate of the BL is improved according to optical recycling, and the brightness is improved while saving power of the backlight (refer to JP3448626B). Similarly, in JP1989-133003A (JP-H01-133003A), a technology is disclosed in which a light utilization rate of the BL is improved in the optical recycling according to broadband in a polarizing plate having a configuration in which a λ/4 plate and a cholesteric liquid crystalline phase are laminated and a layer formed by fixing cholesteric liquid crystalline phases of three or more layers having different pitches are laminated and a layer formed by fixing cholesteric liquid crystalline phases of three or more layers having different pitches of the cholesteric liquid crystalline phases.

However, such an optical sheet member has a complicated member configuration, and thus it is necessary to reduce the cost by reducing the number of members in which functions of the members are further integrated in order to spread the optical sheet member to the market.

On the other hand, a method has been known in which a light emitting spectrum of the backlight is sharpened from a viewpoint of high definition of a liquid crystal display device and of improving color reproducibility thereof. For example, in JP2012-169271A, a method is disclosed in which white light is realized by using a quantum dot (QD) emitting red light and green light as a fluorescent body between a blue LED and a light guide plate, and thus high brightness and an improvement in color reproducibility are realized. In SID'12 DIGEST p. 895, a method is proposed in which an optical conversion sheet using a quantum dot (QDEF, also referred to as a quantum dot sheet) is combined in order to enhance color reproducibility of the LCD.

SUMMARY OF THE INVENTION

In JP3448626B and JP1989-133003A (JP-H01-133003A) in which a light utilization rate is enhanced, a broadband optical recycling function is applied to the white light, and thus the design is complicated in consideration of a multi-layer configuration and wavelength dispersion properties of the member, and manufacturing costs are high. In addition, in a fluorescent (PL) application technology disclosed in JP2012-169271A and SID'12 DIGEST p. 895, high brightness and an improvement in color reproducibility are realized according to the white light by using the Quantum Dot (hereinafter, also referred to as a QD), but it is necessary to be combined with JP3448626B and JP1989-133003A (JP-H01-133003A) in order to further enhance the brightness, and thus the same problems as described above occur.

The enhancement in a BL light utilization rate necessary for power saving and high definition (a decrease in an opening ratio) and an improvement in color reproducibility (a decrease in transmittance of a color filter (hereinafter, also referred to as a CF)) have a trade-off relationship, and it is necessary to make the enhancement in the light utilization rate and the color reproducibility compatible. In addition, an object of the present invention is to reduce the cost by reducing the number of members in which functions of the members are further integrated, to reduce a film thickness of the member by integrating the members or to reduce interface reflection loss at an air layer of a gap between the members, and to eliminate a display defect due to foreign substances mixed between the members, which is likely to occur at the time of manufacturing a display device or after manufacturing the display device.

An object of the present invention is to provide an optical sheet member in which front brightness, front contrast, and a color reproducing region are enhanced and color unevenness in an inclined azimuth is also able to be reduced by thinning or integrating members at the time of being incorporated in an image display device using UV narrowband or B narrowband backlight.

In order to attain the object described above, as a result of intensive studies of the present inventors, it has been found that a light utilization rate is increased by using a reflection polarizer which functions as a backlight light source unit having a wavelength region of monochromatic bright line light (a half-value width of less than or equal to 100 nm, for example, a blue light source in 430 nm to 470 nm, and for example, a B-LED at 465 nm) having a narrow emission peak in a B wavelength region and an UV light source (an UV-LED having an emission spectrum in 300 nm to 430 nm, and the like) having a narrow emission peak in an UV wavelength region and has a narrow reflection peak, and optical conversion is performed by using a quantum dot (including quantum effect particles such as quantum dot particles, quantum rod particles, and quantum tetrapod particles) or a PL material (an organic material and an inorganic material), and thus it is possible to concurrently improve front brightness, front contrast, and a color reproducing region, and to reduce color unevenness in an inclined direction with a simple configuration, and it is possible to attain the object described above.

That is, the object described above is attained by the present invention having the following configuration.

[1] An optical sheet member including a polarizing plate including a polarizer (A); an optical conversion member (D); and a brightness enhancement film including a reflection polarizer (B), in which the brightness enhancement film has a reflection center wavelength in a wavelength range of 400 nm to 500 nm and a peak of reflectivity having a half-value width of less than or equal to 100 nm, and the optical conversion member (D) converts a part of blue light which is transmitted through the reflection polarizer (B) and is incident on the optical conversion member (D), and has an emission center wavelength in the wavelength range of 400 nm to 500 nm and a peak of emission intensity having a half-value width of less than or equal to 100 nm into green light which has an emission center wavelength in a wavelength range of 500 nm to 600 nm and a peak of emission intensity having a half-value width of less than or equal to 100 nm and red light which has an emission center wavelength in a wavelength range of 600 nm to 700 nm and a peak of emission intensity having a half-value width of less than or equal to 100 nm, and transmits a part of the blue light.

[2] In the optical sheet member according to [1], it is preferable that the brightness enhancement film has a reflection center wavelength in a wavelength range of 430 nm to 480 nm and has a peak of reflectivity having a half-value width of less than or equal to 100 nm, and the optical conversion member (D) converts a part of blue light which is transmitted through the reflection polarizer (B) and is incident on the optical conversion member (D), and has an emission center wavelength in the wavelength range of 430 nm to 480 nm and a peak of emission intensity having a half-value width of less than or equal to 100 nm into green light which has an emission center wavelength in the wavelength range of 500 nm to 600 nm and a peak of emission intensity having a half-value width of less than or equal to 100 nm and red light which has an emission center wavelength in a wavelength range of 600 nm to 650 nm and a peak of emission intensity having a half-value width of less than or equal to 100 nm, and transmits a part of the blue light.

[3] An optical sheet member including a polarizing plate including a polarizer (A); an optical conversion member (D); and a brightness enhancement film including a reflection polarizer (B), in which the brightness enhancement film has a reflection center wavelength in a wavelength range of 300 nm to 430 nm and a peak of reflectivity having a half-value width of less than or equal to 100 nm, and the optical conversion member (D) converts a part or all of UV light which is transmitted through the reflection polarizer (B) and is incident on the optical conversion member (D), and has an emission center wavelength in the wavelength range of 300 nm to 430 nm and a peak of emission intensity having a half-value width of less than or equal to 100 nm into blue light which has an emission center wavelength in a wavelength range of 430 nm to 480 nm and a peak of emission intensity having a half-value width of less than or equal to 100 nm, green light which has an emission center wavelength in a wavelength range of 500 nm to 600 nm and a peak of emission intensity having a half-value width of less than or equal to 100 nm, and red light which has an emission center wavelength in a wavelength range of 600 nm to 700 nm and a peak of emission intensity having a half-value width of less than or equal to 100 nm.

[4] In the optical sheet member according to [3], it is preferable that the optical conversion member (D) converts a part or all of UV light which is transmitted through the reflection polarizer (B) and is incident on the optical conversion member (D), and has an emission center wavelength in the wavelength range of 300 nm to 430 nm and a peak of emission intensity having a half-value width of less than or equal to 100 nm into blue light which has an emission center wavelength in the wavelength range of 430 nm to 480 nm and a peak of emission intensity having a half-value width of less than or equal to 100 nm, green light which has an emission center wavelength in the wavelength range of 500 nm to 600 nm and a peak of emission intensity having a half-value width of less than or equal to 100 nm, and red light which has an emission center wavelength in a wavelength range of 600 nm to 650 nm and a peak of emission intensity having a half-value width of less than or equal to 100 nm.

[5] In the optical sheet member according to [1], it is preferable that the reflection polarizer (B) includes a first light reflecting layer which has a reflection center wavelength in the wavelength range of 400 nm to 500 nm and a peak of reflectivity having a half-value width of less than or equal to 100 nm, and is formed by fixing a cholesteric liquid crystalline phase, and the brightness enhancement film includes a $\lambda/4$ plate (C) satisfying Expression (1) described below between the polarizer (A) and the reflection polarizer (B). Further, a wavelength dispersion of the $\lambda/4$ plate (C) may be a forward dispersion "Re(450)>Re(550)", and as the wavelength dispersion of the $\lambda/4$ plate (C), a flat dispersion "Re(450)≈Re(550)" is able to be preferably used, and a reverse dispersion "Re(450)<Re(550)" is able to be is more preferably used.

$$450 \text{ nm}/4-60 \text{ nm} < Re(450) < 450 \text{ nm}/4+60 \text{ nm} \quad \text{Expression (1)}$$

(In Expression (1), Re($\lambda$) represents retardation in an in-plane direction at a wavelength of $\lambda$ nm, and unit is nm.)

[6] In the optical sheet member according to any one of [1], [2], and [5], it is preferable that the reflection polarizer (B) includes a first light reflecting layer which has a reflection center wavelength in the wavelength range of 430 nm to 480 nm and a peak of reflectivity having a half-value width of less than or equal to 100 nm, and is formed by fixing the cholesteric liquid crystalline phase, and the brightness enhancement film includes the $\lambda/4$ plate (C) satisfying Expression (1') described below between the polarizer (A) and the reflection polarizer (B).

$$450 \text{ nm}/4-25 \text{ nm} < Re(450) < 450 \text{ nm}/4+25 \text{ nm} \quad \text{Expression (1')}$$

In Expression (1'), Re(λ) represents retardation in an in-plane direction at a wavelength of λ nm, and unit is nm.

[7] In the optical sheet member according to [1], it is preferable that the reflection polarizer (B) is a dielectric multilayer film which has a reflection center wavelength in the wavelength range of 400 nm to 500 nm and a peak of reflectivity having a half-value width of less than or equal to 100 nm.

[8] In the optical sheet member according to [3] or [4], it is preferable that the reflection polarizer (B) includes a first light reflecting layer which has a reflection center wavelength in the wavelength range of 300 nm to 430 nm and a peak of reflectivity having a half-value width of less than or equal to 100 nm, and is formed by fixing a cholesteric liquid crystalline phase, and the brightness enhancement film includes a λ/4 plate (C) satisfying Expression (2) described below between the optical conversion member (D) and the reflection polarizer (B). Further, a wavelength dispersion of the λ/4 plate (C) may be a forward dispersion "Re(380)>Re(450)", and as the wavelength dispersion of the λ/4 plate (C), a flat dispersion "Re(380)≅Re(450)" is able to be preferably used, and a reverse dispersion "Re(380)<Re(450)" is able to be more preferably used.

$$380 \text{ nm}/4-60 \text{ nm} < Re(380) < 380 \text{ nm}/4+60 \text{ nm} \quad \text{Expression (2)}$$

(In Expression (2), Re(λ) represents retardation in an in-plane direction at a wavelength of λ nm, and unit is nm.)

[9] In the optical sheet member according to any one of [3], [4], and [8], it is preferable that the reflection polarizer (B) includes the first light reflecting layer which has a reflection center wavelength in the wavelength range of 300 nm to 430 nm and a peak of reflectivity having a half-value width of less than or equal to 100 nm, and is formed by fixing the cholesteric liquid crystalline phase, and the brightness enhancement film includes the λ/4 plate (C) satisfying Expression (2') described below between the optical conversion member (D) and the reflection polarizer (B).

$$380 \text{ nm}/4-25 \text{ nm} < Re(380) < 380 \text{ nm}/4+25 \text{ nm} \quad \text{Expression (2')}$$

In Expression (2), Re(λ) represents retardation in an in-plane direction at a wavelength of λ nm, and unit is nm.

[10] In the optical sheet member according to [3] or [4], it is preferable that the reflection polarizer (B) is a dielectric multilayer film which has a reflection center wavelength in the wavelength range of 300 nm to 430 nm and a peak of reflectivity having a half-value width of less than or equal to 100 nm.

[11] In the optical sheet member according to any one of [1] to [10], it is preferable that the optical conversion member (D) and the reflection polarizer (B) are laminated in direct contact with each other or through an adhesive layer.

[12] In the optical sheet member according to any one of [5], [6], [8], and [9], it is preferable that the polarizing plate, the optical conversion member (D), the λ/4 plate (C), and the reflection polarizer (B) are sequentially laminated in direct contact with each other or through an adhesive layer.

[13] In the optical sheet member according to any one of [1] to [12], it is preferable that a difference in refractive indexes between the reflection polarizer (B) and a layer in direct contact with the reflection polarizer (B) on the polarizing plate side is less than or equal to 0.15.

[14] In the optical sheet member according to any one of [1] to [13], it is preferable that a film thickness of the brightness enhancement film is 3 μm to 10 μm.

[15] In the optical sheet member according to [1] or [2], it is preferable that the optical conversion member (D) includes a fluorescent material emitting the green light and the red light when the blue light is incident thereon.

[16] In the optical sheet member according to [3] or [4], it is preferable that the optical conversion member (D) includes a fluorescent material emitting the blue light, the green light, and the red light when light having an emission center wavelength in the wavelength range of 300 nm to 430 nm and a peak of emission intensity having a half-value width of less than or equal to 100 nm is incident thereon.

[17] In the optical sheet member according to [15] or [16], it is preferable that the optical conversion member (D) is a thermoplastic film which is formed by being stretched after dispersing quantum dot sheets, quantum rods, or quantum dot materials, or an adhesive layer on which quantum rods or quantum dot materials are dispersed.

[18] In the optical sheet member according to any one of [1] to [17], it is preferable that the optical conversion member emits fluorescent light holding at least a part of polarization properties of an incidence ray.

[19] In the optical sheet member according to [18], it is preferable that, in the optical conversion member, a polarization degree of fluorescent light emitted from the optical conversion member is 10% to 99% when light having a polarization degree of 99.9% is incident on the optical conversion member.

[20] In the optical sheet member according to any one of [1] to [19], it is preferable that the optical conversion member includes a fluorescent material in which light exited from the optical conversion member includes the linear polarization light and circular polarization light.

[21] In the optical sheet member according to any one of [1] to [20], it is preferable that light exited from the optical conversion member includes the linear polarization light, and the polarizing plate further includes a linear polarization reflection polarizer or further includes a linear polarization reflection polarizer between the polarizing plate and the optical conversion member.

[22] In the optical sheet member according to [21], it is preferable that the linear polarization reflection polarizer is a dielectric multilayer film which reflects at least a part of light in a wavelength range of 300 nm to 500 nm.

[23] In the optical sheet member according to [21], it is preferable that the linear polarization reflection polarizer is a linear polarization reflection polarizer including a λ/4 plate on both sides of a light reflecting layer which is formed by fixing a cholesteric liquid crystalline phase reflecting at least a part of light in a wavelength range of 300 nm to 500 nm.

[24] In the optical sheet member according to any one of [1] to [20], it is preferable that light exited from the optical conversion member includes the circular polarization light, and the polarizing plate further includes a circular polarization reflection polarizer or further includes a circular polarization reflection polarizer between the polarizing plate and the optical conversion member.

[25] In the optical sheet member according to [24], it is preferable that the circular polarization reflection polarizer is a circular polarization reflection polarizer including a λ/4 plate on both sides of a dielectric multilayer film which reflects at least a part of light in a wavelength range of 300 nm to 500 nm.

[26] In the optical sheet member according to [24], it is preferable that the circular polarization reflection polarizer is a circular polarization reflection polarizer including a light reflecting layer which is formed by fixing a cholesteric liquid crystalline phase reflecting at least a part of light in a wavelength range of 300 nm to 500 nm and a λ/4 plate which is arranged between the light reflecting layer and the polarizing plate.

[27] In the optical sheet member according to any one of [1] to [26], it is preferable that the optical conversion member is pattern-formed at each two or more types of fluorescent wavelengths.

[28] An image display device including the optical sheet member according to [1] or [2]; and a backlight unit, in which the backlight unit includes a light source emitting blue light which has an emission center wavelength in the wavelength range of 430 nm to 480 nm and a peak of emission intensity having a half-value width of less than or equal to 100 nm, and the backlight unit includes a reflection member performing conversion of a polarization state of light which is emitted from the light source and is reflected on the optical sheet member and reflection of the light in a rear portion of the light source.

[29] An image display device including the optical sheet member according to [3] or [4]; and a backlight unit, in which the backlight unit includes a light source emitting UV light which has an emission center wavelength in the wavelength range of 300 nm to 430 nm and a peak of emission intensity having a half-value width of less than or equal to 100 nm, and the backlight unit includes a reflection member performing conversion of a polarization state of light which is emitted from the light source and is reflected on the optical sheet member and reflection of the light in a rear portion of the light source.

[30] In the image display device according to [28] or [29], it is preferable that a difference between a wavelength applying a peak of emission intensity of blue light or UV light of the backlight unit and a wavelength applying a peak of reflectivity in the brightness enhancement film is 5 nm to 70 nm.

[31] In the image display device according to any one of [28] to [30], it is preferable that the image display device further includes a liquid crystal cell.

[32] In the image display device according to [28], it is preferable that the backlight unit includes a wavelength selective filter for a blue color which selectively transmits light having a wavelength shorter than 480 nm among the blue light rays.

[33] In the image display device according to any one of [28] to [32], it is preferable that the image display device further includes a thin layer transistor, and the thin layer transistor includes an oxide semiconductor layer having a carrier concentration of less than $1 \times 10^{14}/cm^3$.

According to the present invention, it is possible to provide an optical sheet member in which the thickness of the member is thinned by reducing the number of members, the occurrence of brightness unevenness is suppressed by foreign substances mixed into the display device, front brightness, front contrast, and a color reproducing region are able to be enhanced, and color unevenness in an inclined azimuth is able to be reduced when the optical sheet member is incorporated in an image display device using L narrowband or B narrowband backlight.

BRIEF DESCRIPTION OF THE DRAWINGS

FIG. 1 is a schematic view illustrating a sectional surface of an example of an optical sheet member of the present invention using a quantum dot material which is able to convert B into G and R as an optical conversion member by using a layer formed by fixing a B narrowband cholesteric liquid crystalline phase as a reflection polarizer along with a positional relationship with respect to backlight.

FIG. 2 is a schematic view illustrating a sectional surface of another example of the optical sheet member of the present invention using the quantum dot material which is able to convert B into G and R as the optical conversion member by using the layer formed by fixing the B narrowband cholesteric liquid crystalline phase as the reflection polarizer along with the positional relationship with respect to the backlight.

FIG. 5 is a schematic view illustrating a sectional surface of still another example of the optical sheet member of the present invention using the quantum dot material which is able to convert UV into B, G, and R as the optical conversion member by using the layer formed by fixing an UV narrowband cholesteric liquid crystalline phase as the reflection polarizer along with the positional relationship with respect to the backlight.

FIG. 6 is a schematic view illustrating a sectional surface of an example of the optical sheet member of the present invention using a quantum dot material which is able to convert B into G and R as an optical conversion member by using a B narrowband dielectric multilayer film as a reflection polarizer along with a positional relationship with respect to backlight.

FIG. 7 is a schematic view illustrating a sectional surface of another example of the optical sheet member of the present invention using the quantum dot material which is able to convert B into G and R as the optical conversion member by using the B narrowband dielectric multilayer film as the reflection polarizer along with the positional relationship with respect to the backlight.

FIG. 8 is a schematic view illustrating a sectional surface of still another example of the optical sheet member of the present invention using the quantum dot material which is able to convert B into G and R as the optical conversion member by using the B narrowband dielectric multilayer film as the reflection polarizer along with the positional relationship with respect to the backlight.

FIG. 14-B is a schematic view illustrating a sectional surface of still another example of the liquid crystal display device which is the image display device of the present invention.

DESCRIPTION OF THE PREFERRED EMBODIMENTS

Figure 3:
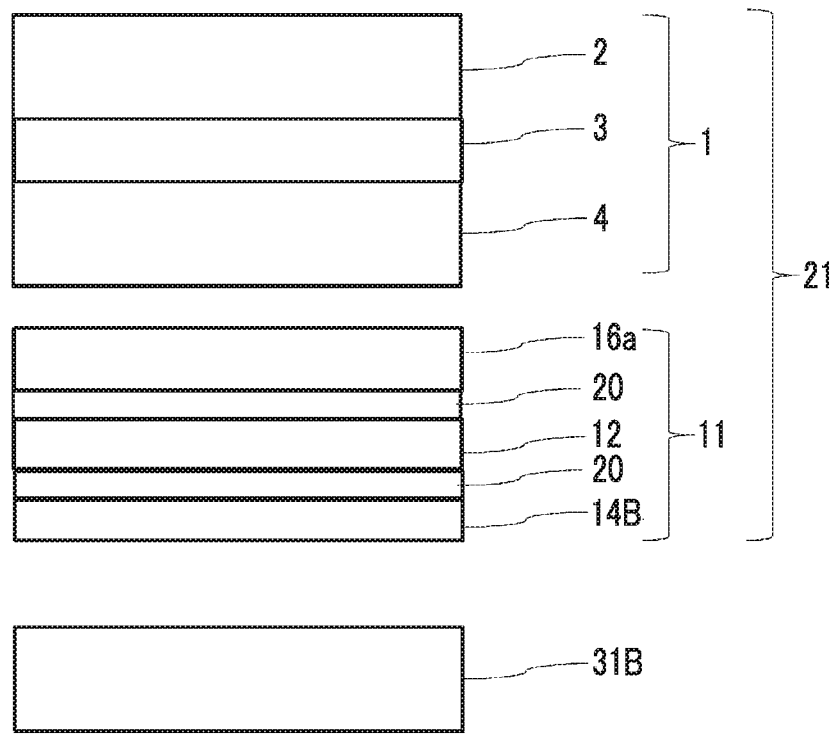
FIG. 3 is a schematic view illustrating a sectional surface of still another example of the optical sheet member of the present invention using the quantum dot material which is able to convert B into G and R as the optical conversion member by using the layer formed by fixing the B narrowband cholesteric liquid crystalline phase as the reflection polarizer along with the positional relationship with respect to the backlight.
Figure 4:
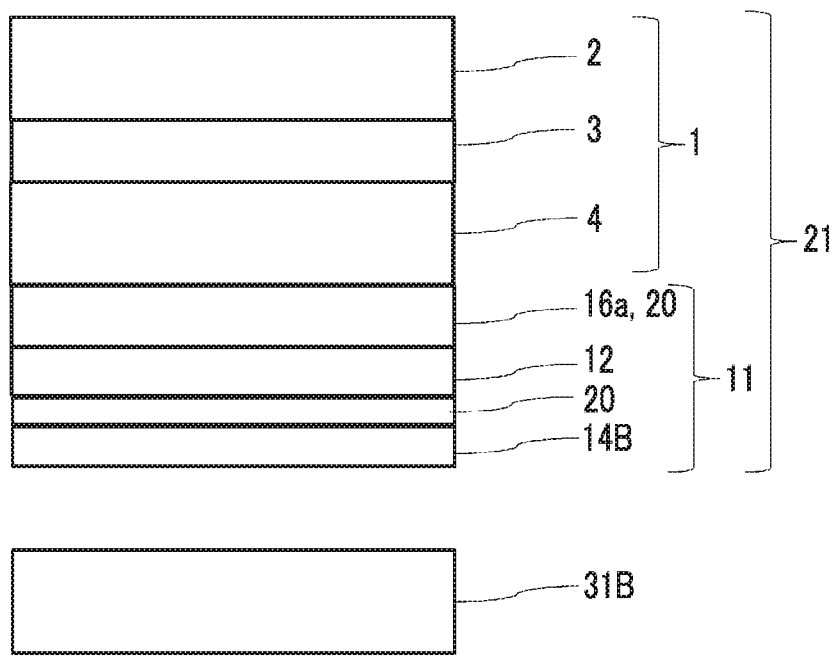
FIG. 4 is a schematic view illustrating a sectional surface of still another example of the optical sheet member of the present invention using an adhesive layer on which the quantum dot material which is able to convert B into G and R is dispersed as the optical conversion member by using the layer formed by fixing the B narrowband cholesteric liquid crystalline phase as the reflection polarizer along with the positional relationship with respect to the backlight.
Figure 9:
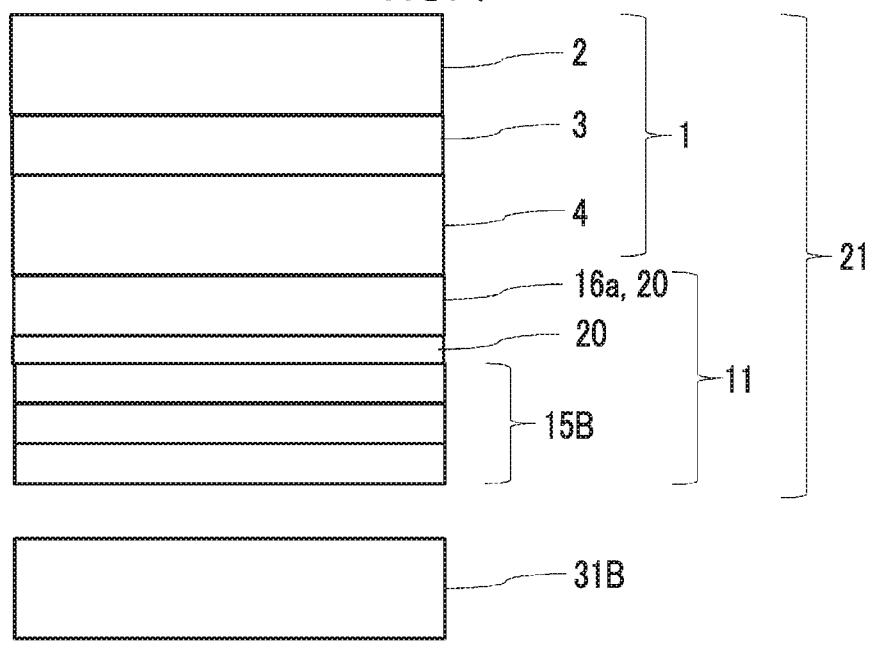
FIG. 9 is a schematic view illustrating a sectional surface of still another example of the optical sheet member of the present invention using an adhesive layer on which quantum dot materials which are able to convert B into G and R are dispersed as the optical conversion member by using the B narrowband dielectric multilayer film as the reflection polarizer along with the positional relationship with respect to the backlight.
Figure 10:
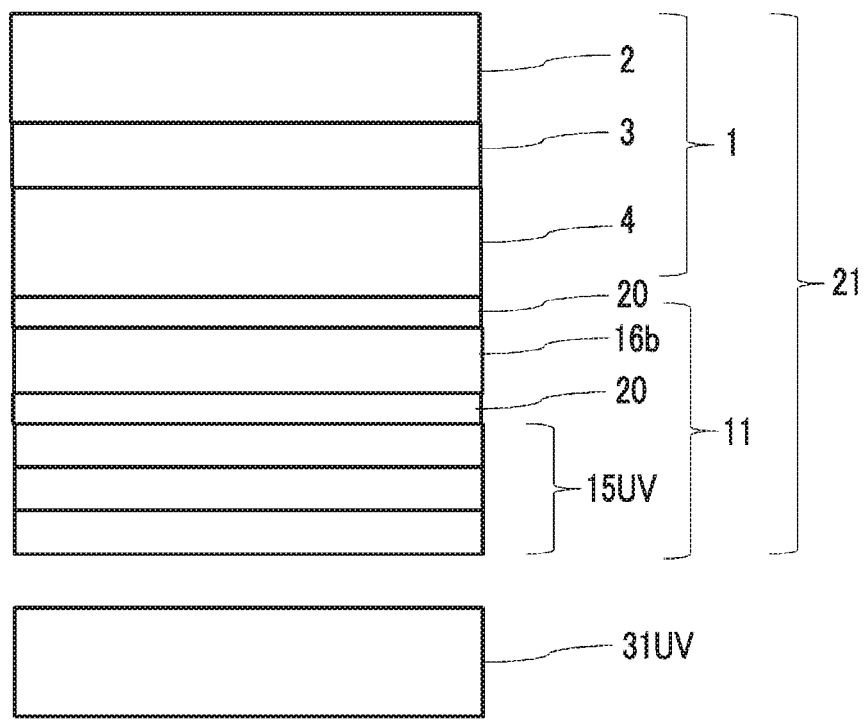
FIG. 10 is a schematic view illustrating a sectional surface of still another example of the optical sheet member of the present invention using a quantum dot material which is able to convert UV into B, G, and R as an optical conversion member by using a layer formed by fixing an UV narrow-band dielectric multilayer film as the reflection polarizer along with the positional relationship with respect to the backlight.

Hereinafter, an optical sheet member and an image display device of the present invention will be described in detail.

The following description of configuration requirement is based on a representative embodiment of the present invention, but the present invention is not limited to such an embodiment. Furthermore, herein, a numerical range denoted by using "to" indicates a range including numerical values described before and after "to" as a lower limit value and an upper limit value.

Herein, a "half-value width" of a peak indicates the width of a peak at a peak height of ½.

[Optical Sheet Member]

A first aspect of an optical sheet member of the present invention includes a polarizing plate including a polarizer (A); an optical conversion member (D); and a brightness enhancement film including a reflection polarizer (B), the brightness enhancement film has a reflection center wavelength in a wavelength range of 400 nm to 500 nm (preferably, in a wavelength range of 430 nm to 480 nm) and a peak of reflectivity having a half-value width of less than or equal to 100 nm, the optical conversion member (D) converts a part of blue light which is transmitted through the reflection polarizer (B) and is incident on the optical conversion member (D), and has an emission center wavelength in a wavelength range of 400 nm to 500 nm (preferably, in a wavelength range of 430 nm to 480 nm) and a peak of emission intensity having a half-value width of less than or equal to 100 nm into green light which has an emission center wavelength in a wavelength range of 500 nm to 600 nm and a peak of emission intensity having a half-value width of less than or equal to 100 nm and red light which has an emission center wavelength in a wavelength range of 600 nm to 700 nm (preferably, in a wavelength range of 600 nm to 650 nm) and has a peak of emission intensity having a half-value width of less than or equal to 100 nm, and transmits a part of the blue light.

A second aspect of the optical sheet member of the present invention includes a polarizing plate including a polarizer (A); an optical conversion member (D); and a brightness enhancement film including a reflection polarizer (B), the brightness enhancement film has a reflection center wavelength in a wavelength range of 300 nm to 430 nm and a peak of reflectivity having a half-value width of less than or equal to 100 nm, and the optical conversion member (D) converts a part or all of UV light which is transmitted through the reflection polarizer (B) and is incident on the optical conversion member (D), and has an emission center wavelength in a wavelength range of 300 nm to 430 nm and a peak of emission intensity having a half-value width of less than or equal to 100 nm into blue light which has an emission center wavelength in a wavelength range of 430 nm to 480 nm and a peak of emission intensity having a half-value width of less than or equal to 100 nm, green light which has an emission center wavelength in a wavelength range of 500 nm to 600 nm and a peak of emission intensity having a half-value width of less than or equal to 100 nm, and red light which has an emission center wavelength in a wavelength range of 600 nm to 700 nm (preferably, in a wavelength range of 600 nm to 650 nm) and a peak of emission intensity having a half-value width of less than or equal to 100 nm.

According to such a configuration, in the optical sheet member of the present invention, the thickness of the member is thinned by reducing the number of members, the occurrence of brightness unevenness is suppressed by foreign substances mixed into the display device, front brightness, front contrast, and a color reproducing region are able to be enhanced, and color unevenness in an inclined azimuth is able to be reduced when the optical sheet member is incorporated in an image display device using backlight in which a bright line having a half-value width of less than or equal to 100 nm is in an UV range and a bright line having a half-value width of less than or equal to 100 nm is in a B range.

In FIG. 1 to FIG. 10, a schematic view of the optical sheet member of the present invention is illustrated along with a backlight unit 31. An optical sheet member 21 of the present invention includes a polarizing plate 1 and a brightness enhancement film 11; The polarizing plate 1 and the brightness enhancement film 11 may be laminated through an adhesive layer 20 (refer to FIG. 1, FIG. 2, and the like), or may be separately arranged (refer to FIG. 3 and the like).

<Polarizing Plate>

Next, a polarizing plate will be described.

In general, the polarizing plate of the optical sheet member of the present invention is formed of a polarizer (A) and two polarizing plate protective films (hereinafter, also referred to as a protective film) arranged on both sides thereof, as with a polarizing plate used in a liquid crystal display device, and in the present invention, in order to further reduce the thickness of the optical sheet member, it is preferable that the protective film is further thinned (the thickness of the protective film is less than or equal to 40 μm, is preferably less than or equal to 25 μm, and is more preferably less than or equal to 15 μm), it is more preferable that a hard coat formed by coating, drying, and curing a protective resin such as an acrylic resin is used (the thickness of the hard coat is less than or equal to 20 µm, is preferably less than or equal to 10 µm, and is more preferably less than or equal to 5 µm), and it is even more preferable that a polarizer in which a protective layer is not disposed is used for realizing a thin optical sheet member. In the present invention, it is more preferable that a retardation film is used as the protective film arranged on the liquid crystal cell side between the two protective films in a case of a liquid crystal display device in a VA mode, an IPS mode, a TN mode, and an OCB mode, it is preferable that an optical compensation film which does not substantially have a phase difference is used in a case of a liquid crystal display device in an IPS mode, and it is preferable that the optical compensation film is not used for realizing a thin optical sheet member.

In FIG. 1 to FIG. 10, the polarizing plate 1 includes a polarizer 3. The polarizing plate 1 may include a retardation film 2 on the surface of the polarizer 3 on a visible side, and the polarizing plate 1 may include a polarizing plate protective film 4 on the surface of the polarizer 3 on a backlight unit 31 side (refer to FIG. 2, FIG. 3, FIG. 7, FIG. 8, and the like), or may not include the polarizing plate protective film 3 (refer to FIG. 1, FIG. 6, and the like).

(Polarizer)

It is preferable that a polarizer in which iodine is adsorbed and aligned in a polymer film is used as the polarizer (A) described above. The polymer film described above is not particularly limited, and various films are able to be used as the polymer film. Examples of the polarizer include a hydrophilic polymer film such as a polyvinyl alcohol-based film, a polyethylene terephthalate-based film, an ethylene and vinyl acetate copolymer-based film, or a partially saponified film thereof, and a cellulose-based film, a polyene-based alignment film such as a substance of polyvinyl alcohol subjected to a dehydration treatment or a substance of polyvinyl chloride subjected to a dehydrochlorination treatment, and the like. Among them, a polyvinyl alcohol-based film having excellent dyeability of iodine is preferably used as the polarizer (A).

Polyvinyl alcohol or a derivative thereof is used as the material of the polyvinyl alcohol-based film. Examples of the derivative of the polyvinyl alcohol include polyvinyl formal, polyvinyl acetal, and the like, and a substance modified with olefin such as ethylene and propylene, an unsaturated carboxylic acid such as an acrylic acid, a methacrylic acid, and a crotonic acid and alkyl ester thereof, acryl amide, or the like.

A degree of polymerization of the polymer which is the material of the polymer film described above is generally in a range of 500 to 10,000, is preferably in a range of 1,000 to 6,000, and is more preferably in a range of 1,400 to 4,000. Further, in a case of a saponified film, a degree of saponification, for example, is preferably greater than or equal to 75 mol %, is more preferably greater than or equal to 98 mol %, and is even more preferably 98.3 mol % to 99.8 mol %, from a viewpoint of solubility with respect to water.

The polymer film (an unstretched film) described above is subjected to at least a monoaxially stretching treatment and an iodine dyeing treatment according to a normal method. Further, a boric acid treatment and a cleaning treatment are able to be performed. In addition, a polymer film (a stretched film) subjected to the treatments described above is subjected to a drying treatment according to a normal method, and thus the polarizer (A) is obtained.

A stretching method in the monoaxially stretching treatment is not particularly limited, and both of a wet stretching method and a dry stretching method are able to be adopted as the stretching method. Examples of stretching means of the dry stretching method include an inter-roll stretching method, a heating roll stretching method, a compression stretching method, and the like. The stretching is able to be performed in multiple steps. In the stretching means described above, the unstretched film is generally in a heated state. A stretching ratio of the stretched film is able to be suitably set according to the purpose, and the stretching ratio (the total stretching ratio) is approximately 2 times to 8 times, is preferably 3 times to 7 times, and is more preferably 3.5 times to 6.5 times.

The iodine dyeing treatment, for example, is performed by dipping the polymer film in an iodine solution containing iodine and potassium iodide. The iodine solution is generally an aqueous solution of iodine, and contains iodine and potassium iodide as a dissolution aid. An iodine concentration is approximately 0.01 mass % to 1 mass %, and is preferably 0.02 mass % to 0.5 mass %, and a potassium iodide concentration is approximately 0.01 mass % to 10 mass %, and is preferably 0.02 mass % to 8 mass %.

In the iodine dyeing treatment, the temperature of the iodine solution is generally approximately 20° C. to 50° C., and is preferably 25° C. to 40° C. A dipping time is generally in a range of approximately 10 seconds to 300 seconds, and is preferably in a range of 20 seconds to 240 seconds. In the iodine dyeing treatment, an iodine content and a potassium content in the polymer film are adjusted to be in the range described below by adjusting conditions such as the concentration of the iodine solution, and the dipping temperature and the dipping time of the polymer film with respect to the iodine solution. The iodine dyeing treatment may be performed before the monoaxially stretching treatment, during the monoaxially stretching treatment, or after the monoaxially stretching treatment.

The iodine content of the polarizer (A) described above, for example, is in a range of 2 mass % to 5 mass %, and is preferably in a range of 2 mass % to 4 mass %, in consideration of optical properties.

It is preferable that the polarizer (A) described above contains potassium. A potassium content is preferably in a range of 0.2 mass % to 0.9 mass %, and is more preferably in a range of 0.5 mass % to 0.8 mass %. The polarizer (A) contains the potassium, and thus it is possible to obtain a polarization film having a preferred composite modulus (Er) and a high polarization degree. The potassium is able to be contained, for example, by dipping the polymer film which is the forming material of the polarizer (A) in a solution containing potassium. The solution described above may also be used as a solution containing iodine.

A drying method of the related art such as natural drying, blast drying, and heating drying is able to be used as a drying treatment step. For example, in the heating drying, a heating temperature is approximately 20° C. to 80° C., and a drying time is approximately 1 minute to 10 minutes. In addition, in this drying treatment step, the stretching is able to be suitably performed.

The thickness of the polarizer (A) is not particularly limited, and is generally 5 µm to 300 µm, is preferably 5 µm to 100 µm, and is more preferably 5 µm to 50 µm.

As optical properties of the polarizer (A), single transmittance at the time of being measured in a single polarizer (A) is preferably greater than or equal to 43%, and is more preferably in a range of 43.3% to 45.0%. In addition, it is preferable that orthogonal transmittance measured by preparing two polarizers (A) and by superimposing the two polarizers (A) such that absorption axes of the two polarizers (A) mutually form 90° is smaller, in practical use, the orthogonal transmittance is preferably greater than or equal to 0.00% and less than or equal to 0.050%, and is more preferably less than or equal to 0.030%. The polarization degree, in practical use, is preferably greater than or equal to 99.90% and less than or equal to 100%, and is particularly preferably greater than or equal to 99.93% and less than or equal to 100%. A polarizer in which approximately the same optical properties are able to be obtained even at the time of being measured as a polarizing plate is preferable.

(Polarizing Plate Protective Film)

The optical sheet member of the present invention may or may not include a polarizing plate protective film on a side of the polarizer opposite to the liquid crystal cell. When the optical sheet member does not include the polarizing plate protective film on the side of the polarizer opposite to the liquid crystal cell, an optical conversion material described below may be directly disposed on the polarizer or may be disposed on the polymer through an adhesive agent.

Among the protective films described above, a thermoplastic resin having excellent transparency, mechanical strength, heat stability, moisture blocking properties, isotropy, and the like is used as the protective film arranged on the side opposite to the liquid crystal cell. Specific examples of such a thermoplastic resin include a cellulose resin such as triacetyl cellulose, a polyester resin, a polyether sulfone resin, a polysulfone resin, a polycarbonate resin, a polyamide resin, a polyimide resin, a polyolefin resin, a (meth)acrylic resin, a cyclic polyolefin resin (a norbornene-based resin), a polyarylate resin, a polystyrene resin, a polyvinyl alcohol resin, and a mixture thereof.

The cellulose resin is an ester of cellulose and a fatty acid. Specific examples of such a cellulose ester-based resin include triacetyl cellulose, diacetyl cellulose, tripropyl cellulose, dipropyl cellulose, and the like. Among them, the triacetyl cellulose is particularly preferable. Various products of the triacetyl cellulose have been commercially available, and the triacetyl cellulose is advantageous from a viewpoint of easiness in acquisition and cost. Examples of a commercially available product of the triacetyl cellulose include product names of "UV-50", "UV-80", "SH-80", "TD-80U", "TD-TAC", and "UZ-TAC" manufactured by Fujifilm Corporation, and a product name of "KC Series" manufactured by Konica Minolta, Inc., and the like.

A norbornene-based resin is preferable as a specific example of the cyclic polyolefin resin. The cyclic olefin-based resin is a general term of resins in which cyclic olefin is polymerized as a polymerization unit, and examples of the cyclic olefin-based resin include resins disclosed in JP1989-240517A (JP-H01-240517A), JP 1991-14882A (JP-H03-14882A), JP1991-122137A (JP-H03-122137A), and the like. Specific examples of the cyclic olefin-based resin include a ring-opening (co)polymer of cyclic olefin, an addition polymer of cyclic olefin, α-olefin and a copolymer thereof such as cyclic olefin and ethylene, propylene, or the like (representatively, a random copolymer), a graft polymer in which these materials are modified with an unsaturated carboxylic acid or a derivative thereof, a hydride thereof, and the like. Specific examples of the cyclic olefin include a norbornene-based monomer.

Various products have been commercially available as the cyclic polyolefin resin. Specific examples of the cyclic polyolefin resin include product names of "Zeonex" and "Zeonor" manufactured by Zeon Corporation, a product name of "Arton" manufactured by manufactured by JSR Corporation, a product name of "Topas" manufactured by Celanese Corporation, and a product name of "APEL" manufactured by Mitsui Chemicals, Inc.

An arbitrarily suitable (meth)acrylic resin is able to be adopted as the (meth)acrylic resin, within a range not impairing the effect of the present invention. Examples of the (meth)acrylic resin include poly(meth)acrylic ester such as polymethyl methacrylate, a methyl methacrylate-(meth) acrylic acid copolymer, a methyl methacrylate-(meth)acrylic ester copolymer, a methyl methacrylate-acrylic ester-(meth) acrylic acid copolymer, a methyl (meth)acrylate-styrene copolymer (an MS resin or the like), and a polymer having an alicyclic hydrocarbon group (for example, methyl methacrylate-cyclohexyl methacrylic acid copolymer, a methyl methacrylate-norbornyl (meth)acrylic acid copolymer, and the like). Preferably, examples of the (meth)acrylic resin include an C1-6 polyalkyl (meth)acrylate such as polymethyl (meth)acrylate. More preferably, examples of the (meth)acrylic resin include a methyl methacrylate-based resin in which methyl methacrylate is a main component (50 mass % to 100 mass %, and preferably 70 mass % to 100 mass %).

Specific examples of the (meth)acrylic resin include Acrypet VH and Acrypet VRL20A manufactured by Mitsubishi Rayon Co., Ltd., a (meth)acrylic resin having a ring structure in the molecule which is disclosed in JP2004-70296A, and a (meth)acrylic resin having high Tg obtained by a cross-linkage in the molecule or a cyclization reaction in the molecule.

A (meth)acrylic resin having a lactone ring structure is able to be used as the (meth)acrylic resin. This is because the (meth)acrylic resin has high heat resistance, high transparency, and high mechanical strength due to biaxial stretching.

The thickness of the protective film is able to be suitably set, and is generally approximately 1 μm to 200 μm from a viewpoint of workability such as strength or handling, thin layer properties, and the like. In particular, the thickness of the protective film is preferably 1 μm to 100 μm, and is more preferably 5 μm to 80 μm. It is particularly preferable that the thickness of the protective film is 5 μm to 40 μm.

Re(λ) and Rth(λ) respectively indicate in-plane retardation and retardation in a thickness direction at a wavelength of λ. Re(λ) is measured by allowing light having a wavelength of λ nm to be incident in a film normal direction using KOBRA 21ADH or WR (manufactured by Oji Scientific Instruments). In selection of a measurement wavelength of λ nm, a wavelength selective filter is manually exchanged or a measurement value is converted by using a program or the like, and thus the measurement is able to be performed. When a film to be measured is denoted by monoaxial or biaxial refractive index ellipsoid, Rth(λ) is calculated by the following method. Furthermore, a part of this measurement method is used in measurement of an average tilt angle of a discotic liquid crystal molecule on an alignment film side in an optical anisotropic layer described below and an average tilt angle on a side opposite to the alignment film side.

In Rth(λ), Re(λ) described above is measured at total 6 points by allowing light having a wavelength of λ nm to be incident from directions respectively inclined in 10° step from a normal direction to 50° on one side with respect to a film normal direction in which an in-plane slow axis (determined by KOBRA 21ADH or WR) is used as an inclination axis (a rotational axis) (when there is no slow axis, an arbitrary direction of a film plane is used as the rotational axis), and KOBRA 21ADH or WR is calculated on the basis of the measured retardation value, an assumed value of the average refractive index, and the input film thickness value. In the above description, in a case of a film having a direction in which a retardation value at a certain inclination angle is zero by using the in-plane slow axis as the rotational axis from the normal direction, a retardation value at an inclination angle greater than the inclination angle described above is changed to have a negative sign, and then KOBRA 21ADH or WR is calculated. Furthermore, a retardation value is measured from two arbitrarily inclined directions by using the slow axis as the inclination axis (the rotational axis) (when there is no slow axis, an arbitrary direction of the film plane is used as the rotational axis), and Rth is able to be calculated by Expression (A) and Expression (B) described below on the basis of the retardation value, an assumed value of the average refractive index, and the input film thickness value.

$$Re(\theta) = \left[ nx - \frac{ny \times nz}{\sqrt{\left(ny \sin\left(\sin^{-1}\left(\frac{\sin(-\theta)}{nx}\right)\right)\right)^2 + \left(nz \cos\left(\sin^{-1}\left(\frac{\sin(-\theta)}{nx}\right)\right)\right)^2}} \right] \times \frac{d}{\cos\left(\sin^{-1}\left(\frac{\sin(-\theta)}{nx}\right)\right)} \quad \text{Expression (A)}$$

Furthermore, Re(θ) described above indicates a retardation value in a direction inclined by an angle of θ from the normal direction. In addition, in Expression (A), nx represents a refractive index in the slow axis direction in the plane, ny represents a refractive index in a direction orthogonal to nx in the plane, and nz represents a refractive index in a direction orthogonal to nx and ny. d is a film thickness.

$$Rth=((nx+ny)/2-nz) \times d \quad \text{Expression (B)}$$

When the measured film is a so-called film not having an optic axis which is not able to be denoted by a monoaxial or biaxial refractive index ellipsoid, Rth(λ) is calculated by the following method. In Rth(λ), Re(λ) described above is measured at 11 points by allowing light having a wavelength of λ nm to be incident from directions respectively inclined in 10° step from −50° to +50° with respect to the film normal direction in which the in-plane slow axis (determined by KOBRA 21ADH or WR) is used as the inclination axis (the rotational axis), and KOBRA 21ADH or WR is calculated on the basis of the measured retardation value, an assumed value of the average refractive index, and the input film thickness value. In addition, in the measurement described above, a catalog value of various optical films in a polymer handbook (JOHN WILEY & SONS, INC) is able to be used as the assumed value of the average refractive index. When the value of the average refractive index is not known in advance, the value of the average refractive index is able to be measured by using an Abbe's refractometer. The value of the average refractive index of a main optical film will be exemplified as follows: cellulose acylate (1.48), a cycloolefin polymer (1.52), polycarbonate (1.59), polymethyl methacrylate (1.49), and polystyrene (1.59). The assumed values of the average refractive index and the film thickness are input, and thus nx, ny, and nz are calculated by KOBRA 21ADH or WR. Nz=(nx−nz)/(nx−ny) is further calculated by the calculated nx, ny, and nz.

Furthermore, herein, "visible light" indicates light at 380 nm to 780 nm. In addition, herein, the measurement wavelength is 550 nm unless otherwise specified.

In addition, herein, angles (for example, angles such as "90°") and a relationship thereof (for example, "orthogonal", "parallel", and "intersecting at 45°", and the like) are in a range of an error which is allowable in a technical field of the present invention. For example, the angle indicates that the angle is in a range of less than ±10° from an exact angle, and an error from the exact angle is preferably less than or equal to 5°, and is more preferably less than or equal to 3°.

Herein, the "slow axis" of the retardation film or the like indicates a direction in which the refractive index is maximized.

In addition, herein, a numerical value, a numerical range, and quantitative expression (for example, the expression such as "equal" and "identical") indicating optical properties of each member such as a phase difference region, a retardation film, and a liquid crystal layer are interpreted as a numerical value, a numerical range, and properties including an error which is generally allowable in a liquid crystal display device or members used therein.

In addition, herein, a "front surface" indicates the normal direction with respect to a display surface, and "front contrast (CR)" indicates contrast calculated from white brightness and black brightness which are measured in the normal direction of the display surface, and "view angle contrast (CR)" indicates contrast calculated from white brightness and black brightness which are measured in a direction inclined from the normal direction of the display surface (for example, a direction defined by 60° in a polar angle direction with respect to the display surface).

(Adhesive Layer)

In order to bond the polarizer (A) to the protective film, an adhesive agent, an adhesive agent, and the like are able to be suitably adopted according to the polarizer (A) and the protective film. This adhesive agent and an adhesion treatment method are not particularly limited, and for example, the adhesion treatment method is able to be performed through an adhesive agent formed of a vinyl polymer, an adhesive agent formed of a water-soluble cross-linking agent of a vinyl alcohol-based polymer such as at least a boric acid or borax, glutaraldehyde or melamine, and an oxalic acid. The adhesive layer formed of such an adhesive agent is able to be formed as a coated and dried layer of an aqueous solution, and when this aqueous solution is prepared, as necessary, a cross-linking agent or other additives, and a catalyst such as an acid are able to be mixed. In particular, when a polyvinyl alcohol-based polymer film is used as the polarizer (A), it is preferable that an adhesive agent containing a polyvinyl alcohol-based resin is used from a viewpoint of adhesiveness. Further, it is more preferable that an adhesive agent containing a polyvinyl alcohol-based resin having an acetoacetyl group is used from a viewpoint of improving durability.

The polyvinyl alcohol-based resin described above is not particularly limited, and the average degree of polymerization is approximately 100 to 3,000, and the average degree of saponification is preferably 85 mol % to 100 mol %, from a viewpoint of adhesiveness. In addition, the concentration of the adhesive agent aqueous solution is not particularly limited, and the concentration of the adhesive agent aqueous solution is preferably 0.1 mass % to 15 mass %, and is more preferably 0.5 mass % to 10 mass %. The thickness of the adhesive layer described above is preferably approximately 30 nm to 1,000 nm, and is more preferably 50 nm to 300 nm, in the thickness after drying. When the thickness is excessively thin, an adhesion force becomes insufficient, and when the thickness is excessively thick, a problem is more likely to occur in the appearance.

An ultraviolet curable resin or a thermosetting resin such as a (meth)acrylic resin, an urethane-based resin, an acryl urethane-based resin, an epoxy-based resin, and a silicone-based resin is able to be used as the other adhesive agent.

<Brightness Enhancement Film>

In the first aspect of the optical sheet member of the present invention, the brightness enhancement film described above has a reflection center wavelength in a wavelength range of 400 nm to 500 nm (preferably in a wavelength range of 430 nm to 480 nm) and a peak of reflectivity having a half-value width of less than or equal to 100 nm.

In the second aspect of the optical sheet member of the present invention, the brightness enhancement film described above has a reflection center wavelength in a wavelength range of 300 nm to 430 nm and a peak of reflectivity having a half-value width of less than or equal to 100 nm.

According to the brightness enhancement film having such a configuration, light in a first polarization state is able to be substantially reflected by a reflection polarizer, and light in a second polarization state is able to be substantially transmitted through the reflection polarizer described above, and the light in the first polarization state which is substantially reflected by the reflection polarizer is recirculated in a random direction and a random polarization state by a reflection member described below (such as a light guide device and an optical resonator), and thus brightness of an image display device is able to be improved.

In the optical sheet member of the present invention, the film thickness of the brightness enhancement film itself is preferably 1 μm to 30 μm, is more preferably 1 μm to 10 μm, and is particularly preferably 1 μm to 9 μm, from a viewpoint of a demand for thinning recent portable devices.

The following aspect (i) or (ii) is preferable as the brightness enhancement film described above in each of the first aspect of the optical sheet member of the present invention and the second aspect of the optical sheet member of the present invention.

Aspect (i) of the first aspect of the optical sheet member of the present invention: It is preferable that the reflection polarizer (B) includes the light reflecting layer which has a reflection center wavelength in a wavelength range of 400 nm to 500 nm (preferably, in a wavelength range of 430 nm to 480 nm) and a peak of reflectivity having a half-value width of less than or equal to 100 nm, and is formed by fixing a cholesteric liquid crystalline phase, and the brightness enhancement film includes the λ/4 plate (C) between the optical conversion member (D) and the reflection polarizer (B) in which at least one of Expressions (1) and (2) described below is satisfied. Further, the wavelength dispersion of the λ/4 plate (C) may be a forward dispersion "Re(450)>Re(550)", and as the wavelength dispersion of the λ/4 plate (C), a flat dispersion "Re(450)≅Re(550)" is able to be preferably used, and a reverse dispersion "Re(450)<Re(550)" is able to be more preferably used.

$$450\ nm/4-60\ nm < Re(450) < 450\ nm/4+60\ nm \qquad \text{Expression (1)}$$

(In Expression (1), Re(λ) represents retardation in an in-plane direction at a wavelength of % nm (unit: nm).)

Aspect (ii) of the first aspect of the optical sheet member of the present invention: The reflection polarizer (B) is the dielectric multilayer film which has a reflection center wavelength in a wavelength range of 400 nm to 500 nm (preferably, in a wavelength range of 430 nm to 480 nm) and a peak of reflectivity having a half-value width of less than or equal to 100 nm.

Aspect (i) of the second aspect of the optical sheet member of the present invention: It is preferable that the reflection polarizer (B) includes the light reflecting layer which has a reflection center wavelength in a wavelength range of 300 nm to 430 nm and a peak of reflectivity having a half-value width of less than or equal to 100 nm, and is formed by fixing a cholesteric liquid crystalline phase, and the brightness enhancement film includes the λ/4 plate (C) between the optical conversion member (D) and the reflection polarizer (B) in which Expression (2) described below is satisfied. Further, the wavelength dispersion of the λ/4 plate (C) may be a forward dispersion "Re(380)>Re(450)", and as the wavelength dispersion of the λ/4 plate (C), a flat dispersion "Re(380)≅Re(450)" is able to be preferably used, and a reverse dispersion "Re(380)<Re(450)" is able to be more preferably used.

$$380\ nm/4-60\ nm < Re(380) < 380\ nm/4+60\ nm \qquad \text{Expression (2)}$$

(In Expression (2), Re(λ) represents retardation in an in-plane direction at a wavelength of λ nm (unit: nm).)

Aspect (ii) of the second aspect of the optical sheet member of the present invention: It is preferable that the reflection polarizer (B) is the dielectric multilayer film which has a reflection center wavelength in a wavelength range of 300 nm to 430 nm and a peak of reflectivity having a half-value width of less than or equal to 100 nm.

In FIG. 1 to FIG. 10, specific examples of the aspect (i) are illustrated in FIG. 1 to FIG. 5, and specific examples of the aspect (ii) are illustrated in FIG. 6 to FIG. 10.

First, the aspect (i) will be described.

The light reflecting layer formed by fixing a cholesteric liquid crystalline phase is able to reflect at least one of right circular polarization light and left circular polarization light in a wavelength range in the vicinity of the reflection center wavelength thereof. In addition, the λ/4 plate is able to convert light having a wavelength of λ nm into linear polarization light from circular polarization light. According to the brightness enhancement film having a configuration such as the aspect (i), light in the first polarization state (for example, the right circular polarization light) is substantially reflected by the reflection polarizer, whereas light in the second polarization state (for example, the left circular polarization light) is substantially transmitted through the reflection polarizer described above, and the light in the second polarization state (for example, the left circular polarization light) which is transmitted through the reflection polarizer described above is converted into the linear polarization light by the λ/4 plate (C) in which Expression (1) is satisfied or the λ/4 plate (C) in which Expression (2) is satisfied and is able to be substantially transmitted through the polarizer (a linear polarizer) of the polarizing plate described above.

In the aspect (i), it is preferable that the reflection polarizer (B) described above includes only one light reflecting layer formed by fixing a cholesteric liquid crystalline phase, that is, it is preferable that the reflection polarizer (B) described above does not include other layers formed by fixing a cholesteric liquid crystalline phase, from a viewpoint of thinning the film thickness of the brightness enhancement film described above.

In FIG. 1 to FIG. 4, aspects are illustrated in which a light reflecting layer 14B formed by fixing a cholesteric liquid crystalline phase is laminated on a λ/4 plate 12 in which Expression (1) is satisfied through the adhesive layer 20. In FIG. 5, an aspect is illustrated in which a light reflecting layer 14UV formed by fixing a cholesteric liquid crystalline phase is laminated on the λ/4 plate 12 in which Expression (2) is satisfied through the adhesive layer 20. However, the present invention is not limited by such specific examples, the light reflecting layer 14B may be in direct contact with the λ/4 plate 12 in which Expression (1) is satisfied, and the light reflecting layer 14UV may be in direct contact with the λ/4 plate 12 in which Expression (2) is satisfied. In addition, the λ/4 plate 12 in which Expression (1) is satisfied and the λ/4 plate 12 in which Expression (2) is satisfied may be a single layer or may be a laminated body of two or more layers, and it is more preferable that the λ/4 plate 12 is the laminated body of two or more layers from a viewpoint of controlling the wavelength dispersion of birefringence.

The direction of the linear polarization light which is transmitted through the λ/4 plate used in the present invention is laminated to be parallel to a transmission axis direction of the backlight side polarizing plate.

When the λ/4 plate is the single layer, an angle between the slow axis direction of the λ/4 plate and the absorption axis direction of the polarizing plate is 30° to 60°, is preferably 35° to 55°, is more preferably 40° to 50°, and is particularly preferably 45°.

In addition, the spiral structure of the cholesteric liquid crystalline phase and the polarization state of the light are variously defined, and in the present invention, when the light is sequentially transmitted through the light reflecting layer formed by fixing a cholesteric liquid crystalline phase, the λ/4 plate layer, and the polarizing plate layer, an arrangement is preferable in which brightness is maximized.

Figure 12:
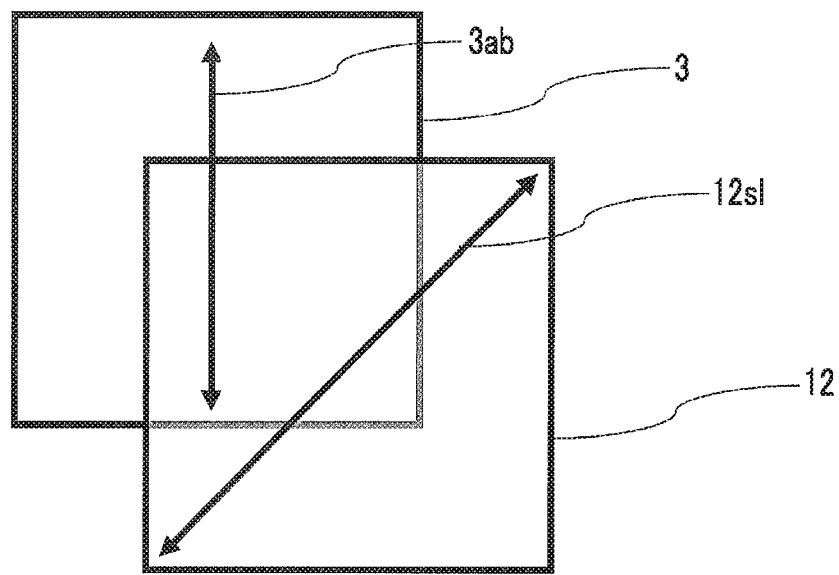
FIG. 12 is a schematic view illustrating a preferred relationship between an absorption axis direction of a backlight side polarizer and a slow axis direction of a λ/4 plate when a spiral structure of a layer formed by fixing a cholesteric liquid crystal is a right spiral.
Figure 13:
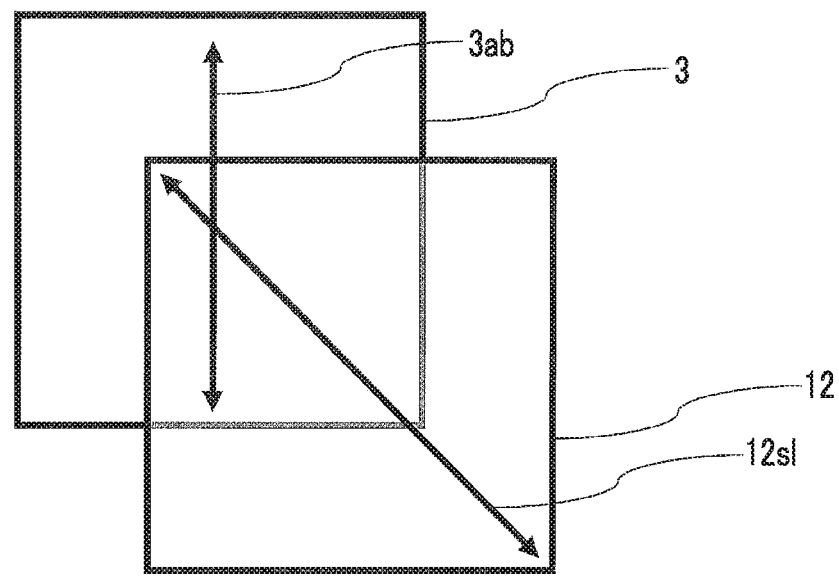
FIG. 13 is a schematic view illustrating a preferred relationship between an absorption axis direction of a backlight side polarizer and a slow axis direction of a λ/4 plate when a spiral structure of a layer formed by fixing a cholesteric liquid crystal is a left spiral.

Accordingly, when the direction of the spiral structure of the light reflecting layer formed by fixing a cholesteric liquid crystalline phase is a right spiral (the light reflecting layer formed by fixing a cholesteric liquid crystalline phase in which a right chiral material described in an example herein is used), it is necessary that light exited from the light reflecting layer formed by fixing a cholesteric liquid crystalline phase is coincident with a transmission axis of the backlight side polarizing plate. For this reason, when the direction of the spiral structure of the light reflecting layer formed by fixing a cholesteric liquid crystalline phase is a right spiral in the example herein, as illustrated in FIG. 12, it is necessary that a slow axis direction 12sl of the λ/4 plate has the angle described above in a clockwise direction from an absorption axis direction 3ab of the polarizer when seen from the backlight side. On the other hand, when the direction of the spiral structure of the light reflecting layer formed by fixing a cholesteric liquid crystalline phase is a left spiral, as illustrated in FIG. 13, it is necessary that the slow axis direction 12sl of the λ/4 plate has the angle described above in the clockwise direction from the absorption axis direction 3ab of the polarizer when seen from the backlight side.

The light reflecting layer 14B has a reflection center wavelength in a wavelength range of 430 nm to 480 nm and a peak of reflectivity having a half-value width of less than or equal to 100 nm.

It is preferable that the reflection center wavelength of the light reflecting layer 14B is in a wavelength range of 430 nm to 470 nm.

The half-value width of the peak of the reflectivity of the light reflecting layer 14B is preferably less than or equal to 100 nm, is more preferably less than or equal to 80 nm, and is particularly preferably less than or equal to 70 nm.

The light reflecting layer 14UV has a reflection center wavelength in a wavelength range of 300 nm to 430 nm and a peak of reflectivity having a half-value width of less than or equal to 100 nm.

It is preferable that the reflection center wavelength of the light reflecting layer 14UV is in a wavelength range of 300 nm to 380 nm.

The half-value width of the peak of the reflectivity of the light reflecting layer 14UV is preferably less than or equal to 100 nm, is more preferably less than or equal to 80 nm, and is particularly preferably less than or equal to 70 nm.

The wavelength applying a peak is able to be adjusted by changing the pitch or the refractive index of the cholesteric liquid crystal layer, and the pitch is able to be easily adjusted by changing an added amount of a chiral agent. Specifically, the details are described in Fuji Film Research & Development No. 50 (2005) pp. 60-63.

The chiral agent described above is able to be selected from various known chiral agents (for example, disclosed in Liquid Crystal Device Handbook, Chapter 3, Section 4-3, Chiral Agent for TN and STN, Page 199, Japan Society for the Promotion of Science, Edited by First 42 Committee, 1989). In general, the chiral agent contains an asymmetric carbon atom, but an axial asymmetric compound or a planar asymmetric compound which does not contain an asymmetric carbon atom is also able to be used as the chiral agent. In an example of the axial asymmetric compound or a planar asymmetric compound, binaphthyl, helicene, paracyclophane, and a derivative thereof are included. The chiral agent may have a polymerizable group. When the chiral agent has a polymerizable group and a rod-like liquid crystal compound which is used together also has a polymerizable group, it is possible to form a polymer having a repeating unit derived from the rod-like liquid crystal compound and a repeating unit derived from the chiral agent by a polymerization reaction between the chiral agent having a polymerizable group and the polymerizable rod-like liquid crystal compound. In this aspect, it is preferable that the polymerizable group of the chiral agent having a polymerizable group is the same polymerizable group as that of the polymerizable rod-like liquid crystal compound. Accordingly, the polymerizable group of the chiral agent is preferably an unsaturated polymerizable group, an epoxy group, or an aziridinyl group, is more preferably the unsaturated polymerizable group, and is particularly preferably an ethylenically unsaturated polymerizable group.

In addition, the chiral agent described above may be a liquid crystal compound.

Examples of the chiral agent exhibiting strong twisting force include chiral agents disclosed in JP2010-181852A, JP2003-287623A, JP2002-80851A, JP2002-80478A, and JP2002-302487A, and are able to be preferably used in the present invention. Further, as isosorbide compounds disclosed in these publications, isomannide compounds having a corresponding structure are able to be used, and as isomannide compounds disclosed in these publications, isosorbide compounds having a corresponding structure are able to be used.

A manufacturing method of the light reflecting layer formed by fixing the cholesteric liquid crystalline phase which is used in the aspect (i) is not particularly limited, and for example, methods disclosed in JP1989-133003A (JP-H01-133003A), JP3416302B, JP3363565B, and JP1996-271731A (JP-H08-271731A) are able to be used as the manufacturing method of the light reflecting layer, and the contents of these publications are incorporated in the present invention.

Hereinafter, a method disclosed in JP1996-271731A (JP-H08-271731A) will be described.

When the cholesteric liquid crystal layer described above is superimposed, it is preferable that a combination in which the circular polarization light in the same direction is reflected is used. Accordingly, it is possible to prevent a phase state of the circular polarization light which is reflected on each layer from being aligned in a different polarization state in each wavelength region, and thus it is possible to increase utilization efficiency of light.

The cholesteric liquid crystal is a layer formed by fixing this liquid crystal compound due to polymerization or the like, and it is not necessary that the cholesteric liquid crystal exhibits liquid crystalline properties after the layer is formed. The polymerizable liquid crystal compound may be a multifunctional polymerizable liquid crystal or a monofunctional polymerizable liquid crystal compound. In addition, the liquid crystal compound may be a discotic liquid crystal compound described below or a rod-like liquid crystal compound.

—Rod-Like Liquid Crystal Compound—

Azomethines, azoxys, cyanobiphenyls, cyanophenyl esters, benzoic esters, phenyl cyclohexane carboxylic esters, cyanophenyl cyclohexanes, cyano-substituted phenyl pyrimidines, alkoxy-substituted phenyl pyrimidines, phenyl dioxanes, trans, and alkenyl cyclohexyl benzonitriles are preferably used as the rod-like liquid crystal compound. Not only low molecular weight liquid crystal molecules as described above but also high molecular weight liquid crystal molecules are able to be used as the rod-like liquid crystal compound.

It is preferable that alignment is fixed by polymerizing the rod-like liquid crystal compound, and compounds disclosed in Makromol. Chem., Vol. 190, Page 2255 (1989), Advanced Materials, Vol. 5, Page 107 (1993), U.S. Pat. Nos. 4,683, 327A, 5,622,648A, 5,770,107A, WO95/22586A, WO95/24455A, WO97/00600A, WO98/23580A, WO98/52905A, JP1989-272551A (JP-H01-272551A), JP1994-16616A (JP-H06-16616A), JP1995-110469A (JP-H07-110469A), JP1999-80081A (JP-H11-80081A), JP2001-64627, and the like are able to be used as the polymerizable rod-like liquid crystal compound. Further, for example, compounds disclosed in JP1999-513019A (JP-H11-513019A) or JP2007-279688A are also able to be preferably used as the rod-like liquid crystal compound.

—Disk-Like Liquid Crystal Compound—

Hereinafter, the light reflecting layer formed by fixing a cholesteric liquid crystalline phase in which a disk-like liquid crystal compound is used as a cholesteric liquid crystal material will be described.

For example, compounds disclosed in JP2007-108732A or JP2010-244038A are able to be preferably used as the disk-like liquid crystal compound, but the present invention is not limited thereto.

Hereinafter, preferred examples of the disk-like liquid crystal compound will be described, but the present invention is not limited thereto.

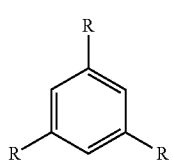

Compound 1

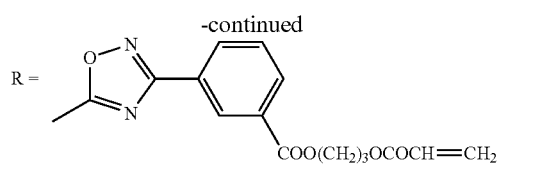

Compound 2

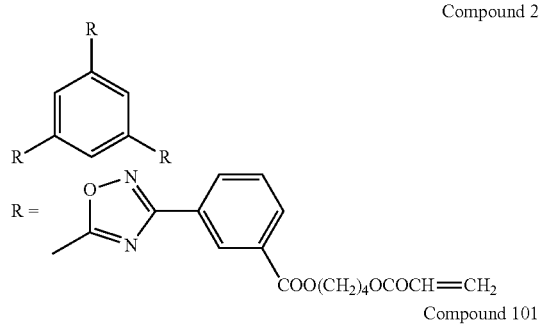

Compound 101

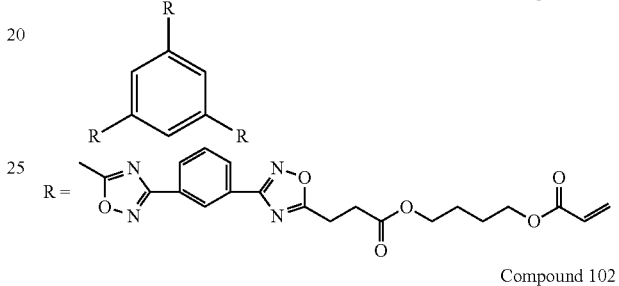

Compound 102

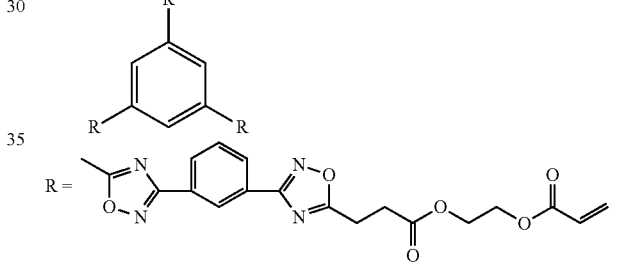

—Other Component—

The compositions used for forming the light reflecting layer formed by fixing a cholesteric liquid crystalline phase may contain other components such as a chiral agent, an alignment control agent, a polymerization initiator, and an alignment aid in addition to the cholesteric liquid crystal material.

Examples of the alignment control agent described above include a compound exemplified in "0092" and "0093" of JP2005-99248A, a compound exemplified in "0076" to "0078" and "0082" to "0085" of JP2002-129162A, a compound exemplified in "0094" and "0095" of JP2005-99248A, and a compound exemplified "0096" of JP2005-99248A.

A compound denoted by General Formula (1) described below is preferable as the fluorine-based alignment control agent.

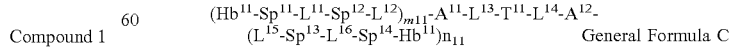

General Formula C

In General Formula (I), $L^{11}$, $L^{12}$, $L^{13}$, $L^{14}$, $L^{15}$, and $L^{16}$ each independently represent a single bond, —O—, —S—, —CO—, —COO—, —OCO—, —COS—, —SCO—, —NRCO—, and —CONR— (in General Formula (I), R represents a hydrogen atom or an alkyl group having 1 to 6 carbon atoms), —NRCO— and —CONR— has an effect of reducing solubility, —O—, —S—, —CO—, —COO—, —OCO—, —COS—, and —SCO— are more preferable from a viewpoint of the tendency of increasing a haze value at the time of forming a film, and —O—, —CO—, —COO—, and —OCO— are even more preferable from a viewpoint of stability of the compound. The alkyl group which is able to be included in R may be straight chained alkyl group or a branched alkyl group. The number of carbon atoms is preferably 1 to 3, and a methyl group, an ethyl group, and an n-propyl group are able to be exemplified as the alkyl group.

Examples of the photopolymerization initiator include an α-carbonyl compound (disclosed in each of the specification of U.S. Pat. Nos. 2,367,661A and 2,367,670A), acyloin ether (disclosed in the specification of U.S. Pat. No. 2,448,828A), an α-hydrocarbon substituted aromatic acyloin compound (disclosed in the specification of U.S. Pat. No. 2,722,512A), a polynuclear quinone compound (disclosed in the specification of U.S. Pat. Nos. 3,046,127A and 2,951,758A), a combination of a triaryl imidazole dimer and p-aminophenyl ketone (disclosed in the specification of U.S. Pat. No. 3,549,367A), an acridine compound and a phenazine compound (disclosed in the publication of JP1985-105667A (JP-S60-105667A) and in the specification of U.S. Pat. No. 4,239,850A), an oxadiazole compound (disclosed in the specification of U.S. Pat. No. 4,212,970A), and an acyl phosphine oxide compound (disclosed in the publication of JP1988-40799B (JP-S63-40799B), JP1993-29234B (JP-H05-29234B), JP1998-95788A (JP-H10-95788A), and JP1998-29997A (JP-H10-29997A), and the like.

Solvent:

An organic solvent is preferably used as a solvent of the composition for forming each of the light reflecting layers. Examples of the organic solvent include amide (for example, N,N-dimethyl formamide), sulfoxide (for example, dimethyl sulfoxide), a heterocyclic compound (for example, pyridine), hydrocarbon (for example, benzene and hexane), alkyl halide (for example, chloroform and dichloromethane), ester (for example, methyl acetate and butyl acetate), ketone (for example, acetone, methyl ethyl ketone, and cyclohexanone), and ether (for example, tetrahydrofuran, and 1,2-dimethoxy ethane). Among them, the alkyl halide and the ketone are preferable. Two or more types of the organic solvents may be used together.

In addition, a suitable cholesteric liquid crystal may be used as the cholesteric liquid crystal, but is not particularly limited, and a liquid crystal polymer is also able to be used as the cholesteric liquid crystal. In addition, it is preferable that the wavelength region of selective reflection is widened as the birefringence of the cholesteric liquid crystal molecule becomes larger.

In this viewpoint, a high Δn liquid crystal material disclosed in paragraphs of "0153" to "0171" of JP2011-510915A is able to be used.

A suitable liquid crystal polymer, for example, a main chain type liquid crystal polymer such as polyester, a side chain type liquid crystal polymer formed of an acrylic main chain or a methacrylic main chain, a siloxane main chain, and the like, a nematic liquid crystal polymer containing a low molecular chiral agent, a liquid crystal polymer introduced with a chiral component, a nematic-based and cholesteric-based mixed liquid crystal polymer, and the like are used as the liquid crystal polymer described above. It is preferable that a glass transition temperature is 30° C. to 150° C. from a viewpoint of handleability.

The cholesteric liquid crystal layer is able to be formed by using a suitable method such as a method of directly coating a polarization separating plate through a suitable alignment film such as an oblique vapor deposition layer of polyimide or polyvinyl alcohol, and SiO, as necessary, a method of coating a support body which does not deteriorate at an alignment temperature of a liquid crystal polymer formed of a transparent film or the like through an alignment film, as necessary. A support body having a phase difference as small as possible is preferably used as the support body from a viewpoint of preventing a change in a polarization state. In addition, a superimposition method of the cholesteric liquid crystal layer through the alignment film, and the like are able to be adopted.

Furthermore, the liquid crystal polymer is able to be coated with a liquid material such as a solution of a solvent or a melting liquid due to heating by using a suitable method such as a roll coating method or a gravure printing method, and a spin coating method.

The polymerization reaction includes a thermal polymerization reaction using a thermal polymerization initiator and a photopolymerization reaction using a photopolymerization initiator. Among them, the photopolymerization reaction is preferable. It is preferable that an ultraviolet ray is used in light irradiation for polymerizing the liquid crystal molecule. Irradiation energy is preferably 20 mJ/cm$^2$ to 50 J/cm$^2$, and is more preferably 100 mJ/cm$^2$ to 800 mJ/cm$^2$. In order to accelerate the photopolymerization reaction, the light irradiation may be performed in heating conditions. The thickness of the light reflecting layer formed by fixing a cholesteric liquid crystalline phase to be formed is preferably 0.1 μm to 100 μm, is more preferably 0.5 μm to 50 μm, is even more preferably 1 μm to 30 μm, and is most preferably 2 μm to 20 μm, from a viewpoint of preventing selective reflectivity, alignment disorder, and a decrease in transmittance.

When each of the light reflecting layers of the brightness enhancement film of the present invention is formed by coating, it is preferable that each of the light reflecting layers is formed by drying and solidifying a coating liquid by using a known method after the coating with the coating liquid described above. Drying by heating is preferable as a drying method.

In the aspect (i) of the first aspect of the optical sheet member of the present invention, the brightness enhancement film includes the λ/4 plate (C) between the optical conversion member (D) and the reflection polarizer (B) in which Expression (1) described below is satisfied. Further, the wavelength dispersion of the λ/4 plate (C) may be a forward dispersion "Re(450)>Re(550)", and as the wavelength dispersion of the λ/4 plate (C), a flat dispersion "Re(450)≅Re(550)" is able to be preferably used, and a reverse dispersion "Re(450)<Re(550)" is able to be more preferably used.

$$450 \text{ nm}/4 - 60 \text{ nm} < Re(450) < 450 \text{ nm}/4 + 60 \text{ nm} \quad \text{Expression (1)}$$

(In Expression (1), Re(λ) represents retardation (unit: nm) in an in-plane direction at a wavelength of λ nm.)

It is more preferable that Expression (1') described below is satisfied in the λ/4 plate (C) in which Expression (1) described above is satisfied.

$$450 \text{ nm}/4 - 25 \text{ nm} < Re(450) < 450 \text{ nm}/4 + 25 \text{ nm} \quad \text{Expression (1')}$$

It is particularly preferable that Expression (1″) described below is satisfied in the λ/4 plate (C) in which Expression (1) described above is satisfied.

$$450 \text{ nm}/4 - 15 \text{ nm} < Re(450) < 450 \text{ nm}/4 + 15 \text{ nm} \quad \text{Expression (1″)}$$

In the aspect (i) of the second aspect of the optical sheet member of the present invention, the brightness enhancement film includes the λ/4 plate (C) between the optical conversion member (D) and the reflection polarizer (B) in which Expression (2) described below is satisfied. Further, the wavelength dispersion of the λ/4 plate (C) may be a forward dispersion "Re(380)>Re(450)", and as the wavelength dispersion of the λ/4 plate (C), a flat dispersion "Re(380)≅Re(450)" is able to be preferably used, and a reverse dispersion "Re(380)<Re(450)" is able to be more preferably used.

$$380 \text{ nm}/4-60 \text{ nm} < Re(380) < 380 \text{ nm}/4+60 \text{ nm} \quad \text{Expression (2)}$$

(In Expression (2), Re(λ) represents retardation (unit: nm) in an in-plane direction at a wavelength of λ nm.)

It is more preferable that Expression (2') described below is satisfied in the λ/4 plate (C) in which Expression (2) described above is satisfied.

$$380 \text{ nm}/4-25 \text{ nm} < Re(380) < 380 \text{ nm}/4+25 \text{ nm} \quad \text{Expression (2')}$$

It is particularly preferable that Expression (2") described below is satisfied in the λ/4 plate (C) in which Expression (2) described above is satisfied.

$$380 \text{ nm}/4-15 \text{ nm} < Re(380) < 380 \text{ nm}/4+15 \text{ nm} \quad \text{Expression (2")}$$

A manufacturing method of the λ/4 plate (C) in which Expression (1) is satisfied and the λ/4 plate in which Expression (2) is satisfied, which are used in the aspect (i) is not particularly limited, and for example, a method disclosed in JP1996-271731A (JP-H08-271731A) is able to be used as the manufacturing method, and the contents of this publication are incorporated in the present invention.

Hereinafter, the method disclosed in JP1996-271731A (JP-H08-271731A) will be described.

Examples of a ¼ wavelength plate formed of a superimposed body of the retardation film include a ¼ wavelength plate formed by combining a retardation film applying a phase difference of a ½ wavelength with respect to monochromatic light and a retardation film applying a phase difference of a ¼ wavelength with respect to monochromatic light, and by laminating the retardation films such that optical axes of a plurality of retardation films intersect with each other.

In such a case, the plurality of retardation films applying the phase difference of the ½ wavelength or the ¼ wavelength with respect to the monochromatic light are laminated such that the optical axes intersect with each other, and thus a wavelength dispersion of retardation which is defined by the product (Δnd) of a refractive index difference (Δn) and a thickness (d) of birefringence light is able to be superimposed or adjusted, and is able to be arbitrarily controlled, the wavelength dispersion is suppressed while controlling the entire phase difference to the ¼ wavelength, and thus a wavelength plate indicating a phase difference of a ¼ wavelength over a wide wavelength region is able to be obtained.

In the above description, the number of laminations of the retardation film is an arbitrary number. Two to five retardation films are generally laminated from a viewpoint of transmittance of light or the like. In addition, the arrangement position of the retardation film applying the phase difference of the ½ wavelength and the retardation film applying the phase difference of the ¼ wavelength is also arbitrary.

In addition, when retardation of light having a wavelength of 450 nm is set to $R_{450}$, and retardation of light having a wavelength of 550 nm is set to $R_{550}$, a ¼ wavelength plate formed of a superposed body of retardation films is able to be obtained by laminating a retardation film having large retardation at $R_{450}/R_{550}$ of 1.00 to 1.05 and a retardation film having small retardation at $R_{450}/R_{550}$ of 1.05 to 1.20 such that optical axes thereof intersect with each other.

In such a case, the retardation films having different retardations are laminated such that the optical axes intersect with each other, in particular, are orthogonal to each other, and thus the wavelength dispersion of the retardation of each of the retardation films is able to be superimposed or adjusted, and is able to be controlled, and in particular, the retardation is able to be reduced towards a short wavelength side.

In addition, specific examples of the ¼ wavelength plate described above include a ¼ wavelength plate which is formed by laminating a retardation film (retardation of light having a wavelength of 550 nm: 700 nm) formed by performing a stretching treatment with respect to a polyvinyl alcohol film and a retardation film (retardation of light having a wavelength of 550 nm: 560 nm) formed by performing a stretching treatment with respect to a polycarbonate film such that the optical axes thereof are orthogonal to each other. Such a lamination approximately functions as the ¼ wavelength plate over a wavelength of 450 nm to 650 nm.

The λ/4 plate may be an optical anisotropic support body having a desired λ/4 function in the support body itself, or may include an optical anisotropic layer or the like on a support body formed of a polymer film.

When the λ/4 plate is the optical anisotropic support body having a desired λ/4 function in the support body itself, for example, the optical anisotropic support body is able to be obtained by a method in which a polymer film is monoaxially or biaxially stretched. The type of the polymer is not particularly limited, and a polymer having excellent transparency is preferably used. Examples of the polymer include the materials used in the λ/4 plate described above, a cellulose acylate film (for example, a cellulose triacetate film (a refractive index of 1.48), a cellulose diacetate film, a cellulose acetate butyrate film, and a cellulose acetate propionate film), polyolefin such as polyethylene and polypropylene, a polyester-based resin film such as polyethylene terephthalate or polyethylene naphthalate, a polyacrylic resin film such as a polyether sulfone film and polymethyl methacrylate, a polyurethane-based resin film, a polyester film, a polycarbonate film, a polysulfone film, a polyether film, a polymethyl pentene film, a polyether ketone film, a (meth)acrylonitrile film, polyolefin, a polymer having an alicyclic structure (a norbornene-based resin (a product name: Arton, manufactured by JSR Corporation) and amorphous polyolefin (a product name: Zeonex, manufactured by Zeon Corporation)), and the like. Among them, the triacetyl cellulose, the polyethylene terephthalate, and the polymer having an alicyclic structure are preferable, and the triacetyl cellulose is particularly preferable.

As described below, the angle between the slow axis direction of the λ/4 plate and the absorption axis direction of the polarizing plate is 30° to 60°, is preferably 35° to 55°, is more preferably 40° to 50°, and is particularly preferably 45°. When the polarizing plate is formed by using a roll-to-roll process, in general, a longitudinal direction (a transportation direction) is the absorption axis direction, and thus it is preferable that the angle between the slow axis direction and the longitudinal direction of the λ/4 plate is 30° to 60°. A manufacturing method of the λ/4 plate in which the angle between the slow axis direction and the longitudinal direction is 30° to 60° is not particularly limited insofar as an alignment axis of the polymer is inclined by a desired angle by continuously stretching the polymer in a direction at 30° to 60° with respect to the longitudinal direction, and a known method is able to be adopted as the manufacturing method. In addition, a stretching machine used in inclined stretching is not particularly limited, and a known tenter stretching machine of the related art in which feeding force, tensile force, or pulling force is able to be added at different left and right rates in a horizontal direction or a vertical direction is able to be used as the stretching machine. In addition, examples of a tenter type stretching machine include a horizontally monoaxially stretching machine, a simultaneously biaxially stretching machine, and the like, but is not particularly limited insofar as a long film is able to be continuously subjected to an inclined stretching treatment, and various types of stretching machines are able to be used.

For example, methods disclosed in JP1975-83482A (JP-S50-83482A), JP1990-113920A (JP-H02-113920A), JP1991-182701A (JP-H03-182701A), JP2000-9912A, JP2002-86554A, JP2002-22944A, and WO2007/111313A are able to be used as a method of the inclined stretching.

When the λ/4 plate includes the optical anisotropic layer or the like on the support body formed of the polymer film, other layers are laminated on the support body, and thus a desired λ/4 function is obtained. The configuration material of the optical anisotropic layer is not particularly limited, and the optical anisotropic layer is formed of a composition containing a liquid crystal compound, and the optical anisotropic layer may be a layer exhibiting optical anisotropy which is expressed by aligning molecules of the liquid crystal compound, may be a layer having optical anisotropy expressed by aligning polymers in a polymer film by stretching the polymer film, or may include both of the layers. That is, the optical anisotropic layer is able to be configured of one or two or more biaxial films, and is able to be configured of a combination of two or more monoaxial films such as a combination of a C plate and an A plate. Naturally, the optical anisotropic layer is also able to be configured of a combination of one or more biaxial films and one or more monoaxial films.

In particular, the retardation film in which $R_{450}/R_{550}$ is 1.00 to 1.05, for example, is able to be formed by using a polymer of which an absorption end is in the vicinity of a wavelength of 200 nm, such as a polyolefin-based polymer, a polyvinyl alcohol-based polymer, a cellulose acetate-based polymer, a polyvinyl chloride-based polymer, and a polymethyl methacrylate-based polymer.

In addition, the retardation film in which $R_{450}/R_{550}$ is 1.05 to 1.20, for example, is able to be formed by using a polymer of which absorption end is on a long wavelength side from 200 nm, such as a polycarbonate-based polymer, a polyester-based polymer, a polysulfone-based polymer, a polyether sulfone-based polymer, and a polystyrene-based polymer.

On the other hand, a λ/4 plate prepared as a laminated body of the following λ/4 plate and λ/4 plate is also able to be used as the λ/4 plate (C) in which Expression (1) is satisfied and λ/4 plate in which Expression (2) is satisfied, which are used in the aspect (i).

An optical anisotropic layer used as the λ/2 plate and the λ/4 plate described above will be described. The retardation film of the present invention may include an optical anisotropic layer, the optical anisotropic layer is able to be formed of one type or a plurality of types of curable compositions containing a liquid crystal compound as a main component, a liquid crystal compound having a polymerizable group is preferable among the liquid crystal compounds, and it is preferable that the optical anisotropic layer is formed of one type of the curable compositions described above.

The λ/4 plate used in the λ/4 plate (C) in which Expression (1) is satisfied and the λ/4 plate in which Expression (2) is satisfied may be an optical anisotropic support body having a desired λ/4 function in the support body itself, or may include an optical anisotropic layer or the like on a support body formed of a polymer film. That is, in the latter case, the other layer is laminated on the support body, and thus a desired λ/4 function is obtained. The configuration material of the optical anisotropic layer is not particularly limited, and the optical anisotropic layer may be a layer which is formed of a composition containing a liquid crystal compound and has optical anisotropy expressed by aligning molecules of the liquid crystal compound, may be a layer which has optical anisotropy expressed by stretching the polymer film and by aligning the polymer in the film, or may include both of the layers. That is, the optical anisotropic layer is able to be configured of one or two or more biaxial films, and is able to be configured by a combination of two or more monoaxial films such as a combination of a C plate and an A plate. Naturally, the optical anisotropic layer is also able to be configured by combining one or more biaxial films and one or more monoaxial films.

Here, the "λ/4 plate" which is the λ/4 plate (C) in which Expression (1) is satisfied and the λ/4 plate in which Expression (2) is satisfied indicates an optical anisotropic layer in which in-plane retardation Re(λ) at a specific wavelength of λ nm satisfies Re(λ)=λ/4. The above expression may be attained at any wavelength (for example, 550 nm) in a visible light region, and in-plane retardation Re(550) at a wavelength of 550 nm is preferably 115 nm≤Re(550)≤155 nm, and is more preferably 120 nm to 145 nm. According to this range, when the λ/4 plate is combined with the following λ/2 plate, it is possible to reduce light leakage of reflection light to the extent of being invisible, and thus setting the retardation to be in this range is preferable.

The λ/2 plate used in the λ/4 plate (C) in which Expression (1) is satisfied and the λ/4 plate in which Expression (2) is satisfied may be an optical anisotropic support body having a desired λ/2 function in the support body itself, or may include an optical anisotropic layer or the like on a support body formed of a polymer film. That is, in the latter case, the other layer is laminated on the support body, and thus a desired λ/2 function is obtained. The configuration material of the optical anisotropic layer is not particularly limited, and the optical anisotropic layer may be a layer which is formed of a composition containing a liquid crystal compound and has optical anisotropy expressed by aligning molecules of the liquid crystal compound, may be a layer which has optical anisotropy expressed by stretching the polymer film and by aligning the polymer in the film, or may include both of the layers. That is, the optical anisotropic layer is able to be configured of one or two or more biaxial films, and is able to be configured by a combination of two or more monoaxial films such as a combination of a C plate and an A plate. Naturally, the optical anisotropic layer is also able to be configured by combining one or more biaxial films and one or more monoaxial films.

Here, the "λ/2 plate" which is the λ/4 plate (C) in which Expression (1) is satisfied and the λ/4 plate in which Expression (2) is satisfied indicates an optical anisotropic layer in which in-plane retardation Re(λ) at a specific wavelength of λ nm satisfies Re(λ)=λ/2. The above expression may be attained at any wavelength (for example, 550 nm) in a visible light region. Further, in the present invention, in-plane retardation Re1 of the λ/2 plate is set to be substantially two times in-plane retardation Re2 of the λ/4 plate.

Here, the expression "the retardation is substantially two times" indicates Re1=2×Re2±50 nm. Here, Re1=2×Re2±20 nm is preferable, and Re1=2×Re2+10 nm is more preferable. The above expression may be attained in any wavelength in the visible light region, and is preferably attained at a wavelength of 550 nm. According to this range, when the λ/2 plate is combined with the λ/4 plate described above, it is possible to reduce the light leakage of the reflection light to the extent of being invisible, and thus setting the retardation to be in this range is preferable.

The λ/4 plate (C) is laminated such that the direction of the linear polarization light which is transmitted through the λ/4 plate (C) is parallel to a transmission axis direction of the backlight side polarizing plate.

When the λ/4 plate (C) is a single layer, an angle between the slow axis direction of the λ/4 plate (C) and the absorption axis direction of the polarizing plate is 45°.

When the λ/4 plate (C) is a laminated body of the λ/4 plate and the λ/4 plate, an angle between the respective slow axis directions and the absorption axis direction of the polarizing plate has the following positional relationship.

When Rth of the λ/2 plate described above at a wavelength of 550 nm has a negative value, an angle between the slow axis direction of the λ/2 plate and the absorption axis direction of the polarizer layer described above is preferably in a range of 75°±8°, is more preferably in a range of 75°±6°, and is even more preferably in a range of 75°±3°. Further, in this case, an angle between the slow axis direction of the λ/4 plate described above and the absorption axis direction of the polarizer layer described above is preferably in a range of 15°±8°, is more preferably in a range of 15°±6°, and is even more preferably in a range of 15°±3°. According to the range described above, it is possible to reduce the light leakage of reflection light to the extent of being invisible, and thus setting the angle to be in this range is preferable.

In addition, when Rth of the λ/2 plate described above at a wavelength of 550 nm has a positive value, an angle between the slow axis direction of the λ/2 plate and the absorption axis direction of the polarizer layer described above is preferably in a range of 15°±8°, is more preferably in a range of 15°±6°, and is even more preferably in a range of 15°±3°. Further, in this case, an angle between the slow axis direction of the λ/4 plate described above and the absorption axis direction of the polarizer layer described above is preferably in a range of 75°±8°, is more preferably in a range of 75°±6°, and is even more preferably in a range of 75°±3°. According to the range described above, it is possible to reduce the light leakage of reflection light to the extent of being invisible, and thus setting the angle to be in this range is preferable.

The material of the optical anisotropic support body used in the present invention is not particularly limited. For example, cellulose acylate, a polycarbonate-based polymer, a polyester-based polymer such as polyethylene terephthalate or polyethylene naphthalate, an acrylic polymer such as polymethyl methacrylate, a styrene-based polymer such as polystyrene or an acrylonitrile.styrene copolymer (an AS resin), and the like are able to used in various polymer films. In addition, one type or two or more types of polymers are selected from polyolefin such as polyethylene and polypropylene, a polyolefin-based polymer such as an ethylene-propylene copolymer, a vinyl chloride-based polymer, an amide-based polymer such as nylon or aromatic polyamide, an imide-based polymer, a sulfone-based polymer, a polyether sulfone-based polymer, a polyether ether ketone-based polymer, a polyphenylene sulfide-based polymer, a vinylidene chloride-based polymer, a vinyl alcohol-based polymer, a vinyl butyral-based polymer, an arylate-based polymer, a polyoxy methylene-based polymer, an epoxy-based polymer, a polymer in which the polymers described above are mixed, and the like, a polymer film is prepared by using the selected polymer as a main component, and the polymer film is able to be used for preparing an optical film in a combination where the properties described above are satisfied.

When the λ/2 plate and the λ/4 plate are a laminated body of a polymer film (a transparent support body) and an optical anisotropic layer, it is preferable that the optical anisotropic layer includes at least one layer formed of a composition containing a liquid crystal compound. That is, it is preferable that the λ/2 plate and the λ/4 plate are a laminated body of the polymer film (the transparent support body) and the optical anisotropic layer formed of the composition containing the liquid crystal compound. A polymer film having small optical anisotropy may be used in the transparent support body, and a polymer film in which optical anisotropy is expressed due to a stretching treatment or the like may be used in the transparent support body. It is preferable that the support body has light transmittance of greater than or equal to 80%.

The type of liquid crystal compound used for forming the optical anisotropic layer which may be included in the λ/2 plate and the λ/4 plate described above is not particularly limited. For example, an optical anisotropic layer obtained by forming a low molecular liquid crystal compound in a nematic alignment in a liquid crystal state, and then by fixing the alignment using optical cross-linkage or thermal cross-linkage and an optical anisotropic layer obtained by forming a high molecular liquid crystal compound in a nematic alignment in a liquid crystal state, and then by fixing the alignment using cooling are able to be used. Furthermore, in the present invention, even when the liquid crystal compound is used in the optical anisotropic layer, the optical anisotropic layer is a layer formed by fixing the liquid crystal compound using polymerization or the like, and it is not necessary to have liquid crystalline properties anymore after the liquid crystal compound is formed into a layer. The polymerizable liquid crystal compound may be a multifunctional polymerizable liquid crystal, or may be a monofunctional polymerizable liquid crystal compound. In addition, the liquid crystal compound may be a discotic liquid crystal compound, or may be a rod-like liquid crystal compound.

In general, the liquid crystal compound is classified into a rod-like type liquid crystal compound and a disk-like type liquid crystal compound according to the shape. Further, the liquid crystal compound includes a low molecular type liquid crystal compound and a high molecular type liquid crystal compound. In general, the polymer indicates a polymer having a degree of polymerization of greater than or equal to 100 (Polymer Physics·Phase Transition Dynamics, authorized by DOI Masao, Page 2, Iwanami Shoten, 1992). In the present invention, any liquid crystal compound is able to be used, and it is preferable that a rod-like liquid crystal compound or a disk-like liquid crystal compound is used. Two or more types of the rod-like liquid crystal compounds, two or more types of the disk-like liquid crystal compounds, or a mixture of the rod-like liquid crystal compound and the disk-like liquid crystal compound may be used. It is more preferable that the optical anisotropic layer is formed by using a rod-like liquid crystal compound or a disk-like liquid crystal compound having a reactive group, and it is even more preferable that at least one has two or more reactive groups in one liquid crystal molecule, from a viewpoint of enabling a temperature change or a humidity change to be reduced. The liquid crystal compound may be two or more types of mixtures, and in this case, it is preferable that at least one has two or more reactive groups.

For example, rod-like liquid crystal compounds disclosed in JP1999-513019A (JP-H11-513019A) or JP2007-279688A are able to be preferably used as the rod-like liquid crystal compound, and discotic liquid crystal compounds disclosed in JP2007-108732A or JP2010-244038A are able to be preferably used as the discotic liquid crystal compound, but the liquid crystal compounds are not limited thereto.

In the optical anisotropic layer described above, it is preferable that the molecules of the liquid crystal compound are fixed into any one of the alignment states of vertical alignment, horizontal alignment, hybrid alignment, and inclination alignment. In order to prepare a phase difference plate having symmetric view angle dependency, it is preferable that a disk-like surface of the discotic liquid crystal compound is substantially vertical to a film surface (the surface of the optical anisotropic layer), or a long axis of the rod-like liquid crystal compound is substantially horizontal to the film surface (the surface of the optical anisotropic layer). The expression "the discotic liquid crystal compound is substantially vertical" indicates that the average value of an angle between the film surface (the surface of the optical anisotropic layer) and the disk-like surface of the discotic liquid crystal compound is in a range of 70° to 90°. The average value of the angle is more preferably 80° to 90°, and is even more preferably 85° to 90°. The expression "the rod-like liquid crystal compound is substantially horizontal" indicates that an angle between the film surface (the surface of the optical anisotropic layer) and a director of the rod-like liquid crystal compound is in a range of 0° to 20°. The angle is more preferably 0° to 10°, and is even more preferably 0° to 5°.

When the λ/2 plate and the λ/4 plate described above include the optical anisotropic layer containing the liquid crystal compound, the optical anisotropic layer may be only one layer, or may be a laminated body of two or more layers of the rod-like liquid crystal compound, two or more layers of the disk-like liquid crystal compound, or two or more optical anisotropic layers of a combination of the rod-like liquid crystal compound and the disk-like liquid crystal compound.

The optical anisotropic layer described above is able to be formed by applying a coating liquid containing the liquid crystal compound such as the rod-like liquid crystal compound or the discotic liquid crystal compound, as necessary, a polymerization initiator described below, an alignment control agent, or other additives onto the support body. It is preferable that the optical anisotropic layer is formed by forming an alignment film on the support body, and by applying the coating liquid described above onto the surface of the alignment film.

In the present invention, it is preferable that the composition described above is applied onto the surface of the alignment film, and the molecules of the liquid crystal compound are aligned. The alignment film has a function of setting an alignment direction of the liquid crystal compound, and thus it is preferable that the alignment film is used in order to realize a preferred aspect of the present invention. However, when the liquid crystal compound is aligned, and then the alignment state is fixed, the alignment film has the function of setting the alignment direction, and thus the alignment film is not an essential constituent of the present invention. That is, it is possible to prepare the polarizing plate of the present invention by transferring only the optical anisotropic layer on the alignment film in which the alignment state is fixed onto the polarization layer or the support body.

It is preferable that the alignment film is formed by performing a rubbing treatment with respect to a polymer. Examples of the polymer include a methacrylate-based copolymer, a styrene-based copolymer, polyolefin, polyvinyl alcohol, and modified polyvinyl alcohol disclosed in paragraphs "0022" of the specification of JP1996-338913A (JP-H08-338913A), poly(N-methylol acryl amide), polyester, polyimide, a vinyl acetate copolymer, carboxy methyl cellulose, polycarbonate, and the like. A silane coupling agent is able to be used as the polymer. A water-soluble polymer (for example, poly(N-methylol acryl amide), carboxy methyl cellulose, gelatin, polyvinyl alcohol, and modified polyvinyl alcohol) is preferable, the gelatin, the polyvinyl alcohol, and the modified polyvinyl alcohol are more preferable, and the polyvinyl alcohol and the modified polyvinyl alcohol are particularly preferable. A treatment method which has been widely adopted as a liquid crystal alignment treatment step of an LCD is able to be applied to the rubbing treatment described above. That is, a method is able to be used in which the surface of the alignment film is aligned by being rubbed with paper or gauze, felt, rubber or nylon, a polyester fiber, and the like in a constant direction. In general, the method is performed by averagely rubbing a fiber having a homogeneous length and thickness with fiber-implanted cloth or the like approximately several times.

The composition described above is applied onto the surface of the alignment film which is subjected to the rubbing treatment, and the molecules of the liquid crystal compound are aligned. After that, as necessary, the alignment film polymer reacts with the multifunctional monomer contained in the optical anisotropic layer or the alignment film polymer is cross-linked by using a cross-linking agent, and thus it is possible to form the optical anisotropic layer described above.

It is preferable that the film thickness of the alignment film is in a range of 0.1 μm to 10 μm.

The in-plane retardation (Re) of the transparent support body (the polymer film) supporting the optical anisotropic layer is preferably 0 nm to 150 nm, is more preferably 0 nm to 50 nm, and is even more preferably 0 nm to 10 nm. According to the range described above, it is possible to reduce the light leakage of the reflection light to the extent of being invisible, and thus setting the retardation to be in this range is preferable.

In addition, it is preferable that the retardation (Rth) of the support body in the thickness direction is selected depending on a combination with the optical anisotropic layer which is disposed on or under the support body. Accordingly, it is possible to reduce the light leakage of the reflection light at the time of being observed from the inclined direction, and coloring.

Examples of the polymer include a cellulose acylate film (for example, a cellulose triacetate film (a refractive index of 1.48), a cellulose diacetate film, a cellulose acetate butyrate film, and a cellulose acetate propionate film), polyolefin such as polyethylene and polypropylene, a polyester-based resin film such as polyethylene terephthalate or polyethylene naphthalate, a polyacrylic resin film such as a polyether sulfone film and a polymethyl methacrylate, a polyurethane-based resin film, a polyester film, a polycarbonate film, a polysulfone film, a polyether film, a polymethyl pentene film, a polyether ketone film, a (meth)acrylonitrile film, polyolefin, a polymer having an alicyclic structure (a norbornene-based resin (Arton (a product name), manufactured by JSR Corporation), amorphous polyolefin (Zeonex (a product name), manufactured by Zeon Corporation)), and the like. Among them, the triacetyl cellulose, the polyethylene terephthalate, and the polymer having an alicyclic structure are preferable, and the triacetyl cellulose is particularly preferable.

The transparent support body having a thickness of approximately 10 μm to 200 μm is able to be used, and the thickness of the transparent support body is preferably 10 μm to 80 μm, and is more preferably 20 μm to 60 μm. In addition, the transparent support body may be formed by laminating a plurality of transparent support bodies. In order to suppress external light reflection, it is preferable that the thickness of the transparent support body is thin, and when the thickness of the transparent support body is thinner than 10 μm, intensity of the film decreases, and thus setting the thickness of the transparent support body to be thinner than 10 μm does not tend to be preferable. In order to enhance adhesion between the transparent support body and a layer disposed thereon (an adhesive layer, a vertical alignment film, or a phase difference layer), the transparent support body may be subjected to a surface treatment (for example, a glow discharge treatment, a corona discharge treatment, an ultraviolet (UV) treatment, and a flame treatment). An adhesive layer (an undercoat layer) may be disposed on the transparent support body. In addition, in order to apply slidability in a transportation step or to prevent a back surface from being bonded to the surface after being wound, it is preferable that a transparent support body formed by applying a polymer layer in which inorganic particles having an average particle diameter of approximately 10 nm to 100 nm are mixed at a weight ratio of solid contents of 5% to 40% onto one side of the support body or by cocasting the polymer layer with the support body is used as the transparent support body or a long transparent support body.

Furthermore, in the above description, the λ/2 plate or the λ/4 plate which is a laminated body structure having the optical anisotropic layer disposed on the support body is described, but the present invention is not limited to this aspect, the λ/4 plate and the λ/4 plate may be laminated on one side of one transparent support body, or the λ/2 plate may be laminated on one side of one transparent support body and the λ/4 plate may be laminated on the other side of the transparent support body. Further, the λ/2 plate or the λ/4 plate may be formed of single stretched polymer film (the optical anisotropic support body), or may be formed only of the liquid crystal film which is formed of the composition containing the liquid crystal compound. A preferred example of the liquid crystal film is also identical to the preferred example of the optical anisotropic layer described above.

It is preferable that the λ/2 plate and the λ/4 plate described above are continuously manufactured in a state of a long film. At this time, a slow axis angle of λ/2 or λ/4 is 15°±8° or 75° with respect to a longitudinal direction of the long film described above. Accordingly, in the manufacturing of an optical laminated body described below, the longitudinal direction of the long film described above is allowed to be coincident with a longitudinal direction of a polarizing film, and thus it is possible to bond the films to each other by a roll-to-roll process, and it is possible to manufacture a circularly polarizing plate or an elliptically polarizing plate with high accuracy in an axis angle at the time of bonding and high productivity. Furthermore, when the optical anisotropic layer is formed of the liquid crystal compound, the angle of the slow axis of the optical anisotropic layer is able to be adjusted by a rubbing angle. In addition, when the λ/2 plate or the λ/4 plate is formed of the polymer film (the optical anisotropic support body) which is subjected to a stretching treatment, the angle of the slow axis is able to be adjusted according to a stretching direction.

Next, the aspect (ii) will be described.

The reflection polarizer (B) used in the aspect (ii) of the first aspect of the optical sheet member of the present invention is a dielectric multilayer film which has a reflection center wavelength in a wavelength range of 430 nm to 480 nm and a peak of reflectivity having a half-value width of less than or equal to 100 nm.

The reflection polarizer (B) used in the aspect (ii) of the second aspect of the optical sheet member of the present invention is a dielectric multilayer film which has a reflection center wavelength in a wavelength range of 300 nm to 430 nm and a peak of reflectivity having a half-value width of less than or equal to 100 nm.

In FIG. 6 to FIG. 10, an aspect is illustrated in which a dielectric multilayer film 11 is used as a reflection polarizer 15. However, the present invention is not limited by such a specific example, and for convenience, the dielectric multilayer film 11 is illustrated as a laminated body of three layers in the drawings, but the number of laminations is able to be suitably changed in order to attain desired reflectivity.

It is preferable that the dielectric multilayer film used in the aspect (ii) of the first aspect of the optical sheet member of the present invention has a reflection center wavelength in a wavelength range of 430 nm to 480 nm and has a peak of reflectivity having a half-value width of less than or equal to 100 nm, that is, it is preferable that the dielectric multilayer film does not have a peak of reflectivity in a visible light region other than the peak of the reflectivity described above.

It is preferable that the dielectric multilayer film used in the aspect (ii) of the second aspect of the optical sheet member of the present invention has a reflection center wavelength in a wavelength range of 300 nm to 430 nm and a peak of reflectivity having a half-value width of less than or equal to 100 nm, that is, it is preferable that the dielectric multilayer film does not have a peak of reflectivity in a visible light region other than the peak of the reflectivity described above.

It is preferable that the film thickness of the dielectric multilayer film used in the aspect (ii) is thin. The film thickness of the dielectric multilayer film used in the aspect (ii) is preferably 5 μm to 100 μm, is more preferably 5 μm to 50 μm, and is particularly preferably 5 μm to 20 μm.

A manufacturing method of the dielectric multilayer film used in the aspect (ii) is not particularly limited, but the dielectric multilayer film is able to be manufactured with reference to methods disclosed in JP3187821B, JP3704364B, JP4037835B, JP4091978B, JP3709402B, JP4860729B, JP3448626B, and the like, and the contents of these publications are incorporated in the present invention. Furthermore, the dielectric multilayer film indicates a dielectric multilayer reflection polarizing plate or a birefringent interference polarizer of an alternating multilayer film.

<Optical Conversion Member (D)>

The first aspect of the optical sheet member of the present invention includes an optical conversion member (D) which converts a part of blue light which is transmitted through the reflection polarizer (B) and is incident on the optical conversion member (D), and has an emission center wavelength in a wavelength range of 430 nm to 480 nm and a peak of emission intensity having a half-value width of less than or equal to 100 nm into green light which has an emission center wavelength in a wavelength range of 500 nm to 600 nm and a peak of emission intensity having a half-value width of less than or equal to 100 nm and red light which has an emission center wavelength in a wavelength range of 600 nm to 700 nm (preferably, in a wavelength range of 600 nm to 650 nm) and has a peak of emission intensity having a half-value width of less than or equal to 100 nm, and transmits a part of the blue light as the optical conversion member (D).

The second aspect of the optical sheet member of the present invention includes an optical conversion member (D) which converts a part or all of UV light which is transmitted through the reflection polarizer (B) and is incident on the optical conversion member (D), and has an emission center wavelength in a wavelength range of 300 nm to 430 nm and a peak of emission intensity having a half-value width of less than or equal to 100 nm into blue light which has an emission center wavelength in a wavelength range of 430 nm to 480 nm and a peak of emission intensity having a half-value width of less than or equal to 100 nm, green light which has an emission center wavelength in a wavelength range of 500 nm to 600 nm and a peak of emission intensity having a half-value width of less than or equal to 100 nm, and red light which has an emission center wavelength in a wavelength range of 600 nm to 700 nm (preferably, in a wavelength range of 600 nm to 650 nm) and a peak of emission intensity having a half-value width of less than or equal to 100 nm.

In the first aspect of the optical sheet member of the present invention, it is preferable that the optical conversion member (D) includes a fluorescent material emitting the green light and the red light described above when the blue light described above is incident thereon.

In the second aspect of the optical sheet member of the present invention, it is preferable that the optical conversion member (D) includes a fluorescent material emitting the blue light, the green light, and the red light described above when light having an emission center wavelength in a wavelength range of 300 nm to 430 nm described above and a peak of emission intensity having a half-value width of less than or equal to 100 nm is incident thereon.

Examples of an inorganic fluorescent material include an yttrium.aluminum.garnet-based yellow fluorescent body, a terbium.aluminum.garnet-based yellow fluorescent body, and the like. The fluorescent wavelength of the fluorescent material is able to be controlled by changing the particle diameter of the fluorescent body. In addition, fluorescent materials disclosed in JP2010-532005A are able to be used.

In addition, an organic fluorescent material is also able to be used, and for example, fluorescent materials disclosed in JP2001-174636A, JP2001-174809A, and the like are able to be used.

In the optical sheet member of the present invention, it is preferable that the optical conversion member (D) including the fluorescent material is a thermoplastic film which is formed by being stretched after dispersing quantum dot sheets or quantum dot materials (a quantum dot and a quantum rod), or an adhesive layer in which quantum dot materials are dispersed.

In addition, the material used in the optical sheet of the present invention which is stretched after dispersing the quantum dot materials described above is not particularly limited. For example, cellulose acylate, a polycarbonate-based polymer, a polyester-based polymer such as polyethylene terephthalate or polyethylene naphthalate, an acrylic polymer such as polymethyl methacrylate, a styrene-based polymer such as polystyrene or an acrylonitrile.styrene copolymer (an AS resin), and the like are able to be used as various polymer films. In addition, one or two or more polymers are selected from polyolefin such as polyethylene and polypropylene, a polyolefin-based polymer such as an ethylene-propylene copolymer, a vinyl chloride-based polymer, an amide-based polymer such as nylon or aromatic polyamide, an imide-based polymer, a sulfone-based polymer, a polyether sulfone-based polymer, a polyether ether ketone-based polymer, a polyphenylene sulfide-based polymer, a vinylidene chloride-based polymer, a vinyl alcohol-based polymer, a vinyl butyral-based polymer, an arylate-based polymer, a polyoxy methylene-based polymer, an epoxy-based polymer, a polymer in which the polymers described above are mixed, and the like, a polymer film is prepared by using the selected polymers as a main component, and the polymer film is able to be used in preparation of an optical sheet in a combination in which the properties described above are satisfied.

When the optical conversion member (D) including the fluorescent material described above is the quantum dot sheet, such a quantum dot sheet is not particularly limited, but known quantum dot sheets disclosed in JP2012-169271A, SID'12 DIGEST p. 895, JP2010-532005A, and the like are able to be used, and the contents of these literatures are incorporated in the present invention. In addition, a Quantum Dot Enhancement Film (QDEF, manufactured by NanoSys InC.) is able to be used as such a quantum dot sheet.

When the optical conversion member (D) including the fluorescent material described above is the thermoplastic film formed by being stretched after dispersing the quantum dot materials, such a thermoplastic film is not particularly limited, but known thermoplastic films disclosed in JP2001-174636A, JP2001-174809A, and the like are able to be used, and the contents of these literatures are incorporated in the present invention. In addition, specific examples of such a thermoplastic resin include a cellulose resin such as triacetyl cellulose, a polyester resin, a polyether sulfone resin, a polysulfone resin, a polycarbonate resin, a polyamide resin, a polyimide resin, a polyolefin resin, a (meth)acrylic resin, a cyclic polyolefin resin (a norbornene-based resin), a polyarylate resin, a polystyrene resin, a polyvinyl alcohol resin, and a mixture thereof.

When the optical conversion member (D) including the fluorescent material described above is the adhesive layer in which the quantum dot materials are dispersed, such an adhesive layer is not particularly limited, but known adhesive layers in which quantum dot materials are dispersed which are disclosed in JP2012-169271A, SID'12 DIGEST p. 895, JP2001-174636A, JP2001-174809A, JP2010-532005A, and the like are able to be used.

In the optical sheet member of the present invention, it is preferable that the optical conversion member emits fluorescent light holding at least a part of polarization properties of an incidence ray from a viewpoint of enhanced brightness and low power consumption. The quantum dot materials described above are able to be used as the optical conversion member which is able to emit the fluorescent light holding at least a part of the polarization properties of the incidence ray. In addition, it is preferable that a quantum rod type disclosed in non-patent literature (THE PHYSICAL CHEMISTRY LETTERS 2013, 4, 502-507) is able to be used from a viewpoint of holding the polarization properties of the fluorescent light. In the emission of the fluorescent light holding a part of the polarization properties of the incidence ray, when excitation light at a polarization degree of 99.9% is incident on the optical conversion member, the polarization degree of the fluorescent light emitted from the optical conversion member is not 0%, and the polarization degree is preferably 10% to 80%, is more preferably 80% to 99%, and is even more preferably 99% to 99.9%.

In the optical sheet member of the present invention, it is preferable that the optical conversion member includes a fluorescent material in which light exited from the optical conversion member includes linear polarization light and circular polarization light from a viewpoint of enhanced brightness and low power consumption. Examples of the fluorescent material in which the light exited from the optical conversion member includes the linear polarization light and the circular polarization light are able to include the quantum dot materials described above. In addition, the λ/4 plate (C) used in the aspect (i) described above, in which Expression (1) and Expression (2) are satisfied, is used in the fluorescent material emitting circular polarization light, and the circular polarization light is converted into the linear polarization light, and thus it is possible to realize an optical sheet member which is excellent from a viewpoint of improved brightness.

In addition, when the light exited from the optical conversion member includes the linear polarization light, it is more preferable that the polarizing plate on the BL side further includes a linear polarization reflection polarizer or further includes a linear polarization reflection polarizer between the polarizing plate described above (the polarizing plate on the BL side and an absorption type polarizing plate) and the optical conversion member described above, and thus the light exited from the optical conversion member (the linear polarization light) and the transmission axis of the reflection polarizer and the BL side polarizer are coincident with each other from a viewpoint of enhanced brightness. The linear polarization reflection polarizer described above may function in an entire wavelength region of a wavelength range of 300 nm to 780 nm, is preferably a linear polarization reflection polarizer reflecting at least a part of light in a wavelength range of 300 nm to 500 nm, and is more preferably a linear polarization reflection polarizer reflecting all of a part of light in a wavelength range of 300 nm to 480 nm.

The linear polarization reflection polarizer described above is preferably a dielectric multilayer film reflecting light in an entire wavelength region of a wavelength range of 300 nm to 780 nm, is more preferably a dielectric multilayer film reflecting at least a part of light in a wavelength range of 300 nm to 500 nm, and is particularly preferably a dielectric multilayer film reflecting (all or a part of) light in at least a wavelength range of 300 nm to 480 nm.

Figure 14A:
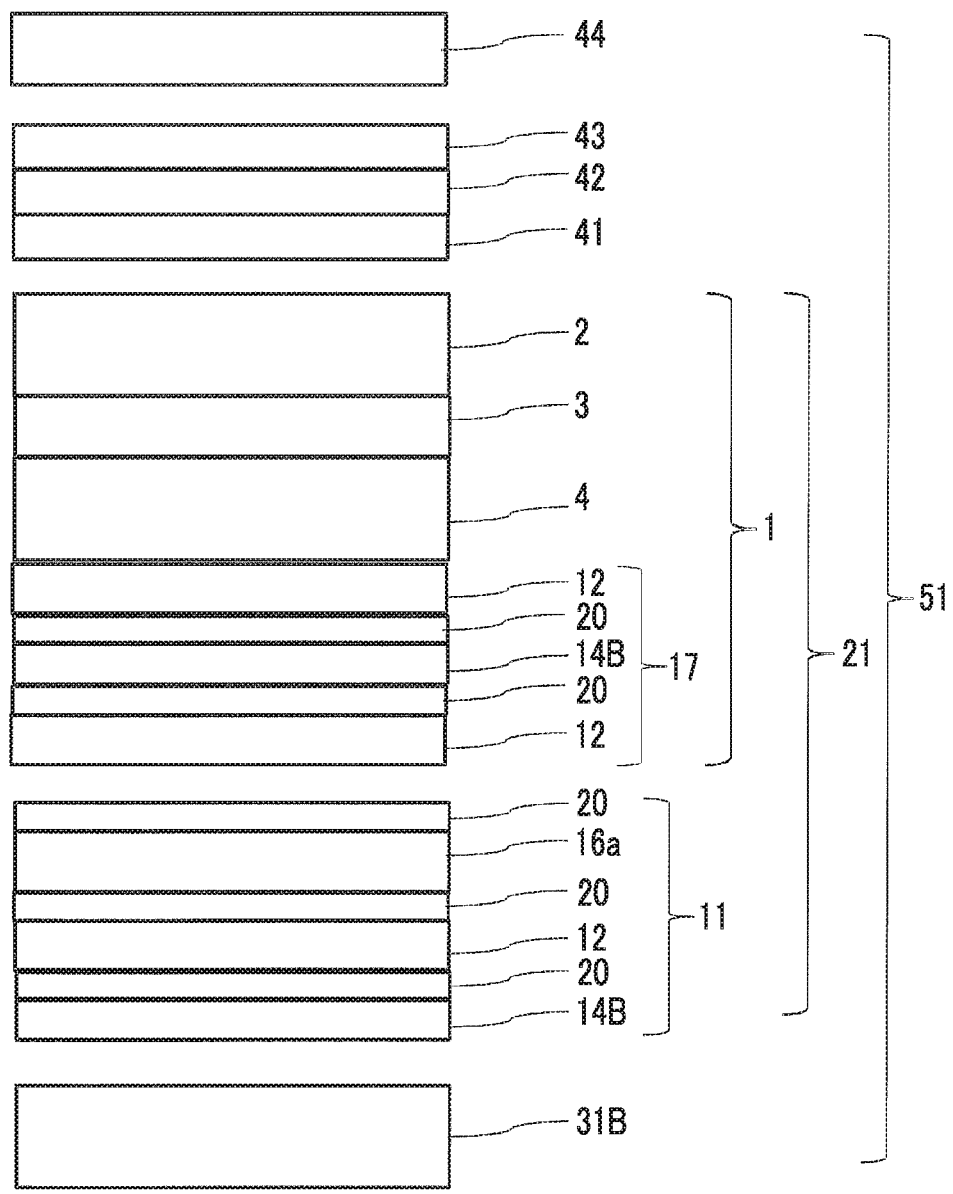
FIG. 14-A is a schematic view illustrating a sectional surface of another example of the liquid crystal display device which is the image display device of the present invention.
Figure 14B:
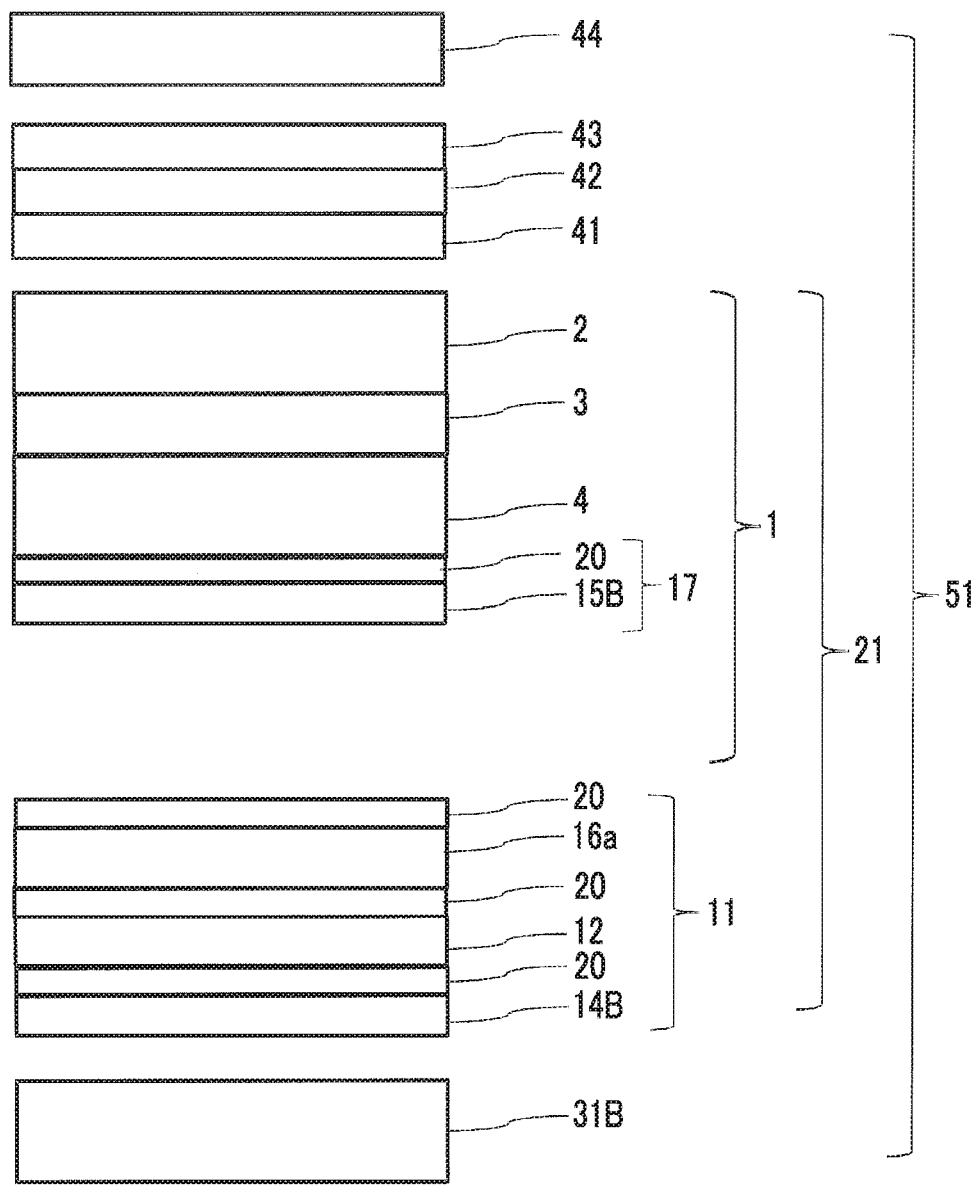
Figure 15:
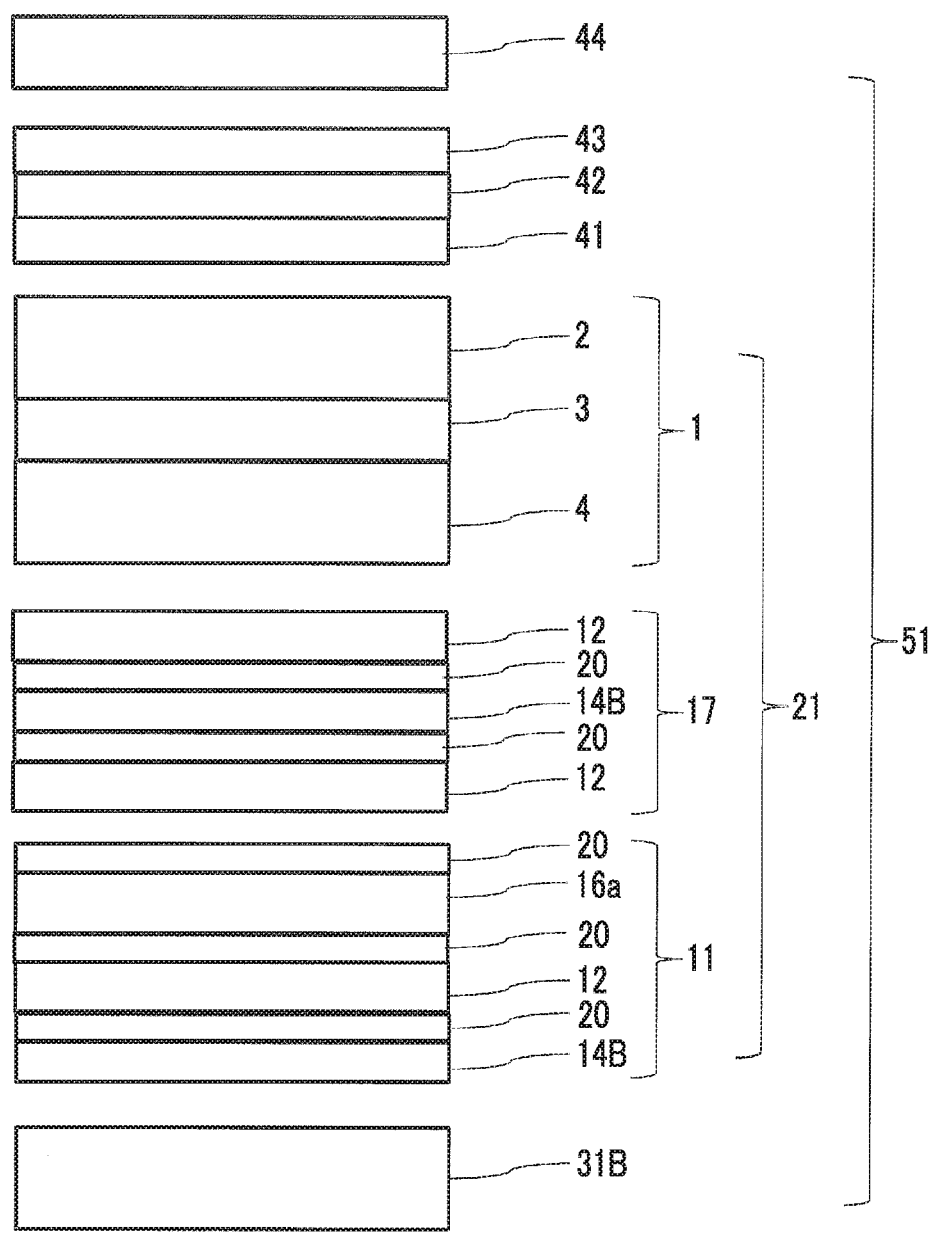
FIG. 15 is a schematic view illustrating a sectional surface of still another example of the liquid crystal display device which is the image display device of the present invention.

In addition, the linear polarization reflection polarizer described above may be a linear polarization reflection polarizer including λ/4 plates on both sides of a light reflecting layer which is formed by fixing a cholesteric liquid crystalline phase reflecting light in an entire wavelength region of a wavelength range of 300 nm to 780 nm, is preferably a linear polarization reflection polarizer including λ/4 plates on both sides of a light reflecting layer which is formed by fixing a cholesteric liquid crystalline phase reflecting at least a part of light in a wavelength range of 300 nm to 500 nm, and is more preferably linear polarization reflection polarizer including λ/4 plates on both sides of a light reflecting layer which is formed by fixing a cholesteric liquid crystalline phase reflecting (all or a part of) light in at least a wavelength range of 300 nm to 480 nm. Among aspects in which light exited from an optical conversion member 11 includes linear polarization light, and the polarizing plate 1 on the BL side further includes a linear polarization reflection polarizer 17, an aspect in which the linear polarization reflection polarizer 17 described above is a linear polarization reflection polarizer including the λ/4 plates 12 on both sides of the light reflecting layer 14B which is formed by fixing a cholesteric liquid crystalline phase is illustrated in FIG. 14-A. Among aspects in which the linear polarization reflection polarizer 17 is further included between the BL side polarizing plate 1 and the optical conversion member 11, an aspect in which the linear polarization reflection polarizer 17 described above is a linear polarization reflection polarizer including the λ/4 plates 12 on both sides of the light reflecting layer 14B which is formed by fixing a cholesteric liquid crystalline phase is illustrated in FIG. 15. In addition, FIG. 14-B illustrates an aspect in which the linear polarization reflection polarizer 17 is replaced by a B narrowband dielectric multilayer film reflection polarizer or a broadband dielectric multilayer film reflection polarizer, and the same effect of the invention as that of the linear polarizer described above is obtained.

On the other hand, when the light exited from the optical conversion member includes the circular polarization light, it is more preferable that the polarizing plate on the BL side further includes a circular polarization reflection polarizer or includes a circular polarization reflection polarizer between the polarizing plate described above (the polarizing plate on the BL side and the absorption type polarizing plate) and the optical conversion member described above from a viewpoint of enhanced brightness. In this case, the reflection polarizer may function in an entire wavelength region of a wavelength range of 300 nm to 780 nm, is preferably a circular polarization reflection polarizer reflecting at least a part of light in a wavelength range of 300 nm to 500 nm, and is more preferably a circular polarization reflection polarizer reflecting all or a part of light in at least a wavelength range of 300 nm to 480 nm.

The circular polarization reflection polarizer described above is preferably a circular polarization reflection polarizer including λ/4 plates on both sides of a dielectric multilayer film reflecting light in an entire wavelength region of a wavelength range of 300 nm to 780 nm, is more preferably a circular polarization reflection polarizer including λ/4 plates on both sides of a dielectric multilayer film reflecting at least a part of light in a wavelength range of 300 nm to 500 nm, and is particularly preferably a circular polarization reflection polarizer including λ/4 plates on both sides of a dielectric multilayer film reflecting (all or a part of) light in at least a wavelength range of 300 nm to 480 nm.

Figure 16:
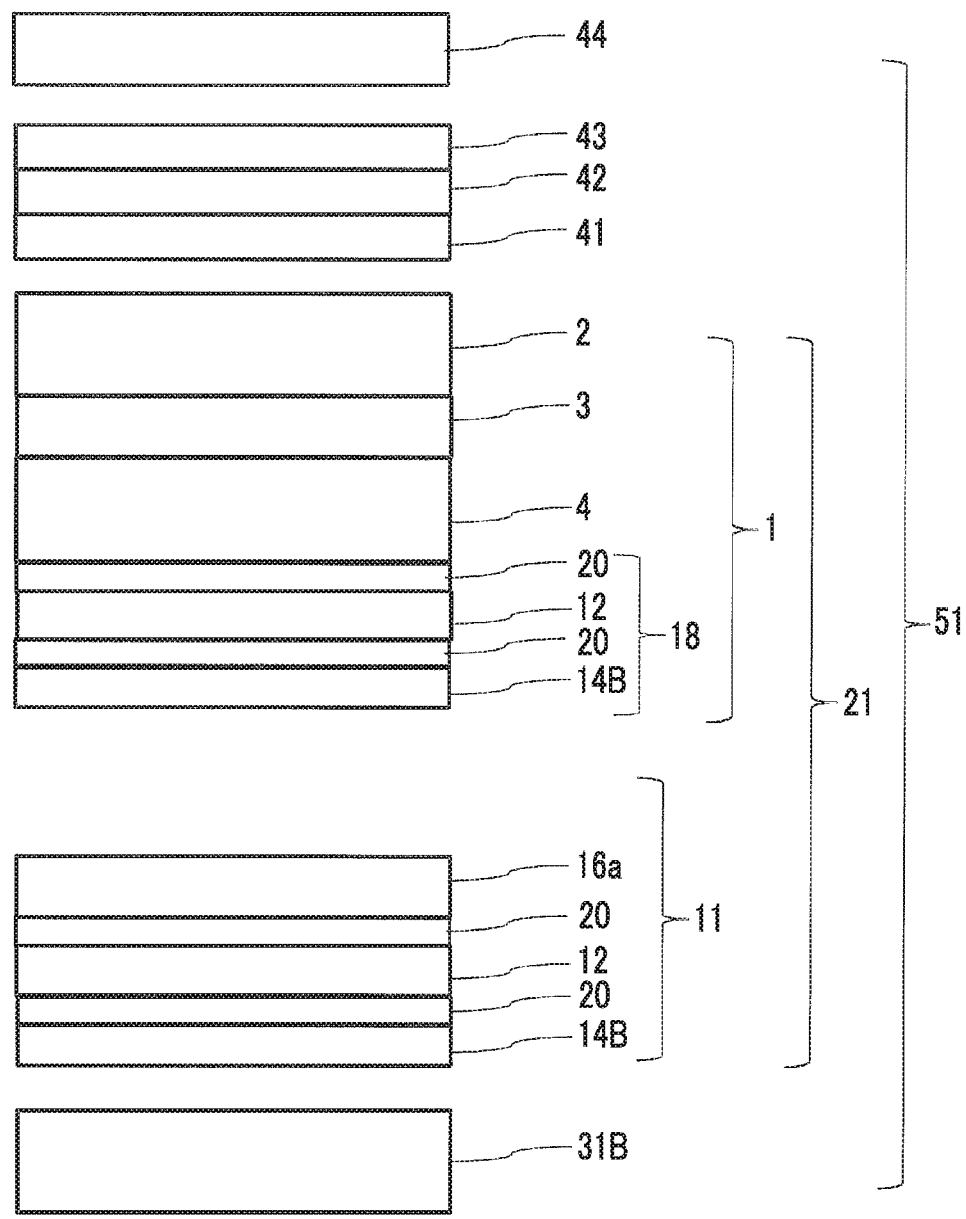
FIG. 16 is a schematic view illustrating a sectional surface of still another example of the liquid crystal display device which is the image display device of the present invention.
Figure 17:
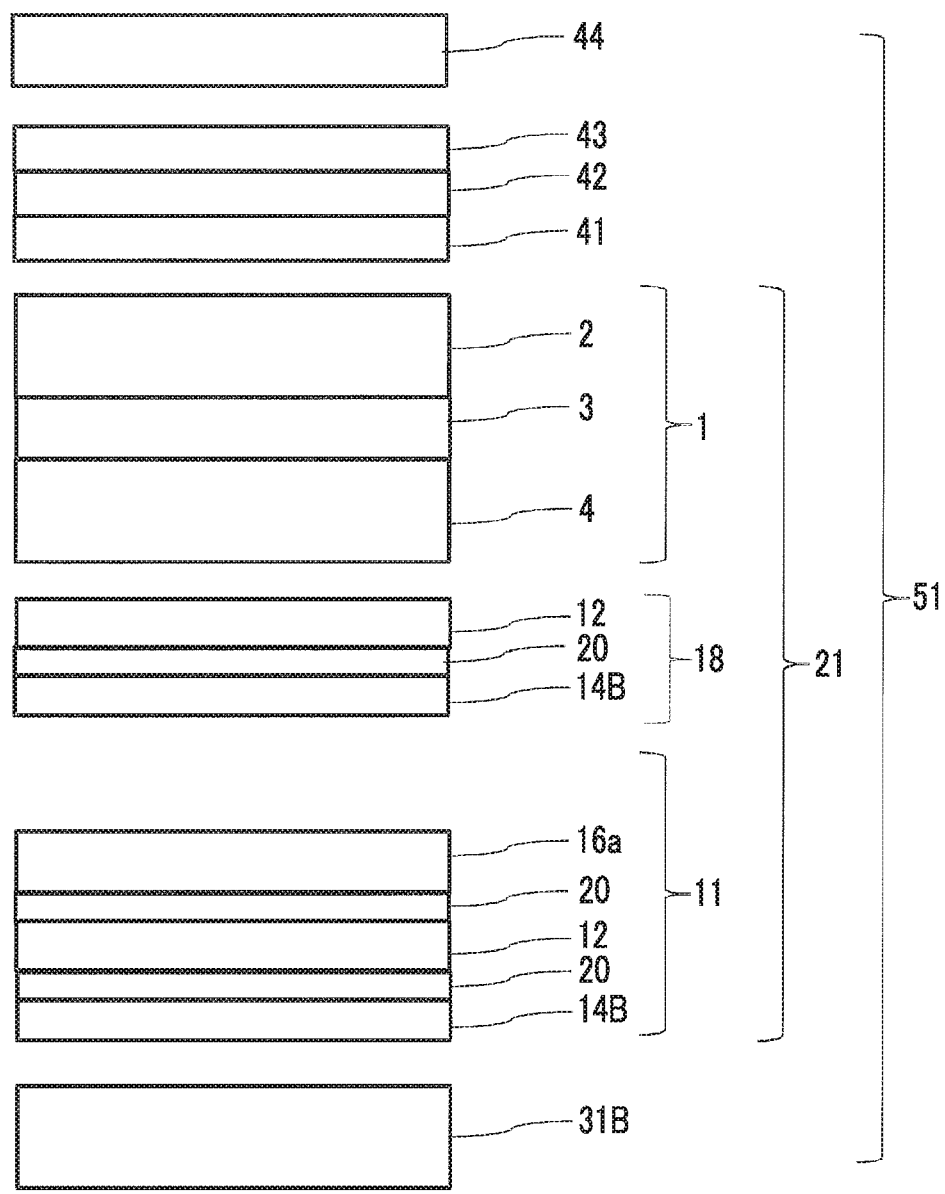
FIG. 17 is a schematic view illustrating a sectional surface of still another example of the liquid crystal display device which is the image display device of the present invention.

In addition, the circular polarization reflection polarizer described above may be a circular polarization reflection polarizer including a light reflecting layer which is formed by fixing a cholesteric liquid crystalline phase functioning in an entire wavelength region of 300 nm to 780 nm, and λ/4 plates arranged between the light reflecting layer and the polarizing plate described above, is preferably a circular polarization reflection polarizer including a light reflecting layer which is formed by fixing a cholesteric liquid crystalline phase reflecting at least a part of light in a wavelength range of 300 nm to 500 nm, and λ/4 plates arranged between the light reflecting layer and the polarizing plate described above, and is more preferably circular polarization reflection polarizer including a light reflecting layer which is formed by fixing a cholesteric liquid crystalline phase reflecting (all or a part of) light in at least a wavelength range of 300 nm to 480 nm, and λ/4 plates arranged between the light reflecting layer and the polarizing plate described above. Among aspects in which the light exited from the optical conversion member 11 includes the circular polarization light, and the polarizing plate 1 on the BL side further includes a circular polarization reflection polarizer 18, an aspect in which the circular polarization reflection polarizer 18 described above is a circular polarization reflection polarizer including the light reflecting layer 14B which is formed by fixing a cholesteric liquid crystalline phase, and the λ/4 plates 12 arranged between the light reflecting layer 14B and the polarizing plate 1 described above is illustrated in FIG. 16. Among aspects in which the circular polarization reflection polarizer 18 is further included between the BL side polarizing plate 1 described above and the optical conversion member 11 described above, an aspect in which the circular polarization reflection polarizer 18 described above is a circular polarization reflection polarizer including the light reflecting layer 14B which is formed by fixing a cholesteric liquid crystalline phase, and the λ/4 plates 12 arranged between the light reflecting layer 14B and the polarizing plate 1 described above is illustrated in FIG. 17.

In the optical sheet member of the present invention, it is preferable that the optical conversion member is pattern-formed at least at every two or more types of fluorescent wavelengths from a viewpoint of light utilization efficiency.

Examples of an aspect in which the optical conversion member is pattern-formed at least at every two or more types of fluorescent wavelengths are able to preferably include the following aspects.

When the optical conversion member is pattern-formed, an organic fluorescent material, an inorganic fluorescent material, and preferably a quantum dot material (for example, R and G) are dispersed in a binder such as an acrylic binder and an epoxy-based binder or in a photoresist material, and then is pattern-formed on a base film by using gravure printing, ink jet printing, or photolithography, and thus is formed into the shape of a stripe (or a dot) at a line width of less than or equal to a pixel pitch of a liquid crystal panel, and therefore, pattern formation of the optical conversion member is able to be realized. In addition, the optical sheet member of the present invention using an optical sheet member having a periodic pattern shape of a fluorescent body at a pixel pitch is pattern matched according to a CF pixel of the liquid crystal panel, and thus it is possible to improve a light utilization rate. In alignment of the pattern, it is possible to use an alignment panel bonding device and the like which are used for bonding pattern retardation film (FPR) used in a 3D TV. In addition, when a system enhancing collimating properties of light between a fluorescent body pattern and a panel pixel (an anisotropic layer of a refractive index such as a lens sheet and a fiber lens, a louver, and the like) is used, an effect of enhancing brightness further increases.

In addition, aspects disclosed in JP2010-138523A are also able to be preferably used as the aspect in which the optical conversion member is pattern-formed at least at every two or more types of fluorescent wavelengths, and the contents disclosed in this publication are also incorporated in the present invention.

<Adhesive Layer>

In the optical sheet member of the present invention, it is preferable that the optical conversion member (D) and the reflection polarizer (B) are laminated in direct contact with each other or through an adhesive layer.

In the optical sheet member of the present invention, it is preferable that the polarizing plate, the optical conversion member (D), the λ/4 plate (C), and the reflection polarizer (B) are sequentially laminated in direct contact with each other or through an adhesive layer.

Examples of a method of laminating these members in direct contact with each other are able to include a method of laminating the members by applying a member onto the other member.

In addition, the adhesive layer may be arranged between the members. Examples of the adhesive layer used for laminating the optical anisotropic layer and the polarizing plate include a substance in which a ratio of a modulus of storage elasticity G' and a modulus of loss elasticity G" (tan δ=G"/G') measured by a dynamic viscoelasticity measurement device is 0.001 to 1.5, that is, an adhesive agent or a substance which is easily crept. Examples of an adhesive agent which is able to be used in the present invention include an acrylic adhesive agent or a polyvinyl alcohol-based adhesive agent, but the present invention is not limited thereto.

In the optical sheet member of the present invention, a refractive index difference between the reflection polarizer (B) and a layer adjacent to the reflection polarizer (B) on the polarizing plate side is preferably less than or equal to 0.15, is more preferably less than or equal to 0.10, and is particularly preferably less than or equal to 0.05. Examples of the layer adjacent to the reflection polarizer (B) on the polarizing plate side are able to include the adhesive layer described above.

An adjustment method of the refractive index of such a adhesive layer is not particularly limited, and methods disclosed in JP1999-223712A (JP-H11-223712A) are able to be used as the adjustment method. Among the methods disclosed in 223712A (JP-H11-223712A), the following aspect is particularly preferable.

Examples of the adhesive agent used in the adhesive layer described above are able to include resins such as a polyester-based resin, an epoxy-based resin, a polyurethane-based resin, a silicone-based resin, and an acrylic resin. These resins may be independently used or two or more types thereof may be used by being mixed. In particular, the acrylic resin is preferable from a viewpoint of excellent reliability such as waterproofness, heat resistance, and light resistance, an excellent adhesion force and transparency, and ease of adjusting a refractive index to be suitable for a liquid crystal display. Examples of the acrylic adhesive agent are able to include an acrylic acid and ester thereof, a methacrylic acid and ester thereof, a homopolymer of an acryl monomer such as acryl amide and acrylonitrile or a copolymer thereof, and a copolymer of at least one type of the acryl monomers described above and an aromatic vinyl monomer such as vinyl acetate, a maleic anhydride, and styrene. In particular, it is preferable that the examples of the acrylic adhesive agent include a main monomer expressing adhesiveness, such as ethylene acrylate, butyl acrylate, and 2-ethyl hexyl acrylate, a monomer which becomes a cohesive component, such as vinyl acetate, acrylonitrile, acryl amide, styrene, methacrylate, and methyl acrylate, and a copolymer which improves an adhesion force or applies a starting point of cross-linkage, and is formed of a functional group-containing monomer such as a methacrylic acid, an acrylic acid, an itaconic acid, hydroxy ethyl methacrylate, hydroxy propyl methacrylate, dimethyl amino ethyl methacrylate, acryl amide, methylol acryl amide, glycidyl methacrylate, and maleic anhydride in which glass transition point (Tg) is in a range of −60° C. to −15° C., and a weight average molecular weight is in a range of 200,000 to 1,000,000.

As a curing agent, one type or two or more types of a metal chelate-based cross-linking agent, an isocyanate-based cross-linking agent, an epoxy-based cross-linking agent are used by being mixed, as necessary. It is practically preferable that such an acrylic adhesive agent is mixed such that an adhesion force is in a range of 100 g/25 mm to 2,000 g/25 mm in a state of containing fillers described below. When the adhesion force is less than 100 g/25 mm, environment resistance deteriorates, and in particular, peeling off may occur at high temperature and high humidity, whereas when the adhesion force is greater than 2000 g/25 mm, rebonding is not able to be performed, and even when the rebonding is able to be performed, the adhesive agent may remain. The refractive index of the acrylic adhesive agent (B method in JIS K-7142) is preferably in a range of 1.45 to 1.70, and is particularly preferably in a range of 1.5 to 1.65.

The fillers for adjusting the refractive index are contained in the adhesive agent. Examples of the fillers are able to include an inorganic white pigment such as silica, calcium carbonate, aluminum hydroxide, magnesium hydroxide, clay, talc, and titanium dioxide, an organic transparent or white pigment such as an acrylic resin, a polystyrene resin, a polyethylene resin, an epoxy resin, and a silicone resin, and the like. When the acrylic adhesive agent is selected, silicone beads and epoxy resin beads are preferable from a viewpoint of having excellent dispersion properties with respect to the acrylic adhesive agent and of obtaining an excellent and homogeneous refractive index. In addition, it is preferable that the fillers are spherical fillers having homogeneous light diffusion.

The particle diameter of such fillers (JIS B9921) is preferably 0.1 µm to 20.0 µm, and is more preferably in a range of 1.0 µm to 10.0 µm. In particular, the particle diameter of the fillers is preferably in a range of 0.5 µm to 10 µm.

In the present invention, the refractive index of the filler (B method in JIS K-7142) preferably has a difference of 0.05 to 0.5 with respect to the refractive index of the adhesive agent, and more preferably has a difference of 0.05 to 0.3.

The content of the fillers in the diffusion adhesive layer is 1.0 mass % to 40.0 mass %, and in particular, is preferably 3.0 mass % to 20 mass %.

[Image Display Device]

A first aspect of the image display device of the present invention includes the optical sheet member of the first aspect of the present invention and the backlight unit, a backlight unit includes a light source emitting blue light which has an emission center wavelength in a wavelength range of 430 nm to 480 nm and a peak of emission intensity having a half-value width of less than or equal to 100 nm, and the backlight unit includes a reflection member which converts a polarization state of light emitted from the light source and reflected on the optical sheet member and reflects the light in a rear portion of the light source.

A second aspect of the image display device of the present invention includes the optical sheet member of the second aspect of the present invention and a backlight unit, the backlight unit includes a light source emitting UV light which has an emission center wavelength in a wavelength range of 300 nm to 430 nm and a peak of emission intensity having a half-value width of less than or equal to 100 nm, and the backlight unit includes a reflection member which converts a polarization state of light emitted from the light source and reflected on the optical sheet member and reflects the light in a rear portion of the light source.

When directivity of a light ray of the light source is high (the light is condensed on a front surface), a difference between a wavelength applying a peak of light emitting intensity of the blue light or the UV light of the backlight unit and a wavelength applying a peak of reflectivity of the brightness enhancement film may not exist, but when the directivity of the light source is low (a diffusion light source having low light condensing properties), the difference is preferably 0 nm to 100 nm, is more preferably 5 nm to 70 nm, and is even more preferably 10 nm to 50 nm, in consideration of a shortwave shift in a reflection band in an inclined direction of the reflection polarizer.

<Backlight Unit>

The configuration of the backlight unit may be an edge light mode in which a light guide plate, a reflection plate, or the like is used as a configuration member, or may be a direct backlight mode, and it is preferable that the backlight unit includes the reflection member in the rear portion of the light source, which converts the polarization state of the light emitted from the light source and reflected on the optical sheet member and reflects the light. Such a reflection member is not particularly limited, but known reflection members disclosed in JP3416302B, JP3363565B, JP4091978B, JP3448626B, and the like are able to be used as the reflection member, and the contents of the publications are incorporated in the present invention.

In the first aspect of the image display device of the present invention, it is preferable that the light source of the backlight unit includes a blue light emitting diode emitting the blue light described above.

In the second aspect of the image display device of the present invention, it is preferable that the light source of the backlight unit includes an UV light emitting diode emitting UV light.

In the first aspect of the image display device of the present invention, it is preferable that the backlight unit includes a wavelength selective filter for a blue color which selectively transmits light having a wavelength shorter than 460 nm among the blue light rays.

Such a wavelength selective filter for a blue color is not particularly limited, but known wavelength selective filters for a blue color disclosed in JP2008-52067A and the like are able to be used, and the contents of this publication are incorporated in the present invention.

In addition, it is preferable that the backlight unit includes a known diffusion plate or diffusion sheet, a prism sheet (for example, BEF and the like), and a light guide device. Examples of other members include members disclosed in JP3416302B, JP3363565B, JP4091978B, JP3448626B, and the like, and the contents of the publications are incorporated in the present invention.

In addition, the directivity of the light source is controlled by including the diffusion sheet and the prism sheet (for example, the BEF and the like) between the optical sheet member and the liquid crystal panel backlight side polarizing plate of the present invention, and thus it is possible to prepare a preferred image display device.

<Display Panel>

Examples of the image display device described above are able to include a liquid crystal display (LCD), a plasma display (PDP), an electroluminescence display (OELD or IELD), a field emission display (FED), a touch panel, electronic paper, and the like.

A preferred example of a display panel of the image display device is a transmissive mode liquid crystal panel, and the panel includes a liquid crystal cell between a pair of polarizers. In general, a retardation film for compensating a view angle is arranged between each of the polarizers and the liquid crystal cell. The configuration of the liquid crystal cell is not particularly limited, and a liquid crystal cell having a general configuration is able to be adopted. The liquid crystal cell, for example, includes a pair of substrates which are arranged to face each other, and a liquid crystal layer interposed between the pair of substrates, and as necessary, may include a color filter layer and the like. The driving mode of the liquid crystal cell is not particularly limited, and various modes such as a twisted nematic (TN) mode, a super twisted nematic (STN) mode, a vertical alignment (VA) mode, an in-plane switching (IPS) mode, and an optically compensated bend cell (OCB) mode are able to be used.

It is preferable that the liquid crystal cell used in the image display device having a liquid crystal panel of the present invention is in a VA mode, an OCB mode, an IPS mode, or a TN mode, but the present invention is not limited thereto.

In the liquid crystal cell of the TN mode, rod-like liquid crystal molecules are substantially horizontally aligned at the time of not applying a voltage, and are twistedly aligned by 60° to 120°. The liquid crystal cell of the TN mode is mostly used as a color TFT liquid crystal display device, and is disclosed in a plurality of literatures.

In the liquid crystal cell of the VA mode, the rod-like liquid crystal molecules are substantially vertically aligned at the time of not applying a voltage. The liquid crystal cell of the VA mode includes (1) a liquid crystal cell of a VA mode in the narrow sense in which rod-like liquid crystal molecules are substantially vertically aligned at the time of not applying a voltage, and are substantially horizontally aligned at the time of applying a voltage (disclosed in JP1990-176625A (JP-H02-176625A)), (2) a liquid crystal cell for widening a view angle in which a VA mode is a multidomain (an MVA mode) (disclosed in SID97, Digest of tech. Papers (Proceedings) 28 (1997) 845), (3) a liquid crystal cell of a mode (an n-ASM mode) in which rod-like liquid crystal molecules are substantially vertically aligned at the time of not applying a voltage, and are twistedly multidomain-aligned at the time of applying a voltage (disclosed in Proceedings of Japan Liquid Crystal Conference 58 to 59 (1998)), and (4) a liquid crystal cell of a SURVIVAL mode (published in LCD International 98). In addition, the liquid crystal cell may be any one of a Patterned Vertical Alignment (PVA) type liquid crystal cell, an Optical Alignment type liquid crystal cell, and a Polymer-Sustained Alignment (PSA) liquid crystal cell. The details of these modes are specifically disclosed in JP2006-215326A and JP2008-538819A.

In the liquid crystal cell of the IPS mode, the rod-like liquid crystal molecules are aligned to be substantially parallel to the substrate, and an electric field which is parallel to the surface of the substrate is applied, and thus the liquid crystal molecule planarly responds. In the IPS mode, black display is performed in a state of not applying an electric field, and the absorption axes of a pair of upper and lower polarizing plates are orthogonal to each other. Methods in which leaked light in the inclined direction at the time of the black display is reduced by using the optical compensate sheet, and thus a view angle is improved are disclosed in JP1998-54982A (JP-H10-54982A), JP1999-202323A (JP-H11-202323A), JP1997-292522A (JP-H09-292522A), JP1999-133408A (JP-H11-133408A), JP1999-305217A (JP-H11-305217A), JP1998-307291A (JP-H10-307291A), and the like.

It is preferable that an embodiment of the liquid crystal display device includes a liquid crystal cell in which a liquid crystal layer is interposed between facing substrates of which at least one includes an electrode, and the liquid crystal cell is configured by being arranged between two polarizing plates. The liquid crystal display device includes the liquid crystal cell in which a liquid crystal is sealed between upper and lower substrates, changes the alignment state of the liquid crystal by applying a voltage, and thus displays an image. Further, as necessary, the liquid crystal display device includes an associated functional layer such as a polarizing plate protective film or an optical compensate member performing optical compensation, and an adhesive layer. In addition, the image display device of the present invention may include other members. For example, a surface layer such as a forward scattering layer, a primer layer, an antistatic layer, and an undercoat layer may be arranged along with (or instead of) a color filter substrate, a thin layer transistor substrate, a lens film, a diffusion sheet, a hard coat layer, an antireflection layer, a low reflection layer, an antiglare layer, and the like.

Figure 11:
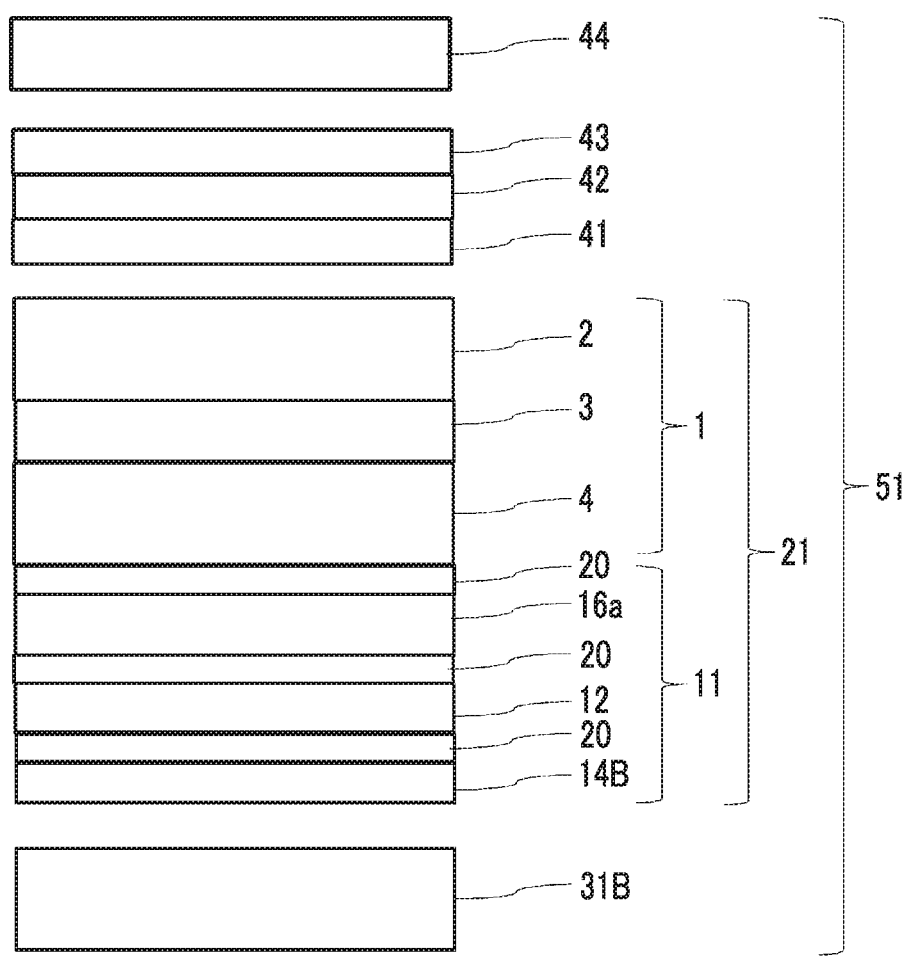
FIG. 11 is a schematic view illustrating a sectional surface of an example of a liquid crystal display device which is an image display device of the present invention.

In FIG. 11, an example of a configuration of a case where the first aspect of the image display device of the present invention is a liquid crystal display device is illustrated. In FIG. 11, an image display device 51 is formed by laminating the backlight unit 31, the optical sheet member 21 of the present invention (a laminated body of the brightness enhancement film 11 and the backlight side polarizing plate 1), a thin layer transistor substrate 41, a liquid crystal cell 42, a color filter substrate 43, and a display side polarizing plate 44 in this order.

Furthermore, the configuration of the optical sheet member 21 of the present invention is illustrated in FIG. 11 by using the configuration of FIG. 2 as a representative example, but the image display device of the present invention is not limited to the configuration of FIG. 11 by such an example.

(Color Filter)

When the light source uses visible B of less than or equal to 500 nm, a pixel in the present invention is able to be formed by using various known methods as a method of forming an RGB pixel. For example, a photomask is able to be formed on a glass substrate, a desired black matrix is able to be formed thereon by using the photoresist, and a pixel pattern of R, G, B is able to be formed thereon, and an ink composition is discharged by using a printing device of an ink jet method until a desired concentration is obtained in a region (a concave portion surrounded by a convex portion) which is partitioned by a black matrix having a predetermined width and a black matrix having a width wider than that of the black matrix described above at every n black matrices by using a coloring ink for a pixel of R, G, and B, and thus a color filter formed of the pattern of R, G, and B is able to be prepared. After image coloring, each pixel and the black matrix may be completely cured by baking or the like.

Preferred properties of the color filter are disclosed in JP2008-083611A and the like, and the contents of the publications are incorporated in the present invention.

For example, it is preferable that one wavelength at which the transmittance is half of the maximum transmittance in a color filter exhibiting a green color is greater than or equal to 590 nm and less than or equal to 610 nm, and the other is greater than or equal to 470 nm and less than or equal to 500 nm. In addition, it is preferable that one wavelength at which the transmittance is half of the maximum transmittance described above in the color filter exhibiting a green color is greater than or equal to 590 nm and less than or equal to 600 nm. Further, it is preferable that the maximum transmittance of the color filter exhibiting a green color is greater than or equal to 80%. It is preferable that a wavelength at which the transmittance is the maximum transmittance in the color filter exhibiting a green color is greater than or equal to 530 nm and less than or equal to 560 nm.

In the light source of the light source unit described above, it is preferable that the wavelength of a light emitting peak in a wavelength region of greater than or equal to 600 nm and less than or equal to 700 nm is greater than or equal to 620 nm and less than or equal to 650 nm. The light source of the light source unit described above has a light emitting peak in a wavelength region of greater than or equal to 600 nm and less than or equal to 700 nm, and in the color filter exhibiting a green color, it is preferable that the transmittance at the wavelength of the light emitting peak described above is less than or equal to 10% of the maximum transmittance.

In the color filter exhibiting the red color described above, it is preferable that the transmittance at a wavelength of greater than or equal to 580 nm and less than or equal to 590 nm is less than or equal to 10% of the maximum transmittance.

As the pigment for a color filter, in a blue color, a complementary pigment C.I. Pigment Violet 23 is used in C.I. Pigment Blue 15:6. In a red color, C.I. Pigment Yellow 139 is used in C.I. Pigment Red 254 as a pigment for a complementary color. As the pigment for a green color, in general, C.I. Pigment Yellow 150, C.I. Pigment Yellow 138, and the like are used in C.I. Pigment Green 36 (copper bromide phthalocyanine green) and C.I. Pigment Green 7 (copper chloride phthalocyanine green) as a pigment for a complementary color. These pigments are able to be controlled by adjusting the composition of the pigment. The composition of the complementary pigment is increased by a small amount with respect to a comparative example, and thus it is possible to set a half-value wavelength on the long wavelength side to be in a range of 590 nm to 600 nm. Furthermore, currently, the pigment is generally used, but a color filter of a dye may be used insofar as the pigment is able to control a spectrum and to ensure process stability and reliability.

(Black Matrix)

In the image display device of the present invention, the black matrix is arranged between the respective pixels. Examples of a material forming a black stripe include a material using a sputtered film of metal such as chromium, a light shielding photosensitive composition in which a photosensitive resin, a black coloring agent, and the like are combined, and the like. Specific examples of the black coloring agent include carbon black, titanium carbon, iron oxide, titanium oxide, graphite, and the like, and among them, the carbon black is preferable.

(Thin Layer Transistor)

It is preferable that the image display device of the present invention further includes a TFT substrate including a thin layer transistor (hereinafter, referred to as a TFT).

It is preferable that the thin layer transistor described above includes an oxide semiconductor layer having a carrier concentration of less than $1 \times 10^{14}/cm^3$. A preferred aspect of the thin layer transistor described above is disclosed in JP2011-141522A, and the contents of the publication are incorporated in the present invention.

<Method of Bonding Optical Sheet Member to Image Display Device>

A known method is able to be used as a method of bonding the optical sheet member of the present invention to the image display device such as a liquid crystal display device. In addition, a roll-to-panel manufacturing method is able to be used, and the roll-to-panel manufacturing method is preferable from a viewpoint of improving productivity and yield. The roll-to-panel manufacturing method is disclosed in JP2011-48381A, JP2009-175653A, JP4628488B, JP4729647B, WO2012/014602A, WO2012/014571A, and the like, but the present invention is not limited thereto.

EXAMPLES

Hereinafter, the characteristics of the present invention will be more specifically described with reference to examples and comparative examples. Materials, used amounts, ratios, treatment contents, treatment sequences, and the like of the following examples are able to be suitably changed unless the changes cause deviance from the gist of the present invention. Therefore, the range of the present invention will not be restrictively interpreted by the following specific examples.

Manufacturing Example 1

<Preparation of Polarizing Plate>

A retardation film was prepared by using a commercially available cellulose acylate-based film "TD60" (manufactured by Fujifilm Corporation) as a front-side polarizing plate protective film of a backlight side polarizing plate.

A commercially available cellulose acylate-based film "TD60" (manufactured by Fujifilm Corporation) was used as a rear-side polarizing plate protective film of the backlight side polarizing plate, and a thinner optical sheet member was able to be prepared by using a cellulose acylate-based film having a thickness of preferably less than or equal to 40 μm, and more preferably less than or equal to 25 μm.

As described in "0219" to "0220" of JP2006-293275A, a polarizer was manufactured, and the retardation film and the polarizing plate protective film described above were bonded to both surfaces of the polarizer, and thus a polarizing plate was manufactured. In addition, when the optical member sheet of the present invention is bonded to the polarizing plate, a part or all of the optical member sheet such as a λ/4 plate is able to function as a protective film on one side of the polarizing plate.

Manufacturing Example 2

<Preparation of Polarizing Plate>

A polarizing plate was manufactured by bonding the retardation film and the polarizing plate protective film onto both surfaces of the polarizer, respectively, by the same method as that in Manufacturing Example 1 except that a long film 1 having a thickness of 40 μm obtained by supplying a pellet of a mixture [Tg of 127° C.] of 90 parts by mass of an acrylic resin having a lactone ring structure {a copolymerization monomer mass ratio=methyl methacrylate/methyl 2-(hydroxymethyl) acrylate=8/2, a lactone ring formation rate of approximately 100%, a content ratio of the lactone ring structure of 19.4%, a weight average molecular weight of 133000, a melt flow rate of 6.5 g/10 minutes (240° C. and 10 kgf), and Tg of 131° C.} and 10 parts by mass of an acrylonitrile-styrene (AS) resin {Toyo AS AS20, manufactured by Toyo-Styrene Co., Ltd.} to a biaxial extruder, and by melting and extruding the pellet at approximately 280° C. into the shape of a sheet was used as the rear side polarizing plate protective film of the backlight side polarizing plate.

Manufacturing Example 3

<Preparation of Polarizing Plate>

A polarizing plate was manufactured by bonding the retardation film and the polarizing plate protective film onto both surfaces of the polarizer, respectively, by the same method as that in Manufacturing Example 1 except that a commercially available COP film "Zeonor ZF14" (manufactured by Zeon Corporation) was used as the rear side polarizing plate protective film of the backlight side polarizing plate.

Example 1-A

<Formation of Optical Conversion Member>

A quantum dot sheet (a quantum dot material (G,R)) which emitted fluorescent light of green light having a center wavelength of 540 nm and a half-value width of 40 nm and red light having a center wavelength of 645 nm and a half-value width of 30 nm when blue light of a blue light emitting diode was incident thereon was formed as the optical conversion member with reference to JP2012-169271A.

The obtained quantum dot sheet and the polarizing plate 1 manufactured in Manufacturing Example 1 described above were arranged through an air layer.

<Formation of B Narrowband λ/4 Plate>

A second λ/4 plate (a B narrowband λ/4 plate) was prepared on a commercially available cellulose acylate-based film "TD60" (manufactured by Fujifilm Corporation) by using a discotic liquid crystal with reference to JP2012-108471A.

In the obtained second λ/4 plate, that is, the B narrowband λ/4 plate, Re(450) was 112 nm, Re(550) was 93 nm, and the film thickness including TAC was approximately 60 μm.

<Formation of Reflection Polarizer>

A light reflecting layer formed by fixing a cholesteric liquid crystalline phase was formed on the B narrowband λ/4 plate described above according to direct coating by changing the added amount of a chiral agent used with reference to JP2013-203827A (disclosed in "0016" to "0148") and Fuji Film Research & Development No. 50 (2005) pp. 60 to 63.

In the obtained light reflecting layer, the reflection center wavelength of the peak of the maximum reflectivity was 445 nm, the half-value width was 70 nm, the film thickness was 2.5 μm, Δn of the liquid crystal was 0.12, and the average refractive index was 1.57. In addition, when the light reflecting layer having Δn of the liquid crystal of 0.17 was used, the reflection center wavelength of 450 nm, the half-value width of 100 nm, and the film thickness of 2.5 μm were able to be realized.

As described above, a laminated body in which the polarizing plate, the optical conversion member (the quantum dot sheet), the B narrowband λ/4 plate+a cholesteric reflection polarizer were laminated through an air layer was an optical sheet member of Example 1-A.

<Manufacturing of Liquid Crystal Display Device>

A liquid crystal display device (a product name of KDL-46W900A, manufactured by Sony Corporation) including a commercially available quantum dot type backlight was used, the optical sheet member of Example 1-A was used as the backlight side polarizing plate, the TV described above was disassembled, a quantum dot (a glass enclosed bar type quantum dot) was extracted, the quantum dot type backlight was changed to a B narrowband (450 nm) backlight unit, and thus a liquid crystal display device of Example 1-A was manufactured.

The B narrowband backlight unit included a blue light emitting diode (Blue, a main wavelength of 450 nm, and a half-value width of 20 nm) as a light source. In addition, the B narrowband backlight unit included a reflection member which converted a polarization state of light emitted from the light source and reflected on the optical sheet member and reflected the light in a rear portion of the light source.

Example 1

<Formation of Optical Conversion Member>

A quantum dot sheet (a quantum dot material (G,R)) which emitted fluorescent light of green light having a center wavelength of 540 nm and a half-value width of 40 nm and red light having a center wavelength of 645 nm and a half-value width of 30 nm when blue light of a blue light emitting diode was incident thereon was formed as the optical conversion member with reference to JP2012-169271A.

The obtained quantum dot sheet and the polarizing plate 1 manufactured in Manufacturing Example 1 described above were bonded to each other by using an acrylic adhesive agent having a refractive index of 1.47.

<Formation of B Narrowband λ/4 Plate>

A B narrowband λ/4 plate was prepared with reference to JP2012-108471A.

In the obtained B narrowband λ/4 plate, Re(450) was 112 nm, Re(550) was 93 nm, and the film thickness was 60 μm.

The obtained B narrowband λ/4 plate and the optical conversion member manufactured as described above were bonded to each other by using an acrylic adhesive agent having a refractive index of 1.47.

<Formation of Reflection Polarizer>

A light reflecting layer formed by fixing a cholesteric liquid crystalline phase was formed on a support body with coating by changing the added amount of a chiral agent used with reference to JP2013-203827A (disclosed in "0016" to "0148") and Fuji Film Research & Development No. 50 (2005) pp. 60 to 63.

In the obtained light reflecting layer, the reflection center wavelength of the peak of the maximum reflectivity was 445 nm, the half-value width was 70 nm, the film thickness was 2.5 μm, Δn of the liquid crystal was 0.12, and the average refractive index was 1.57. In addition, when the light reflecting layer having Δn of the liquid crystal of 0.17 was used, the reflection center wavelength of 450 nm, the half-value width of 100 nm, and the film thickness of 2.5 μm were able to be realized.

Only the light reflecting layer formed as described above was peeled off from the support body, and was transferred onto the obtained B narrowband λ/4 plate.

The total thickness of a brightness enhancement film including the obtained quantum dot sheet, the B narrowband λ/4 plate, and the reflection polarizer was 2.5 μm.

Thus, a laminated body of the obtained polarizing plate and the brightness enhancement film was an optical sheet member of Example 1.

<Manufacturing of Liquid Crystal Display Device>

A commercially available liquid crystal display device (a product name of TH-L42D2, manufactured by Panasonic Corporation) was disassembled, the optical sheet member of Example 1 was used as the backlight side polarizing plate, and a backlight unit was changed to the following B narrowband backlight unit, and thus a liquid crystal display device of Example 1 was manufactured.

The used B narrowband backlight unit included a blue light emitting diode (B-LED manufactured by Nichia Corporation: Blue, a main wavelength of 465 nm, and a half-value width of 20 nm) as a light source. In addition, the B narrowband backlight unit included a reflection member which converted a polarization state of light emitted from the light source and reflected on the optical sheet member described above and reflected the light in a rear portion of the light source.

Example 2-A

<Formation of Optical Conversion Member>

A quantum dot sheet (a quantum dot material (B,G,R)) which emitted fluorescent light of blue light having a center wavelength of 460 nm and a half-value width of 40 nm, green light having a center wavelength of 560 nm and a half-value width of 40 nm, and red light having a center wavelength of 610 nm and a half-value width of 40 nm when UV light of an UV light emitting diode was incident thereon was formed by using a quantum dot "Lumidot (registered trademark)" manufactured by Nanoco Technologies Limited and distributed by Sigma-Aldrich Corporation as the optical conversion member.

<Formation of UV Narrowband λ/4 Plate>

An UV narrowband λ/4 plate using a COP material which was not absorbed in an UV range was prepared with reference to JP2003-270435A.

In the obtained UV narrowband λ/4 plate, Re(380) was 95 nm, Re(450) was 95 nm, and the film thickness was 40 μm.

<Formation of Reflection Polarizer>

One light reflecting layer formed by fixing a cholesteric liquid crystalline phase was formed on the λ/4 plate described above with direct coating by changing the added amount of a chiral agent used with reference to JP2013-203827A (disclosed in "0016" to "0148") and Fuji Film Research & Development No. 50 (2005) pp. 60 to 63.

In the obtained light reflecting layer, the reflection center wavelength of the peak of the maximum reflectivity was 385 nm, the half-value width was 70 nm, the film thickness was 2.5 μm, and the average refractive index was 1.57.

The total thickness of a brightness enhancement film including the obtained UV narrowband λ/4 plate and the reflection polarizer was 43 μm.

Thus, a laminated body formed by laminating the obtained quantum dot sheet, the polarizing plate 1 manufactured in Manufacturing Example 1 described above, and the brightness enhancement film through an air layer was an optical sheet member of Example 2-A.

<Manufacturing of Liquid Crystal Display Device>

A commercially available liquid crystal display device (a product name of TH-L42D2, manufactured by Panasonic Corporation) was disassembled, the optical sheet member of Example 2-A was used as the backlight side polarizing plate, and a backlight unit was changed to the following UV narrowband backlight unit, and thus a liquid crystal display device of Example 2-A was manufactured.

The used UV narrowband backlight unit included an UV light emitting diode (UV-LED manufactured by Nichia Corporation: NC4U133A, a main wavelength of 365 nm, and a half-value width of 9 nm) as a light source. In addition, the UV narrowband backlight unit included a reflection member which converted a polarization state of light emitted from the light source and reflected on the optical sheet member described above and reflected the light in a rear portion of the light source.

Furthermore, the obtained liquid crystal display device of Example 2-A included a thin layer transistor which included an oxide semiconductor layer having a carrier concentration of less than $1 \times 10^{14}/cm^3$.

Example 2

<Formation of Optical Conversion Member>

A quantum dot sheet (a quantum dot material (B,G,R)) which emitted fluorescent light of blue light having a center wavelength of 460 nm and a half-value width of 40 nm, green light having a center wavelength of 560 nm and a half-value width of 40 nm, and red light having a center wavelength of 610 nm and a half-value width of 40 nm when UV light of an UV light emitting diode was incident thereon was formed by using a quantum dot "Lumidot (registered trademark)" manufactured by Nanoco Technologies Limited and distributed by Sigma-Aldrich Corporation as the optical conversion member.

The obtained quantum dot sheet and the polarizing plate 1 manufactured in Manufacturing Example 1 described above were bonded to each other by using an acrylic adhesive agent having a refractive index of 1.47.

<Formation of UV Narrowband λ/4 Plate>

An UV narrowband λ/4 plate using a COP material which was not absorbed in an UV range was prepared with reference to JP2003-270435A.

In the obtained UV narrowband λ/4 plate, Re(380) was 95 nm, Re(450) was 95 nm, and the film thickness was 40 μm.

The obtained UV narrowband λ/4 plate and the optical conversion member manufactured as described above were bonded to each other by using an acrylic adhesive agent having a refractive index of 1.47.

<Formation of Reflection Polarizer>

One light reflecting layer formed by fixing a cholesteric liquid crystalline phase was formed on a support body with coating by changing the added amount of a chiral agent used with reference to JP2013-203827A (disclosed in "0016" to "0148") and Fuji Film Research & Development No. 50 (2005) pp. 60 to 63.

In the obtained light reflecting layer, the reflection center wavelength of the peak of the maximum reflectivity was 385 nm, the half-value width was 70 nm, the film thickness was 2.5 μm, and the average refractive index was 1.57.

Only the light reflecting layer formed as described above was peeled off from the support body, and was transferred onto the obtained UV narrowband λ/4 plate.

The total thickness of a brightness enhancement film including the obtained UV narrowband λ/4 plate and the reflection polarizer was 43 μm.

Thus, a laminated body of the obtained polarizing plate and the brightness enhancement film was an optical sheet member of Example 2.

<Manufacturing of Liquid Crystal Display Device>

A commercially available liquid crystal display device (a product name of TH-L42D2, manufactured by Panasonic Corporation) was disassembled, the optical sheet member of Example 2-A was used as the backlight side polarizing plate, and a backlight unit was changed to the following UV narrowband backlight unit, and thus a liquid crystal display device of Example 2 was manufactured.

The used UV narrowband backlight unit included an UV light emitting diode (UV-LED manufactured by Nichia Corporation: NC4U133A, a main wavelength of 365 nm, and a half-value width of 9 nm) as a light source. In addition, the UV narrowband backlight unit included a reflection member which converted a polarization state of light emitted from the light source and reflected on the optical sheet member and reflected the light in a rear portion of the light source.

Furthermore, the obtained liquid crystal display device of Example 2 included a thin layer transistor which included an oxide semiconductor layer having a carrier concentration of less than $1 \times 10^{14}/cm^3$.

Example 3

An optical sheet member of Example 3 was manufactured by the same method as that in Example 1 except that the thickness of the brightness enhancement film was changed as shown in Table 1 described below by changing the thickness of the cholesteric layer in Example 1.

After that, a liquid crystal display device of Example 3 was manufactured by the same method as that in Example 1 except that the optical sheet member of Example 3 was used instead of the optical sheet member of Example 1, and the light source of the backlight was changed to B-LED manufactured by Nichia Corporation (Royal Blue, a main wavelength of 445 nm, and a half-value width of 20 nm) in the manufacturing of the liquid crystal display device of Example 1.

Example 4

An optical sheet member of Example 4 was manufactured by the same method as that in Example 2 except that the thickness of the brightness enhancement film was changed as shown in Table 1 described below by changing the thickness of the λ/4 layer in Example 2.

After that, a liquid crystal display device of Example 4 was manufactured by the same method as that in Example 2 except that the optical sheet member of Example 4 was used instead of the optical sheet member of Example 2, and the light source of the backlight was changed to UV-LED manufactured by Nichia Corporation (NC4U134A, a main wavelength of 385 nm, and a half-value width of 10 nm) in the manufacturing of the liquid crystal display device of Example 2.

Example 5

An optical sheet member of Example 5 was manufactured by the same method as that in Example 1 except that the polarizing plate 1 in Example 1 was changed to the polarizing plate 2 manufactured in Manufacturing Example 2.

After that, a liquid crystal display device of Example 5 was manufactured by the same method as that in Example 1 except that the optical sheet member of Example 5 was used instead of the optical sheet member of Example 1, and the light source of the backlight was changed to B-LED manufactured by Nichia Corporation (Royal Blue, a main wavelength of 445 nm, and a half-value width of 20 nm) in the manufacturing of the liquid crystal display device of Example 1.

Example 6

An optical sheet member of Example 6 was manufactured by the same method as that in Example 1 except that the polarizing plate 1 in Example 1 was changed to the polarizing plate 3 manufactured in Manufacturing Example 3.

After that, a liquid crystal display device of Example 6 was manufactured by the manufactured by the same method as that in Example 1 except that the optical sheet member of Example 6 was used instead of the optical sheet member of Example 1, and the light source of the backlight was changed to B-LED manufactured by Nichia Corporation (Royal Blue, a main wavelength of 445 nm, and a half-value width of 20 nm) in the manufacturing of the liquid crystal display device of Example 1.

Example 7

<Preparation of Quantum Dot Material Dispersed Adhesive Material>

Quantum dot materials which emitted fluorescent light of green light having a center wavelength of 560 nm and a half-value width of 40 nm and red light having a center wavelength of 610 nm and a half-value width of 40 nm when blue light of a blue light emitting diode was incident thereon were dispersed in an adhesive material prepared with reference to JP2003-13029A, and thus a quantum dot material dispersed adhesive material was prepared.

<Manufacturing of Optical Sheet Member and Liquid Crystal Display Device>

The retardation film prepared in Manufacturing Example 1 was bonded to one surface of the polarizer prepared in Manufacturing Example 1 by the same method as that in Manufacturing Example 1, and the B narrowband λ/4 plate prepared in Example 1 was bonded to the other surface of the polarizer by using the quantum dot material dispersed adhesive material prepared as described above. After that, a light reflecting layer formed by fixing a cholesteric liquid crystalline phase was formed on the B narrowband λ/4 plate by the same method as that in Example 1, and thus an optical sheet member of Example 7 was manufactured.

After that, a liquid crystal display device of Example 7 was manufactured by the same method as that in Example 1 except that the optical sheet member of Example 7 was used instead of the optical sheet member of Example 1, and the light source of the backlight was changed to B-LED manufactured by Nichia Corporation (Royal Blue, a main wavelength of 445 nm, and a half-value width of 20 nm) in the manufacturing of the liquid crystal display device of Example 1.

Example 8

<Preparation of Quantum Rod Dispersed CA>

In manufacturing of a cellulose acylate film disclosed in Example 1 of JP2011-121327A, quantum rods which emitted fluorescent light of green light having a center wavelength of 560 nm and a half-value width of 40 nm and red light having a center wavelength of 640 nm and a half-value width of 40 nm when blue light of a blue light emitting diode was incident thereon was dispersed in cellulose acylate in the amount of 0.1 mass %, and thus a quantum rod dispersed and stretched cellulose acylate film (in the following tables, referred to as quantum rod dispersed and stretched CA) was prepared. In this quantum rod dispersed and stretched cellulose acylate film, when light having a polarization degree of 99.9% was incident on the quantum rod dispersed and stretched cellulose acylate film, the polarization degree of the fluorescent light emitted from the quantum rod dispersed and stretched cellulose acylate film was 80%. In addition, it was confirmed that the polarization degree of the fluorescent light emitted from the quantum rod dispersed and stretched cellulose acylate film was enhanced according to stretching ratio UP.

<Manufacturing of Polarizing Plate 4>

The retardation film prepared in Manufacturing Example 1 was bonded to one surface of the polarizer prepared in Manufacturing Example 1 by the same method as that in Manufacturing Example 1, and the quantum rod dispersed and stretched cellulose acylate film prepared as described above was bonded to the other surface of the polarizer by the same method as that in Manufacturing Example 1, and thus a polarizing plate 4 was manufactured.

<Manufacturing of Optical Sheet Member and Liquid Crystal Display Device>

An optical sheet member of Example 8 was manufactured by the same method as that in Example 1 except that the polarizing plate 4 manufactured as described above was used instead of the polarizing plate 1 in Example 1.

After that, a liquid crystal display device of Example 8 was manufactured by the manufactured by the same method as that in Example 1 except that the optical sheet member of Example 8 was used instead of the optical sheet member of Example 1, and the light source of the backlight was changed to B-LED manufactured by Nichia Corporation (Royal Blue, a main wavelength of 445 nm, and a half-value width of 20 nm) in the manufacturing of the liquid crystal display device of Example 1.

Example 9

<Formation of Broadband λ/4 Plate>

As described in "0020" to "0033" of JP2003-262727A, a broadband λ/4 plate was prepared. The broadband λ/4 plate was obtained by applying a liquid crystal material of two layers onto a substrate, and by performing polymerization with respect to the liquid crystal material, and then by peeling off the liquid crystal material from the substrate.

In the obtained broadband λ/4 plate, Re(450) was 110 nm, Re(550) was 135 nm, Re(630) was 140 nm, and the film thickness was 1.6 µm.

<Manufacturing of Optical Sheet Member and Liquid Crystal Display Device>

An optical sheet member of Example 9 was manufactured by the same method as that in Example 1 except that the broadband λ/4 plate manufactured as described above was used instead of the B narrowband λ/4 plate, and the total thickness of the brightness enhancement film was changed as shown in Table 2 described below by changing the thickness of the λ/4 plate in Example 1.

After that, a liquid crystal display device of Example 9 was manufactured by the manufactured by the same method as that in Example 1 except that the optical sheet member of Example 9 was used instead of the optical sheet member of Example 1, and the light source of the backlight was changed to B-LED manufactured by Nichia Corporation (Royal Blue, a main wavelength of 445 nm, and a half-value width of 20 nm) in the manufacturing of the liquid crystal display device of Example 1.

Example 10

An optical sheet member and a liquid crystal display device of Example 10 were manufactured by the same method as that in Example 1 except that the broadband λ/4 plate manufactured in Example 9 was used instead of the B narrowband λ/4 plate, and the adhesive agent for adhesion between the reflection polarizer and the polarizing plate was changed to an adhesive agent having a refractive index of 1.55 in Example 1.

Example 11

The quantum dot sheet manufactured in Example 1 was bonded to the polarizing plate 1 manufactured in Manufacturing Example 1 by the same method as that in Example 1. After that, a B narrowband dielectric multilayer film 1 prepared by the following method was bonded to the quantum dot sheet by using the same adhesive agent as that of Example 1, and thus an optical sheet member of Example 11 was manufactured.

The B narrowband dielectric multilayer film 1 was manufactured such that the reflection center wavelength of the peak of the maximum reflectivity in a wavelength range corresponding to blue light was 465 nm, and the half-value width was 30 nm by changing the total thickness of the brightness enhancement film as shown in Table 2 described below with reference to IDW/AD '12, pp. 985 to 988 (2012).

A liquid crystal display device of Example 11 was manufactured by the same method as that in Example 1 except that the optical sheet member of Example 11 was used instead of the optical sheet member of Example 1 in the manufacturing of the liquid crystal display device of Example 1.

Example 12

The quantum rod dispersed and stretched cellulose acylate film prepared in Example 8 was bonded to the polarizing plate 2 manufactured in Manufacturing Example 2 by using the same adhesive agent as that of Example 1. After that, the B narrowband dielectric multilayer film 1 manufactured in Example 11 was bonded to the quantum rod dispersed and stretched cellulose acylate film by using the same adhesive agent as that of Example 1, and thus an optical sheet member of Example 12 was manufactured.

A liquid crystal display device of Example 12 was manufactured by the same method as that in Example 1 except that the optical sheet member of Example 12 was used instead of the optical sheet member of Example 1 in the manufacturing of the liquid crystal display device of Example 1.

Example 13

The quantum rod dispersed and stretched cellulose acylate film prepared in Example 8 was bonded to the polarizing plate 3 manufactured in Manufacturing Example 3 by using the same adhesive agent as that of Example 1. After that, the B narrowband dielectric multilayer film 1 manufactured in Example 11 was bonded to the quantum rod dispersed and stretched cellulose acylate film by using the same adhesive agent as that of Example 1, and thus an optical sheet member of Example 13 was manufactured.

A liquid crystal display device of Example 13 was manufactured by the same method as that in Example 1 except that the optical sheet member of Example 13 was used instead of the optical sheet member of Example 1 in the manufacturing of the liquid crystal display device of Example 1.

Example 14

The B narrowband dielectric multilayer film 1 manufactured in Example 11 was bonded to the polarizing plate 4 manufactured in Example 8 by using the same adhesive agent as that of Example 1, and thus an optical sheet member of Example 14 was manufactured.

A liquid crystal display device of Example 14 was manufactured by the same method as that in Example 1 except that the optical sheet member of Example 14 was used instead of the optical sheet member of Example 1 in the manufacturing of the liquid crystal display device of Example 1.

Example 15

The quantum dot sheet (the quantum dot material (B,G, R)) obtained in Example 2 and the polarizing plate 1 manufactured in Manufacturing Example 1 were bonded to each other by using an acrylic adhesive agent having a refractive index of 1.47. After that, an UV narrowband dielectric multilayer film 2 prepared by the following method was bonded to the quantum dot sheet by using the same adhesive agent as that of Example 1, and thus an optical sheet member of Example 15 was manufactured.

The UV narrowband dielectric multilayer film 2 was manufactured such that the reflection center wavelength of the peak of the maximum reflectivity in a wavelength range corresponding to UV light was 385 nm, and the half-value width was 30 nm by changing the total thickness of the brightness enhancement film as shown in Table 2 described below with reference to IDW/AD '12, pp. 985 to 988 (2012).

A liquid crystal display device of Example 15 was manufactured by the same method as that in Example 2 except that was the optical sheet member of Example 15 was used instead of the optical sheet member of Example 2, and the light source of the backlight was changed to UV-LED manufactured by Nichia Corporation (NC4U134A, a main wavelength of 385 nm, and a half-value width of 10 nm) in the manufacturing of the liquid crystal display device of Example 2.

Example 16

An optical sheet member and a liquid crystal display device of Example 16 were manufactured by the same method as that in Example 1 except that the center wavelength of the peak of the maximum reflectivity of the light reflecting layer was set to 435 nm, and the half-value width was set to 70 nm by changing the added amount of the chiral agent of the reflection polarizer in Example 1.

Example 17

A quantum rod 1 which emitted fluorescent light of green light having a center wavelength of 540 nm and a half-value width of 40 nm and a quantum rod 2 which emitted fluorescent light of red light having a center wavelength of 645 nm and a half-value width of 30 nm when blue light of a blue light emitting diode was incident thereon were formed as the optical conversion member with reference to U.S. Pat. No. 7,303,628B, an article (Peng, X. G.; Manna, L.; Yang, W. D.; Wickham, j.; Scher, E.; Kadavanich, A.; Alivisatos, A. P. Nature 2000, 404, 59-61), and an article (Manna, L.; Scher, E. C.; Alivisatos, A. P. j. Am. Chem. Soc. 2000, 122, 12700-12706). The quantum rods 1 and 2 were in the shape of a rectangular parallelepiped, and the average length of the major axis of the quantum rod was 30 nm. Furthermore, the average length of the major axis of the quantum rod was confirmed by using a transmission type electron microscope.

Next, a quantum rod dispersed PVA sheet in which the quantum rods were dispersed was prepared by the following method.

A sheet of an isophthalic acid copolymerized polyethylene terephthalate in which an isophthalic acid was copolymerized in the amount of 6 mol % (hereinafter, referred to as "amorphous PET") was prepared as a substrate. The glass transition temperature of the amorphous PET was 75° C. A laminated body formed of the amorphous PET substrate and a quantum rod alignment layer was prepared as follows. Here, the quantum rod alignment layer included the quantum rods 1 and 2 which were prepared by using polyvinyl alcohol (hereinafter, referred to as "PVA") as a matrix. In addition, the glass transition temperature of the PVA was 80° C.

4% concentration to 5% concentration of a PVA powder having a degree of polymerization of greater than or equal to 1,000 and a degree of saponification of greater than or equal to 99%, and 1% concentration of each of the quantum rods 1 and 2 prepared as described above were dissolved in water, and thus an aqueous solution of quantum rod-containing PVA was prepared. In addition, an amorphous PET substrate having a thickness of 200 μm was prepared. Next, the amorphous PET substrate having a thickness of 200 μm was coated with the aqueous solution of the quantum rod-containing PVA, and was dried at a temperature of 50° C. to 60° C., and thus a quantum rod-containing PVA layer having a thickness of 25 μm was formed on the amorphous PET substrate. A laminated body of the amorphous PET and the quantum rod-containing PVA was referred to as a quantum rod dispersed PVA sheet.

In the prepared quantum rod dispersed PVA sheet, the polarization degree of fluorescent light which was emitted from the quantum rod dispersed PVA sheet when light having a polarization degree of 99.9% was incident thereon was 80%.

A liquid crystal display device of Example 17 was manufactured by the same method as that in Example 8 except that the quantum rod dispersed PVA sheet formed as described above was used instead of the quantum rod dispersed and stretched cellulose acylate film in Example 8. An optical sheet member of Example 17 was manufactured by using the quantum rod dispersed PVA sheet described above and the same configuration as that of Example 8.

A liquid crystal display device (a product name of KDL-46W900A, manufactured by Sony Corporation) including a commercially available quantum dot type backlight was used, the optical sheet member of Example 17 was used as the backlight side polarizing plate, the TV described above was disassembled, a quantum dot (a glass enclosed bar type quantum dot) was extracted, and the quantum dot type backlight was changed to a B narrowband (450 nm) backlight unit, and thus a liquid crystal display device of Example 17 was manufactured.

The B narrowband backlight unit included a blue light emitting diode (Blue, a main wavelength of 450 nm, and a half-value width of 20 nm) as a light source.

Example 18

The quantum rod dispersed PVA sheet prepared in Example 17 was bonded to the polarizing plate 2 manufactured in Manufacturing Example 2 by using the same adhesive agent as that of Example 1. After that, the B narrowband cholesteric reflection polarizer manufactured in Example 8 was bonded to the quantum rod dispersed PVA sheet by using the same adhesive agent as that of Example 1, and thus an optical sheet member of Example 18 was manufactured.

In the manufacturing of the liquid crystal display device of Example 2, a liquid crystal display device of Example 18 was manufactured by using the optical sheet member of Example 18 instead of the optical sheet member of Example 2, by using the polarizing plate 2 manufactured in Manufacturing Example 2 as the backlight side polarizing plate, and by setting a broadband dielectric multilayer film (a product name of DBEF, manufactured by 3M Company) incorporated in a liquid crystal display device (a product name of KDL-46W900A, manufactured by Sony Corporation) between the optical member sheet and the polarizing plate 2.

Example 19

A quantum rod 1 which emitted fluorescent light of green light having a center wavelength of 540 nm and a half-value width of 40 nm, a quantum rod 2 which emitted fluorescent light of red light having a center wavelength of 645 nm and a half-value width of 30 nm, and a quantum rod 3 which emitted fluorescent light of blue light having a center wavelength of 450 nm and a half-value width of 20 nm when UV light of an UV light emitting diode was incident thereon were formed as the optical conversion member. The quantum rods 1, 2, and 3 were in the shape of a rectangular parallelepiped, and the average length of the major axis of the quantum rod was 30 nm. Furthermore, the average length of the major axis of the quantum rod was confirmed by using a transmission type electron microscope.

Next, a quantum rod dispersed PVA sheet in which the quantum rods were dispersed was prepared by the following method.

A sheet of an isophthalic acid copolymerized polyethylene terephthalate in which an isophthalic acid was copolymerized in the amount of 6 mol % (hereinafter, referred to as "amorphous PET") was prepared as a substrate. The glass transition temperature of the amorphous PET was 75° C. A laminated body formed of the amorphous PET substrate and a quantum rod alignment layer was prepared as follows. Here, the quantum rod alignment layer included the quantum rods 1, 2, and 3 which were prepared by using polyvinyl alcohol (hereinafter, referred to as "PVA") as a matrix. In addition, the glass transition temperature of the PVA was 80° C.

4% concentration to 5% concentration of a PVA powder having a degree of polymerization of greater than or equal to 1,000 and a degree of saponification of greater than or equal to 99%, and 1% concentration of each of the quantum rods 1 and 2 prepared as described above were dissolved in water, and thus an aqueous solution of quantum rod-containing PVA was prepared. In addition, an amorphous PET substrate having a thickness of 200 μm was prepared. Next, the amorphous PET substrate having a thickness of 200 μm was coated with the aqueous solution of the quantum rod-containing PVA, and was dried at a temperature of 50° C. to 60° C., and thus a quantum rod-containing PVA layer having a thickness of 25 μm was formed on the amorphous PET substrate. A laminated body of the amorphous PET and the quantum rod-containing PVA was referred to as a quantum rod dispersed PVA sheet.

The quantum rod dispersed PVA sheet described above was bonded to the polarizing plate 3 manufactured in Manufacturing Example 3 by the same adhesive agent as that of Example 1. After that, the brightness enhancement film including the UV narrowband λ/4 plate manufactured in Example 2 and an UV narrowband cholesteric reflection polarizer was bonded to the quantum rod dispersed PVA sheet by using the same adhesive agent as that of Example 1, and thus an optical sheet member of Example 19 was manufactured.

A liquid crystal display device of Example 19 was manufactured by the same method as that in Example 18 except that a broadband dielectric multilayer film (a product name of APF, manufactured by 3M Company) was used instead of the polarizing plate 2, and the UV light source used in Example 15 was used as the light source in the manufacturing of the liquid crystal display device of Example 18.

Example 20

The quantum rod dispersed PVA sheet prepared in Example 17 was bonded to the polarizing plate 1 manufactured in Manufacturing Example 1 by using the same adhesive agent as that of Example 1. After that, the B narrowband cholesteric reflection polarizer manufactured in Example 8 was bonded to the quantum rod dispersed PVA sheet by using the same adhesive agent as that of Example 1, and thus an optical sheet member of Example 20 was manufactured.

In the manufacturing of the liquid crystal display device of Example 17, a liquid crystal display device of Example 20 was manufactured by using the polarizing plate 1 which was manufactured by using the optical sheet member of Example 20 instead of the optical sheet member of Example 17 as the backlight side polarizing plate in Manufacturing Example 1, and by setting a B narrowband cholesteric and λ/4 layer which was prepared by the same method as that in Example 1 between the optical member sheet and the polarizing plate 1.

Example 21

The quantum rod dispersed PVA sheet prepared in Example 17 was bonded to the polarizing plate 2 manufactured in Manufacturing Example 2 by using the same adhesive agent as that of Example 1. After that, the B narrowband cholesteric reflection polarizer manufactured in Example 8 was bonded to the quantum rod dispersed PVA sheet by using the same adhesive agent as that of Example 1, and thus an optical sheet member of Example 21 was manufactured.

In the manufacturing of the liquid crystal display device of Example 8, a liquid crystal display device of Example 21 was manufactured by using the polarizing plate 2 which was manufactured by using the optical sheet member of Example 21 instead of the optical sheet member of Example 8 as the backlight side polarizing plate in Manufacturing Example 2, and by setting a B narrowband dielectric multilayer film which was prepared by the same method as that in Example 11 between the optical member sheet and the polarizing plate 2.

Comparative Example 1

A commercially available liquid crystal display device (a product name of TH-L42D2, manufactured by Panasonic Corporation) was disassembled, the polarizing plate 1 manufactured in Manufacturing Example 1 was used as the backlight side polarizing plate, and a dielectric multilayer film (a product name of DBEF, manufactured by 3M Company) was separately arranged between the backlight side polarizing plate and the backlight unit without disposing an adhesive agent, and thus a liquid crystal display device of Comparative Example 1 was manufactured.

The dielectric multilayer film (a product name of DBEF) had reflectivity of a flat peak with respect to an approximately constant wavelength in 450 nm to 550 nm to 630 nm of a blue region to a green region to a red region.

In the backlight light source of this liquid crystal display device, the light emitting peak wavelength of the blue light was 450 nm. In a green region to a red region, the number of light emitting peaks was one, the peak wavelength was 550 nm, and the half-value width was 100 nm.

Comparative Example 2

A broadband λ/4 plate prepared by the same method as that in Example 9 and the polarizing plate 1 manufactured as described above were bonded to each other by using an acrylic adhesive agent having a refractive index of 1.47.

An optical sheet member of Comparative Example 2 was manufactured by the same method as that in Example 1 except that five layers formed by fixing broadband cholesteric liquid crystalline phases were laminated instead of the first light reflecting layer, the second light reflecting layer, and the third light reflecting layer, and the total thickness of the brightness enhancement film was changed as shown in Table 2 described below in Example 1.

In addition, a liquid crystal display device of Comparative Example 2 was manufactured by the same method as that in Example 1 except that the optical sheet member of Comparative Example 2 was used instead of the optical sheet member of Example 1, and the same backlight unit as that of Comparative Example 1 was used without changing the backlight unit in the manufacturing of the liquid crystal display device of Example 1.

[Evaluation]

The optical sheet members and the liquid crystal display devices of the respective examples and comparative examples were evaluated according to the following criteria. Furthermore, in Examples 1 to 10 and 16 to 21, the evaluation was based on Comparative Example 2, and in Examples 11 to 15, the evaluation was based on Comparative Example 1.

(1) Front Brightness

Front brightness of the liquid crystal display device was measured by using a method disclosed in "0180" of JP2009-93166A. The results thereof were evaluated on the basis of the following criteria.

5: Excellent when the front brightness is greater than the front brightness of the liquid crystal display device of Comparative Example 1 or 2 by greater than or equal to 30%

4: Excellent when the front brightness is greater than the front brightness of the liquid crystal display device of Comparative Example 1 or 2 by greater than or equal to 20% and less than 30%

3: Excellent when the front brightness is greater than the front brightness of the liquid crystal display device of Comparative Example 1 or 2 by greater than or equal to 10% and less than 20%

2: The front brightness is equal to of less than the front brightness of the liquid crystal display device of Comparative Example 1 or 2.

(2) Front Contrast

Front contrast of the liquid crystal display device was measured by using a method disclosed in "0180" of JP2009-93166A. The results thereof were evaluated on the basis of the following criteria.

4: Excellent when the front contrast is greater than the front contrast of the liquid crystal display device of Comparative Example 1 or 2 by greater than or equal to 20%

3: Excellent when the front contrast is greater than the front contrast of the liquid crystal display device of Comparative Example 1 or 2 by greater than or equal to 10% and less than 20%

2: The front contrast is equal to or less than the front contrast of the liquid crystal display device of Comparative Example 1 or 2.

(3) Color Reproducing Region

A color reproducing region of the liquid crystal display device was measured by using a method disclosed in "0066" of JP2012-3073A. The results thereof were evaluated on the basis of the following criteria.

4: Excellent when the NTSC ratio is greater than the NTSC ratio of the liquid crystal display device of Comparative Example 1 or 2 by greater than or equal to 20%

3: Excellent when the NTSC ratio is greater than the NTSC ratio of the liquid crystal display device of Comparative Example 1 or 2 by greater than or equal to 10% and less than 20%

2: The NTSC ratio is equal to or less than the NTSC ratio of the liquid crystal display device of Comparative Example 1 or 2.

(4) Color Unevenness in Inclined Azimuth

Color unevenness of the liquid crystal display device in an inclined azimuth was measured by a method disclosed in JP2008-145868A. The results thereof were evaluated on the basis of the following criteria.

5: Excellent when the color unevenness is greater than the color unevenness of the liquid crystal display device of Comparative Example 1 or 2 in the inclined azimuth by greater than or equal to 30%

4: Excellent when the color unevenness is greater than the color unevenness of the liquid crystal display device of Comparative Example 1 or 2 in the inclined azimuth by greater than or equal to 20% and less than 30%

3: Excellent when the color unevenness is greater than the color unevenness of the liquid crystal display device of Comparative Example 1 or 2 in the inclined azimuth by greater than or equal to 10% and less than 20%

2: Excellent when the color unevenness is greater than the color unevenness of the liquid crystal display device of Comparative Example 1 or 2 in the inclined azimuth by less than 10%

1: The color unevenness is equal to or less than the color unevenness of the liquid crystal display device of Comparative Example 1 or 2 in the inclined azimuth.

TABLE 1

| | | Comparative Example 1 | Comparative Example 2 | Example 1-A | Example 1 | Example 2-A | Example 2 | Example 3 | Example 4 | Example 5 | Example 6 | Example 7 |
|---|---|---|---|---|---|---|---|---|---|---|---|---|
| Liquid Crystal Display Device | Polarizing Plate: Polarizer Polarizing Plate Protective Film | Present TAC Film | Present TAC Film | Present TAC Film | Present TAC Film | Present TAC Film | Present TAC Film | Present TAC Film | Present TAC Film | Present Acrylic Film | Present COP | Present Absent (Pol Direct Bonding) |
| | Optical Conversion Member: Fluorescent Layer Material | Absent | Absent | Quantum Dot Material (G, R) | Quantum Dot Material (G, R) | Quantum Dot Material (B, G, R) | Quantum Dot Material (B, G, R) | Quantum Dot Material (G, R) | Quantum Dot Material (B, G, R) | Quantum Dot Material (G, R) | Quantum Dot Material (G, R) | Quantum Dot Material (G, R) Dispersed Adhesive Material |
| | Brightness Enhancement Film: Between Polarizing Plate Protective Film and Fluorescent Layer/Reflection Polarizer | Absent (Air Layer) | Broad-band λ/4 (Integrated with Polarizing Plate Protective Film and Fluorescent Layer/Reflection Polarizer through Adhesive Agent) | Absent (Air Layer) | Narrow-band λ/4 (Integrated with Polarizing Plate Protective Film and Fluorescent Layer/Reflection Polarizer through Adhesive Agent) | Absent (Air Layer) | Narrow-band λ/4 (Integrated with Polarizing Plate Protective Film and Fluorescent Layer/Reflection Polarizer through Adhesive Agent) | Narrow-band λ/4 (Integrated with Polarizing Plate Protective Film and Fluorescent Layer/Reflection Polarizer through Adhesive Agent) | Narrow-band λ/4 (Integrated with Polarizing Plate Protective Film and Fluorescent Layer/Reflection Polarizer through Adhesive Agent) | Narrow-band λ/4 (Integrated with Polarizing Plate Protective Film and Fluorescent Layer/Reflection Polarizer through Adhesive Agent) | Narrow-band λ/4 (Integrated with Polarizing Plate Protective Film and Fluorescent Layer/Reflection Polarizer through Adhesive Agent) | Narrow-band λ/4 (Integrated with Polarizing Plate Protective Film and Fluorescent Layer/Reflection Polarizer through Adhesive Agent) |
| | Difference in Average Refractive Index between Reflection Polarizer and Material Thereon (Adhesive Material or Air) | 1.57 | 0.1 | 1.57 (Air Layer Present) | 0.1 | 1.57 (Air Layer Present) | 0.1 | 0.1 | 0.1 | 0.1 | 0.1 | 0.1 |

TABLE 1-continued

| | Comparative Example 1 | Comparative Example 2 | Example 1-A | Example 1 | Example 2-A | Example 2 | Example 3 | Example 4 | Example 5 | Example 6 | Example 7 |
|---|---|---|---|---|---|---|---|---|---|---|---|
| Reflection Polarizer | DBEF of Related Art | Five Broad-band Cholesteric Layers | One B Narrow-band Cholesteric Layer | One B Narrow-band Cholesteric Layer (Selective Reflection at Light Source Wavelength of λb) | One UV Narrow-band Cholesteric Layer (Selective Reflection at Light Source Wavelength of λb) | One UV Narrow-band Cholesteric Layer (Selective Reflection at Light Source Wavelength of λb) | One B Narrow-band Cholesteric Layer (Selective Reflection at Light Source Wavelength of λb) | One UV Narrow-band Cholesteric Layer (Selective Reflection at Light Source Wavelength of λb) | One B Narrow-band Cholesteric Layer (Selective Reflection at Light Source Wavelength of λb) | One B Narrow-band Cholesteric Layer (Selective Reflection at Light Source Wavelength of λb) | One B Narrow-band Cholesteric Layer (Selective Reflection at Light Source Wavelength of λb) |
| Center Wavelength (nm) | — | 430, 490, 550, 610, 670 | 445 | 465 | 385 | 385 | 445 | 385 | 445 | 445 | 465 |
| Total Thickness of Brightness Enhancement Film (μm) | 25 | 13 | 2.5 | 2.5 | 2 | 2 | 3 | 2 | 2.5 | 2.5 | 2.5 |
| Backlight BLU Including LED Light Source (Light Guide Plate, Diffusion Plate, Condensing Prism, and the like) | LED_BKL of Related Art | LED_BKL of Related Art | B-LED | B-LED | UV-LED | UV-LED | B-LED | UV-LED | B-LED | B-LED | B-LED |
| Light Source Wavelength λb (nm) | 450 | 450 | 450 | 465 | 365 | 365 | 445 | 385 | 445 | 445 | 445 |
| Performance — Front Brightness | 2 | 2 | 3 | 4 | 3 | 4 | 4 | 4 | 4 | 4 | 4 |
| Performance — Front Contrast | 2 | 2 | 3 | 3 | 3 | 3 | 3 | 3 | 3 | 3 | 4 |
| Performance — Color Reproducing Region | 2 | 2 | 4 | 4 | 4 | 4 | 4 | 4 | 4 | 4 | 4 |
| Performance — Color Unevenness in Inclined Azimuth | 1 | 1 | 3 | 3 | 4 | 4 | 3 | 4 | 3 | 3 | 3 |

TABLE 2

| | | Example 8 | Example 9 | Example 10 | Example 11 | Example 12 | Example 13 | Example 14 | Example 15 | Example 16 | Example 17 | Example 18 | Example 19 | Example 20 | Example 2 |
|---|---|---|---|---|---|---|---|---|---|---|---|---|---|---|---|
| Liquid Crystal Display Device | Polarizing Plate | Polarizer | Present | Present | Present | Present | Present | Present | Present | Present | Present | Present | Present | Absent Only Reflection Polarizer (Dielectric Multilayer Broadband Reflection Polarizer) | Present Addition of Reflection Polarizer (λ/4 + One B Narrowband Cholesteric Layer) | Present Addition of Reflection Polarizer (B Narrowband Dielectric Multilayer Reflection Polarizer) |
| | | Polarizing Plate Protective Film | Absent (Pol Direct Bonding) | TAC Film | TAC Film | TAC Film | Acrylic Film | COP | Absent (Pol Direct Bonding) | TAC Film | TAC Film | Acryl | Acryl | COP | TAC Film | Acryl |
| | Optical Conversion Member | Fluorescent Material | Quantum Dot (G, R) Dispersed and Stretched CA | Quantum Dot Material (G, R) | Quantum Dot Material (G, R) | Quantum Dot Material (G, R) | Quantum Dot (G, R) Dispersed and Stretched CA | Quantum Dot (G, R) Dispersed and Stretched CA | Quantum Dot (G, R) Dispersed and Stretched CA | Quantum Dot Material (B, G, R) | Quantum Dot Material (G, R) | Quantum Dot Material (G, R) Dispersed PVA | Quantum Dot Material (G, R) Dispersed PVA | Quantum Dot Material (B, G, R) Dispersed PVA | Quantum Dot Material (G, R) Dispersed PVA | Quantum Dot Material (G, R) Dispersed PVA |
| | Brightness Enhancement Film | Between Polarizing Plate Protective Film and Fluorescent Layer/Reflection Polarizer | Narrowband λ/4 (Integrated with Polarizing Plate Protective Film and Fluorescent Layer/Reflection Polarizer through Polarizer | Broadband λ/4 (Integrated with Polarizing Plate Protective Film and Fluorescent Layer/Reflection Polarizer through Polarizer | Broadband λ/4 (Integrated with Polarizing Plate Protective Film and Fluorescent Layer/Reflection Polarizer through Polarizer | Broadband λ/4 (Integrated with Polarizing Plate Protective Film and Fluorescent Layer/Reflection Polarizer through Polarizer | Only Adhesive Material | Only Adhesive Material | Only Adhesive Material | Only Adhesive Material | Only Adhesive Material | Narrowband λ/4 (Integrated with Polarizing Plate Protective Film and Fluorescent Layer/Reflection Polarizer through Polarizer | Narrowband λ/4 (Integrated with Polarizing Plate Protective Film and Fluorescent Layer/Reflection Polarizer through Polarizer | Narrowband λ/4 (Integrated with Polarizing Plate Protective Film and Fluorescent Layer/Reflection Polarizer through Polarizer | Narrowband λ/4 (Integrated with Polarizing Plate Protective Film and Fluorescent Layer/Reflection Polarizer through Polarizer | Narrowband λ/4 (Integrated with Polarizing Plate Protective Film and Fluorescent Layer/Reflection Polarizer through Polarizer |

TABLE 2-continued

|  |  | Example 8 | Example 9 | Example 10 | Example 11 | Example 12 | Example 13 | Example 14 | Example 15 | Example 16 | Example 17 | Example 18 | Example 19 | Example 20 | Example 2 |
|---|---|---|---|---|---|---|---|---|---|---|---|---|---|---|---|
|  | Difference in Average Refractive Index between Reflection Polarizer and Material Thereon (Adhesive Material or Air) | Adhesive Agent) 0.1 | Adhesive Agent) 0.1 | Adhesive Agent) 0.02 | Adhesive Agent) 0.1 | 0.1 | 0.1 | 0.1 | 0.1 | 0.1 | Adhesive Agent) 0.1 | Adhesive Agent) 0.1 | Adhesive Agent) 0.1 | Adhesive Agent) 0.1 | Adhesive Agent) 0.1 |
|  | Reflection Polarizer | One B Narrow-band Cholesteric Layer (Selective Reflection at Light Source Wavelength of λb) | One B Narrow-band Cholesteric Layer (Selective Reflection at Light Source Wavelength of λb) | One B Narrow-band Cholesteric Layer (Selective Reflection at Light Source Wavelength of λb) | B Narrow-band Dielectric Multi-layer Film 1 | B Narrow-band Dielectric Multi-layer Film 1 | B Narrow-band Dielectric Multi-layer Film 1 | B Narrow-band Dielectric Multi-layer Film 1 | UV Narrow-band Dielectric Multi-layer Film 2 | One B Narrow-band Cholesteric Layer (Selective Reflection at Light Source Wavelength of λb) | One B Narrow-band Cholesteric Layer (Selective Reflection at Light Source Wavelength of λb) | One B Narrow-band Cholesteric Layer (Selective Reflection at Light Source Wavelength of λb) | One B Narrow-band Cholesteric Layer (Selective Reflection at Light Source Wavelength of λb) | One B Narrow-band Cholesteric Layer (Selective Reflection at Light Source Wavelength of λb) | One B Narrow-band Cholesteric Layer (Selective Reflection at Light Source Wavelength of λb) |
|  | Center Wavelength (nm) | 465 | 465 | 465 | 465 | 465 | 465 | 465 | 385 | 435 | 465 | 465 | 385 | 465 | 465 |
|  | Total Thickness of Brightness Enhancement Film (μm) | 2.5 | 3.5 | 2.5 | 10 | 10 | 10 | 10 | 8 | 2.5 | 3 | 3 | 2 | 2.5 | 3 |
| Back-light | BLU Including LED Light Source (Light Guide Plate, Diffusion Plate, | B-LED | B-LED | B-LED | B-LED | B-LED | B-LED | B-LED | UV-LED | B-LED | B-LED | B-LED | UV-LED | B-LED | B-LED |

TABLE 2-continued

| | | Example 8 | Example 9 | Example 10 | Example 11 | Example 12 | Example 13 | Example 14 | Example 15 | Example 16 | Example 17 | Example 18 | Example 19 | Example 20 | Example 2 |
|---|---|---|---|---|---|---|---|---|---|---|---|---|---|---|---|
| | Condensing Prism, and the like) Light Source Wavelength λb | 445 | 445 | 465 | 465 | 465 | 465 | 465 | 385 | 465 | 450 | 450 | 385 | 450 | 450 |
| Performance | Front Brightness | 4 | 3 | 5 | 3 | 3 | 3 | 3 | 3 | 3 | 5 | 5 | 5 | 5 | 5 |
| | Front Contrast | 4 | 3 | 3 | 3 | 4 | 4 | 4 | 4 | 3 | 3 | 3 | 2 | 3 | 3 |
| | Color Reproducing Region | 4 | 4 | 4 | 4 | 4 | 4 | 4 | 4 | 4 | 4 | 4 | 3 | 4 | 4 |
| | Color Unevenness in Inclined Azimuth | 3 | 4 | 4 | 3 | 3 | 3 | 3 | 4 | 3 | 3 | 3 | 3 | 3 | 3 |

From Table 1 and Table 2 described above, it was found that, when the optical sheet member of the present invention used as the backlight side polarizing plate was incorporated in the image display device using the B narrowband or UV narrowband backlight, all of the front brightness, the front contrast, and the color reproducing region were improved and the color unevenness in the inclined azimuth was reduced.

In contrast, from Comparative Example 1, it was found that, when the optical sheet member not within the scope of the present invention which was used as the backlight side polarizing plate and in which the known DBEF of the related art was used as the reflection polarizer was incorporated in the image display device using the LED of the related art as the backlight, all of the front brightness, the front contrast, and the color reproducing region were required to be enhanced and the color unevenness in the inclined azimuth was required to be reduced.

From Comparative Example 2, it was found that, when the optical sheet member not within the scope of the present invention which was used as the backlight side polarizing plate and in which the reflection polarizer formed by laminating the five layers formed by fixing the cholesteric liquid crystals having a broadband reflection peak was used was incorporated in the image display device using the B narrowband backlight, all of the front brightness, the front contrast, and the color reproducing region were required to be enhanced and the color unevenness in the inclined azimuth was required to be reduced.

In addition, in order to further improve the front brightness of the liquid crystal display device using the optical sheet member of the present invention, it is preferable that one or more prism sheets are used in the backlight unit, and it is more preferable that two prism sheets are included. Further, it is found that it is particularly preferable that the prism directions of the two prism sheets are substantially parallel to each other. The expression "the prism directions of the two prism sheets are substantially parallel to each other" indicates that an angle between the prisms of the two prism sheets is within ±5°.

As a result of intensive studies of the present inventors, it has been found that the front brightness is able to be higher when the prism directions of the two prism sheets are parallel to each other rather than being vertical to each other in the brightness enhancement film of the present invention.

Furthermore, a wavelength selective filter for a blue color which selectively transmitted light having a wavelength shorter than 460 nm was disposed in the backlight unit of the liquid crystal display device of Example 1, and thus the same preferred evaluation results were obtained.

EXPLANATION OF REFERENCES

1: backlight side polarizing plate
2: retardation film
3: polarizer (A)
3ab: absorption axis direction of polarizer (A)
4: polarizing plate protective film
11: brightness enhancement film
12: λ/4 plate (C)
12sl: slow axis direction of λ/4 plate (C)
13: reflection polarizer (B)
14B: B narrowband layer formed by fixing cholesteric liquid crystalline phase
14UV: UV narrowband layer formed by fixing cholesteric liquid crystalline phase
15B: B narrowband dielectric multilayer film
15UV: UVB narrowband dielectric multilayer film
16a: optical conversion member (conversion from B to G and R)
16b: optical conversion member (conversion from UV to B, G, and R)
17: linear polarization reflection polarizer
18: circular polarization reflection polarizer
20: adhesive layer (adhesive agent)
21: optical sheet member
31B: B narrowband backlight unit
31UV: UV narrowband backlight unit
41: thin layer transistor substrate
42: liquid crystal cell
43: color filter substrate
44: display side polarizing plate
51: image display device

What is claimed is:

1. An optical sheet member, comprising:
a polarizing plate including a polarizer (A);
an optical conversion member (D); and
a brightness enhancement film including a reflection polarizer (B),
wherein the brightness enhancement film has a reflection center wavelength in a wavelength range of 400 nm to 500 nm and a peak of reflectivity having a half-value width of less than or equal to 100 nm,
wherein the optical conversion member (D) converts a part of blue light which is transmitted through the reflection polarizer (B) and is incident on the optical conversion member (D), and has an emission center wavelength in the wavelength range of 400 nm to 500 nm and a peak of emission intensity having a half-value width of less than or equal to 100 nm into green light which has an emission center wavelength in a wavelength range of 500 nm to 600 nm and a peak of emission intensity having a half-value width of less than or equal to 100 nm and red light which has an emission center wavelength in a wavelength range of 600 nm to 700 nm and a peak of emission intensity having a half-value width of less than or equal to 100 nm, and transmits a part of the blue light,
wherein the optical conversion member (D) includes a fluorescent material emitting the green light and the red light when the blue light is incident thereon,
wherein the optical conversion member (D) is a thermoplastic film which is formed by being stretched after dispersing quantum rods or an adhesive layer on which quantum rods are dispersed, and
wherein the optical conversion member emits fluorescent light holding at least a part of polarization properties of an incidence ray.

2. The optical sheet member according to claim 1,
wherein the brightness enhancement film has a reflection center wavelength in a wavelength range of 430 nm to 480 nm and has a peak of reflectivity having a half-value width of less than or equal to 100 nm, and
the optical conversion member (D) converts a part of blue light which is transmitted through the reflection polarizer (B) and is incident on the optical conversion member (D), and has an emission center wavelength in the wavelength range of 430 nm to 480 nm and a peak of emission intensity having a half-value width of less than or equal to 100 nm into green light which has an emission center wavelength in the wavelength range of 500 nm to 600 nm and a peak of emission intensity having a half-value width of less than or equal to 100 nm and red light which has an emission center wavelength in a wavelength range of 600 nm to 650 nm and a peak of emission intensity having a half-value width of less than or equal to 100 nm, and transmits a part of the blue light.

3. An optical sheet member, comprising:
a polarizing plate including a polarizer (A);
an optical conversion member (D); and
a brightness enhancement film including a reflection polarizer (B),
wherein the brightness enhancement film has a reflection center wavelength in a wavelength range of 300 nm to 430 nm and a peak of reflectivity having a half-value width of less than or equal to 100 nm,
wherein the optical conversion member (D) converts a part or all of UV light which is transmitted through the reflection polarizer (B) and is incident on the optical conversion member (D), and has an emission center wavelength in the wavelength range of 300 nm to 430 nm and a peak of emission intensity having a half-value width of less than or equal to 100 nm into blue light which has an emission center wavelength in a wavelength range of 430 nm to 480 nm and a peak of emission intensity having a half-value width of less than or equal to 100 nm, green light which has an emission center wavelength in a wavelength range of 500 nm to 600 nm and a peak of emission intensity having a half-value width of less than or equal to 100 nm, and red light which has an emission center wavelength in a wavelength range of 600 nm to 700 nm and a peak of emission intensity having a half-value width of less than or equal to 100 nm,
wherein the optical conversion member (D) includes a fluorescent material emitting the green light and the red light when the blue light is incident thereon,
wherein the optical conversion member (D) is a thermoplastic film which is formed by being stretched after dispersing quantum rods or an adhesive layer on which quantum rods are dispersed, and
wherein the optical conversion member emits fluorescent light holding at least a part of polarization properties of an incidence ray.

4. The optical sheet member according to claim 3,
wherein the optical conversion member (D) converts a part or all of UV light which is transmitted through the reflection polarizer (B) and is incident on the optical conversion member (D), and has an emission center wavelength in the wavelength range of 300 nm to 430 nm and a peak of emission intensity having a half-value width of less than or equal to 100 nm into blue light which has an emission center wavelength in the wavelength range of 430 nm to 480 nm and a peak of emission intensity having a half-value width of less than or equal to 100 nm, green light which has an emission center wavelength in the wavelength range of 500 nm to 600 nm and a peak of emission intensity having a half-value width of less than or equal to 100 nm, and red light which has an emission center wavelength in a wavelength range of 600 nm to 650 nm and a peak of emission intensity having a half-value width of less than or equal to 100 nm.

5. The optical sheet member according to claim 1,
wherein the reflection polarizer (B) includes a first light reflecting layer which has a reflection center wavelength in a wavelength range of 400 nm to 500 nm and a peak of reflectivity having a half-value width of less than or equal to 100 nm, and is formed by fixing a cholesteric liquid crystalline phase,
the brightness enhancement film includes a λ/4 plate (C) satisfying Expression (1) described below between the polarizer (A) and the reflection polarizer (B), $$450\ nm/4-60\ nm < Re(450) < 450\ nm/4+60\ nm, \text{ and} \quad \text{Expression (1)}$$

in Expression (1), Re(λ) represents retardation in an in-plane direction at a wavelength of λ nm, and unit is nm.

6. The optical sheet member according to claim 1,
wherein the reflection polarizer (B) includes a first light reflecting layer which has a reflection center wavelength in the wavelength range of 430 nm to 480 nm and a peak of reflectivity having a half-value width of less than or equal to 100 nm, and is formed by fixing the cholesteric liquid crystalline phase,
the brightness enhancement film includes the λ/4 plate (C) satisfying Expression (1') described below between the polarizer (A) and the reflection polarizer (B), $$450\ nm/4-25\ nm < Re(450) < 450\ nm/4+25\ nm, \text{ and} \quad \text{Expression (1')}$$

in Expression (1'), Re(λ) represents retardation in an in-plane direction at a wavelength of λ nm, and unit is nm.

7. The optical sheet member according to claim 1,
wherein the reflection polarizer (B) is a dielectric multi-layer film which has a reflection center wavelength in the wavelength range of 400 nm to 500 nm and a peak of reflectivity having a half-value width of less than or equal to 100 nm.

8. The optical sheet member according to claim 3,
wherein the reflection polarizer (B) includes a first light reflecting layer which has a reflection center wavelength in the wavelength range of 300 nm to 430 nm and a peak of reflectivity having a half-value width of less than or equal to 100 nm, and is formed by fixing a cholesteric liquid crystalline phase,
the brightness enhancement film includes a λ/4 plate (C) satisfying Expression (2) described below between the optical conversion member (D) and the reflection polarizer (B), $$380\ nm/4-60\ nm < Re(380) < 380\ nm/4+60\ nm, \text{ and} \quad \text{Expression (2)}$$

in Expression (2), Re(λ) represents retardation in an in-plane direction at a wavelength of λ nm, and unit is nm.

9. The optical sheet member according to claim 3,
wherein the reflection polarizer (B) includes the first light reflecting layer which has a reflection center wavelength in the wavelength range of 300 nm to 430 nm and a peak of reflectivity having a half-value width of less than or equal to 100 nm, and is formed by fixing the cholesteric liquid crystalline phase,
the brightness enhancement film includes a λ/4 plate (C) satisfying Expression (2') described below between the optical conversion member (D) and the reflection polarizer (B), $$380\ nm/4-25\ nm < Re(380) < 380\ nm/4+25\ nm, \text{ and} \quad \text{Expression (2')}$$

in Expression (2'), Re(λ) represents retardation in an in-plane direction at a wavelength of λ nm, and unit is nm.

10. The optical sheet member according to claim 3,
wherein the reflection polarizer (B) is a dielectric multi-layer film which has a reflection center wavelength in the wavelength range of 300 nm to 430 nm and a peak of reflectivity having a half-value width of less than or equal to 100 nm.

11. The optical sheet member according to claim 1,
wherein the optical conversion member (D) and the reflection polarizer (B) are laminated in direct contact with each other or through an adhesive layer.

12. The optical sheet member according to claim 5,
wherein the polarizing plate, the optical conversion member (D), the λ/4 plate (C), and the reflection polarizer (B) are sequentially laminated in direct contact with each other or through an adhesive layer.

13. The optical sheet member according to claim 1,
wherein a difference in refractive indexes between the reflection polarizer (B) and a layer in direct contact with the reflection polarizer (B) on the polarizing plate side is less than or equal to 0.15.

14. The optical sheet member according to claim 1,
wherein a film thickness of the brightness enhancement film is 3 μm to 10 μm.

15. The optical sheet member according to claim 3,
wherein the optical conversion member (D) includes a fluorescent material emitting the blue light, the green light, and the red light when light having an emission center wavelength in the wavelength range of 300 nm to 430 nm and a peak of emission intensity having a half-value width of less than or equal to 100 nm is incident thereon.

16. The optical sheet member according to claim 1,
wherein in the optical conversion member, a polarization degree of fluorescent light emitted from the optical conversion member is 10% to 99% when light having a polarization degree of 99.9% is incident on the optical conversion member.

17. The optical sheet member according to claim 1,
wherein the optical conversion member includes a fluorescent material in which light exited from the optical conversion member includes linear polarization light and circular polarization light.

18. The optical sheet member according to claim 1,
wherein light exited from the optical conversion member includes the linear polarization light, and
the polarizing plate further includes a linear polarization reflection polarizer or further includes a linear polarization reflection polarizer between the polarizing plate and the optical conversion member.

19. The optical sheet member according to claim 18,
wherein the linear polarization reflection polarizer is a dielectric multilayer film which reflects at least a part of light in a wavelength range of 300 nm to 500 nm.

20. The optical sheet member according to claim 18,
wherein the linear polarization reflection polarizer is a linear polarization reflection polarizer including a λ/4 plate on both sides of a light reflecting layer which is formed by fixing a cholesteric liquid crystalline phase reflecting at least a part of light in a wavelength range of 300 nm to 500 nm.

21. The optical sheet member according to claim 1,
wherein light exited from the optical conversion member includes the circular polarization light, and
the polarizing plate further includes a circular polarization reflection polarizer or further includes a circular polarization reflection polarizer between the polarizing plate and the optical conversion member.

22. The optical sheet member according to claim 21,
wherein the circular polarization reflection polarizer is a circular polarization reflection polarizer including a λ/4 plate on both sides of a dielectric multilayer film which reflects at least a part of light in a wavelength range of 300 nm to 500 nm.

23. The optical sheet member according to claim 21,
wherein the circular polarization reflection polarizer is a circular polarization reflection polarizer including a light reflecting layer which is formed by fixing a cholesteric liquid crystalline phase reflecting at least a part of light in a wavelength range of 300 nm to 500 nm and a λ/4 plate which is arranged between the light reflecting layer and the polarizing plate.

24. The optical sheet member according to claim 1,
wherein the optical conversion member is pattern-formed at each two or more types of fluorescent wavelengths.

25. An image display device, comprising:
the optical sheet member according to claim 1; and
a backlight unit,
wherein the backlight unit includes a light source emitting blue light which has an emission center wavelength in the wavelength range of 430 nm to 480 nm and a peak of emission intensity having a half-value width of less than or equal to 100 nm, and
the backlight unit includes a reflection member performing conversion of a polarization state of light which is emitted from the light source and is reflected on the optical sheet member and reflection of the light in a rear portion of the light source.

26. An image display device, comprising:
the optical sheet member according to claim 3; and
a backlight unit,
wherein the backlight unit includes a light source emitting UV light which has an emission center wavelength in the wavelength range of 300 nm to 430 nm and a peak of emission intensity having a half-value width of less than or equal to 100 nm, and
the backlight unit includes a reflection member performing conversion of a polarization state of light which is emitted from the light source and is reflected on the optical sheet member and reflection of the light in a rear portion of the light source.

27. The image display device according to claim 25,
wherein a difference between a wavelength applying a peak of emission intensity of blue light or UV light of the backlight unit and a wavelength applying a peak of reflectivity in the brightness enhancement film is 5 nm to 70 nm.

28. The image display device according to claim 25, further comprising:
a liquid crystal cell.

29. The image display device according to claim 25,
wherein the backlight unit includes a wavelength selective filter for a blue color which selectively transmits light having a wavelength shorter than 480 nm among the blue light rays.

30. The image display device according to claim 25, further comprising:
a thin layer transistor,
wherein the thin layer transistor includes an oxide semiconductor layer having a carrier concentration of less than $1 \times 10^{14}/cm^3$.

31. The optical sheet member according to claim 1,
wherein the optical conversion member (D) is a polyvinyl alcohol film which is formed by being stretched after dispersing quantum rods.

32. The optical sheet member according to claim 1,
wherein the reflection polarizer (B) includes the light reflecting layer formed by fixing a cholesteric liquid crystalline phase.

33. The optical sheet member according to claim 3, wherein the optical conversion member (D) is a polyvinyl alcohol film which is formed by being stretched after dispersing quantum rods.

34. The optical sheet member according to claim 3, wherein the reflection polarizer (B) includes the light reflecting layer formed by fixing a cholesteric liquid crystalline phase.

* * * * *